(12) United States Patent
Zhang et al.

(10) Patent No.: US 10,886,171 B2
(45) Date of Patent: Jan. 5, 2021

(54) RLINK-ON-DIE INTERCONNECT FEATURES TO ENABLE SIGNALING

(71) Applicant: Intel Corporation, Santa Clara, CA (US)

(72) Inventors: Yu Amos Zhang, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 165 days.

(21) Appl. No.: 16/098,662

(22) PCT Filed: Jul. 2, 2016

(86) PCT No.: PCT/US2016/040907
§ 371 (c)(1),
(2) Date: Nov. 2, 2018

(87) PCT Pub. No.: WO2018/009167
PCT Pub. Date: Jan. 11, 2018

(65) Prior Publication Data
US 2019/0148227 A1    May 16, 2019

(51) Int. Cl.
*H01L 21/768* (2006.01)
*H01L 23/522* (2006.01)
*H01L 23/50* (2006.01)

(52) U.S. Cl.
CPC .. *H01L 21/76877* (2013.01); *H01L 21/76898* (2013.01); *H01L 23/50* (2013.01);
(Continued)

(58) Field of Classification Search
CPC .......................... H01L 25/042; H01L 26/0655
See application file for complete search history.

(56) References Cited

U.S. PATENT DOCUMENTS 6,075,712 A * 6/2000 McMahon ............ H01L 23/481
                                                      174/255
6,365,975 B1 * 4/2002 Distefano ............. H01L 23/498
                                                      257/685
(Continued)

FOREIGN PATENT DOCUMENTS

KR   10-2015-0086684    7/2015
WO   WO-2014-138495    9/2014

OTHER PUBLICATIONS

International Search Report and Written Opinion for International Patent Application No. PCT/US2016/040907 dated Apr. 26, 2017, 17 pgs.
(Continued)

*Primary Examiner* — David Vu
*Assistant Examiner* — Brandon C Fox
(74) *Attorney, Agent, or Firm* — Schwabe, Williamson & Wyatt. P.C.

(57) ABSTRACT

Integrated circuit (IC) chip "on-die" interconnection features (and methods for their manufacture) may improve signal connections and transmission through a data signal communication channel from one chip, through semiconductor device packaging, and to another component, such as another chip. Such chip interconnection features may include (1) "last silicon metal level (LSML)" data signal "leadway (LDW) routing" traces isolated between LSLM isolation (e.g., power and/or ground) traces to: (2) add a length of the isolated data signal LDW traces to increase a total length of and tune data signal communication channels extending through a package between two communicating chips and (3) create switched buffer (SB) pairs of data signal channels that use the isolated data signal LDW traces to switch the locations of the pairs data signal circuitry and surface contacts for packaging connection bumps.

23 Claims, 18 Drawing Sheets

(52) U.S. Cl.
CPC ........ *H01L 23/522* (2013.01); *H01L 23/5222* (2013.01); *H01L 23/5227* (2013.01)

(56) References Cited

U.S. PATENT DOCUMENTS

| | | | |
|---|---|---|---|
| 9,224,722 B2 | 12/2015 | Lim et al. | |
| 2008/0238587 A1* | 10/2008 | Shin | H01L 25/16 333/28 R |
| 2009/0134391 A1 | 5/2009 | Lin | |
| 2011/0298130 A1* | 12/2011 | Kang | H01L 23/481 257/738 |
| 2013/0220690 A1* | 8/2013 | Chang | H05K 1/0219 174/262 |
| 2014/0110832 A1 | 4/2014 | Crisp et al. | |
| 2015/0069629 A1 | 3/2015 | Kong et al. | |
| 2017/0187419 A1* | 6/2017 | Zhang | H04B 3/32 |
| 2020/0118951 A1* | 4/2020 | Aleksov | H01L 25/50 |

OTHER PUBLICATIONS

International Preliminary Report on Patentability for International Patent Application No. PCT/US2016/040907, dated Jan. 17, 2019, 10 pages.

\* cited by examiner

RLINK-ON-DIE INTERCONNECT FEATURES TO ENABLE SIGNALING

CROSS-REFERENCE TO RELATED APPLICATION

This patent application is a U.S. National Phase Application under 35 U.S.C. § 371 of International Application No. PCT/US2016/040907, filed Jul. 2, 2016, entitled "RLINK-ON-DIE INTERCONNECT FEATURES TO ENABLE SIGNALING," which designates the United States of America, the entire disclosure of which is hereby incorporated by reference in its entirety and for all purposes.

BACKGROUND

Field

Embodiments of the invention are related in general, to integrated circuit (IC) chip interconnection features for improved signal connections and transmission through a data signal communication channel from one chip, through semiconductor device packaging and to another chip, including (1) lengths of "last silicon metal level (LSML)" data signal "leadway (LDW) routing" traces isolated between LSLM isolation traces to: (2) increase a total length of and tune data signal communication channels extending through a package between two communicating chips and (3) create switched buffer (SB) pairs of data signal channels that use the lengths of isolated data signal LDW traces to switch the locations of the pairs data signal circuitry and surface contacts for packaging connection bumps.

Description of Related Art

Integrated circuit (IC) chips (e.g., "chips", "dies", "ICs" or "IC chips"), such as microprocessors, coprocessors, graphics processors and other microelectronic devices often use package devices ("packages") to physically and/or electronically attach the IC chip to a circuit board, such as a motherboard (or motherboard interface). The IC chip (e.g., "die") is typically mounted within a microelectronic substrate package or package device that, among other functions, enables electrical connections such as to form a data signal communication channel between the chip and a socket, a motherboard, another chip, or another next-level component (e.g., microelectronic device). Some examples of such package devices are substrate packages, interposers, and printed circuit board (PCB) substrates upon which integrated circuit (IC) chips, next-level components or other package devices may be attached, such as by solder bumps.

There is a need in the field for an inexpensive and high throughput process for manufacturing such chips and packages. In addition, the process could result in a high chip yield and an improved data signal communication channel between the chip and package; or between the chip and a next-level component or chip attached to the package. In some cases, there is a needed in the field for a chip having better components for providing stable and clean high frequency transmit and receive data signals through a data signal communication channel between its signal transmit or receive circuits, through one or more packages, and to signal receive or transmit circuits of another next-level component or chip attached to the package(s).

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1A:
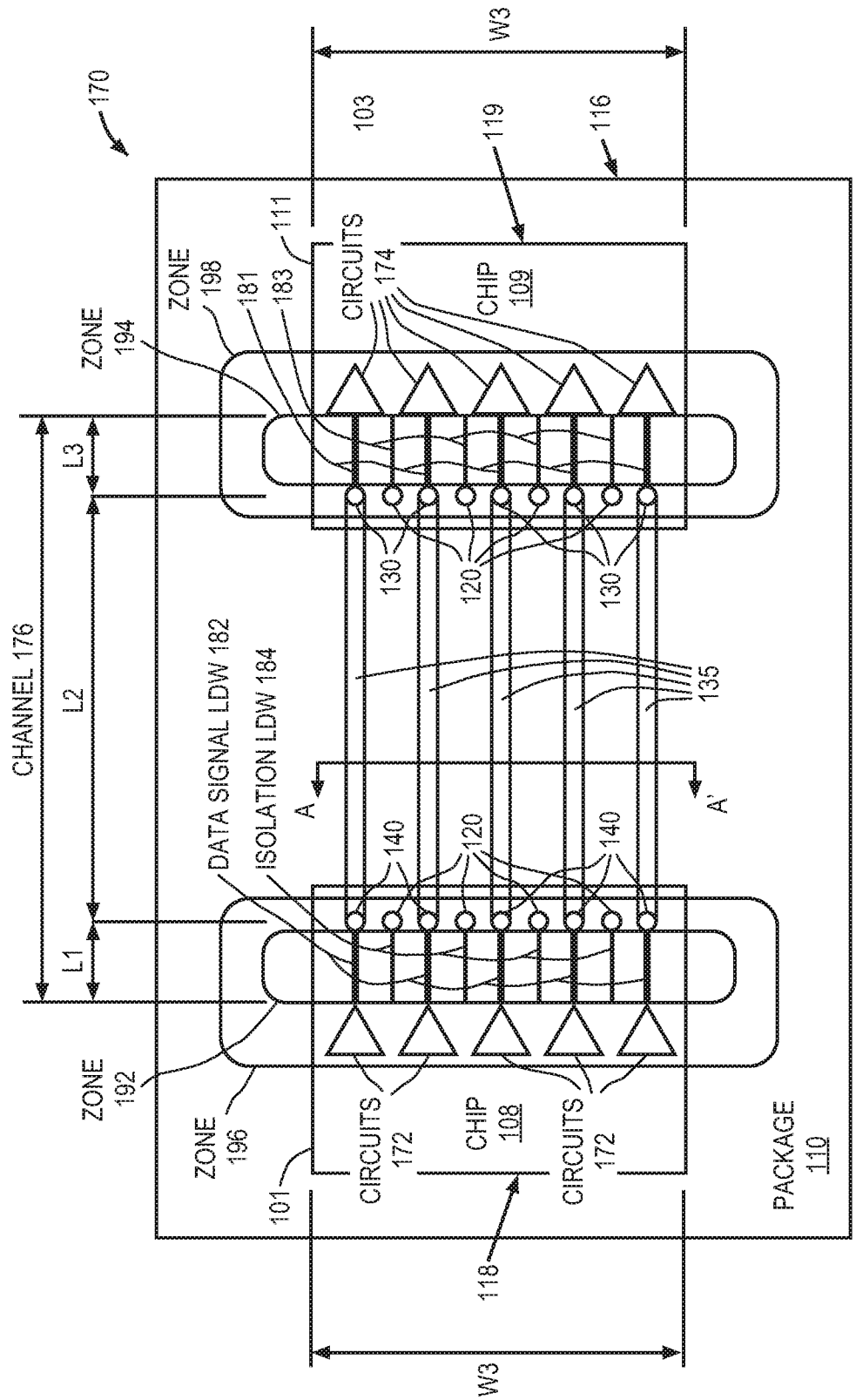
FIG. 1A is schematic top view of a computing system, including integrated circuit (IC) chip "on-die" interconnection features for improved signal connections and transmission through semiconductor device packages.

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

As integrated circuit (IC) chip or die sizes shrink (e.g., see chips 108 and/or 109) and interconnect densities increase, physical and electrical connections require better components for providing stable and clean high frequency transmit and receive data signals between data signal circuitry of a chip and data signal transmission surface contacts to be attached or attached to a package device (e.g., see package device 110) (or two physically attached package devices) upon which the IC chip is mounted or is communicating the data signals (e.g., see system 170). In some cases, there is a needed for one or two chips having better components for providing stable and clean high frequency transmit and receive data signals through a data signal communication channel between its data signal transmit or receive circuits, through one or more packages, and to data signal receive or transmit circuits of another next-level component (e.g., microelectronic device) or chip attached to the package(s). This may include for providing stable and clean data signals through surface contacts (e.g., solder bump contacts) on and electrical connections between (e.g., solder bumps) the chips and package(s). Some examples of such package devices that may be in the data signal communication channel are one (or two physically attached) of the following: substrate packages, interposers (e.g., silicon interposers), silicon bridges, organic interposers (e.g., or technology thereof), and printed circuit board (PCB) substrates upon or onto which integrated circuit (IC) chips or other package devices may be attached. In some cases, the data signal communication channel includes connections between the IC chip and a package upon or to which the IC chip is mounted, such as between the chip bottom surface (e.g., solder bump contacts) and other components of or attached to the package. The data signal communication channel may include signals transmitted between upper level signal transmit and receive circuitry and contacts or traces of the chip that will be electrically connected through via contacts to contacts on the bottom surface of the chip. In some cases, the data signal communication channel may extend from IC chip mounted on (e.g., physically soldered and attached to a top surface of the package) a microelectronic substrate package, which is also physically and electronically connected to another package, chip or next-level component. Such data signal communication channel may be a channel for signals transmitted from the chip to contacts on the top surfaces of a package that will be electrically connected through via contacts to lower level contacts or traces of one or more the package, and from there to another chip mounted on the package(s).

In some cases, an IC chip may be mounted within a package device, such as for "flip chip" bonding or packaging, such as to form a data signal communication channel. In some cases, the IC chip may be mounted on one package device, which is also physically and electronically connected to another package device or IC chip, so that the package device can provide data signal transfer between IC chip and other package device, or between the two IC chips, such as to form a data signal communication channel. In many cases, a data signal communication channel must route hundreds or even thousands of high frequency data signals between the IC chip(s) and/or other package devices.

According to some embodiments, it is possible for integrated circuit (IC) chip "on-die" interconnection features to provide higher frequency and more accurate data signal transfer through a data signal communication channel between a bottom interconnect level or surface (e.g., level LV1) of an IC chip mounted on a top interconnect level (e.g., level L1) of the package device and (1) lower levels (e.g., levels Lj-L1) of the package device, (2) a next-level component of (e.g., another chip mounted on) the package device, or (3) another package device mounted to the top or bottom of the package device (or a next-level component or another chip mounted on the second package device). In some cases, the on-die interconnection features reduce data signal cross-talk, lossy lines, and reflections (e.g., ringback or singing) in data signals transmitted by a chip (to or) through chip connections (e.g., interfaces, attachments, solder bumps) to a semiconductor device package the chip is mounted on, through the packaging, and (to or) through a second "receiver" chip. Such a chip may be described as a "chip having on-die interconnection features to enable signaling" or a "chip having on-die interconnection features for improved signal connections and transmission through a semiconductor device package channel" (e.g., devices, systems and processes for forming).

In some cases, the on-die interconnection features may include (1) "last silicon metal layer/level (LSML)" (e.g., one or more levels that are next below the exposed bump contact, first level) data signal "leadway (LDW) routing" (e.g., traces) isolated between isolation (e.g., power and/or ground) LDW routing/traces (e.g., see FIGS. 1-5) to: (2) add a length of the isolated data signal LDW traces (e.g., along the LSML level of the chip) to increase a total length of and to tune data signal communication channels extending through a package between two communicating chips (e.g., see FIGS. 6A-8), and (3) create switched buffer (SB) pairs of data signal channels that use the isolated data signal LDW traces to put the locations of one of the pairs data signal circuitry/buffer and at the location of the other of the pairs surface contact for packaging connection bumps, and vice versa (e.g., to exchange the locations of the pair's signal circuitry/buffers and their surface contacts for bumps) (e.g., see FIGS. 9A-11B).

According to embodiments, such "on-die" interconnection features (e.g., (1)-(3) above) include on-die leadway LDW routing (e.g., isolated data signal LDW traces that extend the data channel length) to improve performance of data channel signaling of single-ended signaling interfaces such as on-package input output (OPIO) on multi-channel packages (MCP) with short channel length (such as less than 5 mm), which without the "on-die" interconnection features will suffer from crosstalk ring-back issues due to dense and short packaging routing and consequently have a small minimum eye opening (e.g., poorer performance).

Figure 5A:
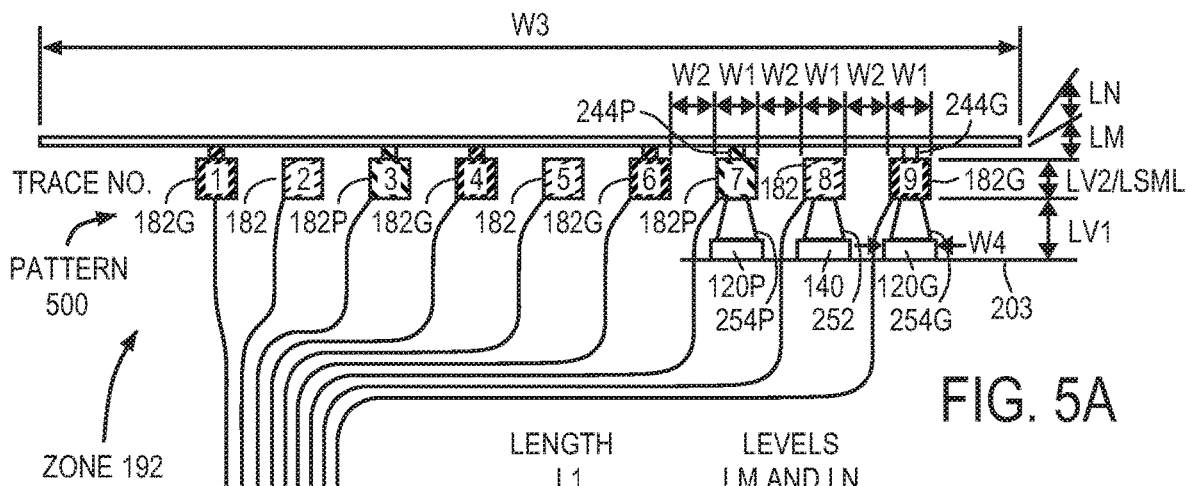
FIGS. 5A and 5B show embodiments of data signal LDW routing features on an LSML layer of transmit and/or receive data chips (e.g., chip "on-die" interconnection features).
Figure 5B:
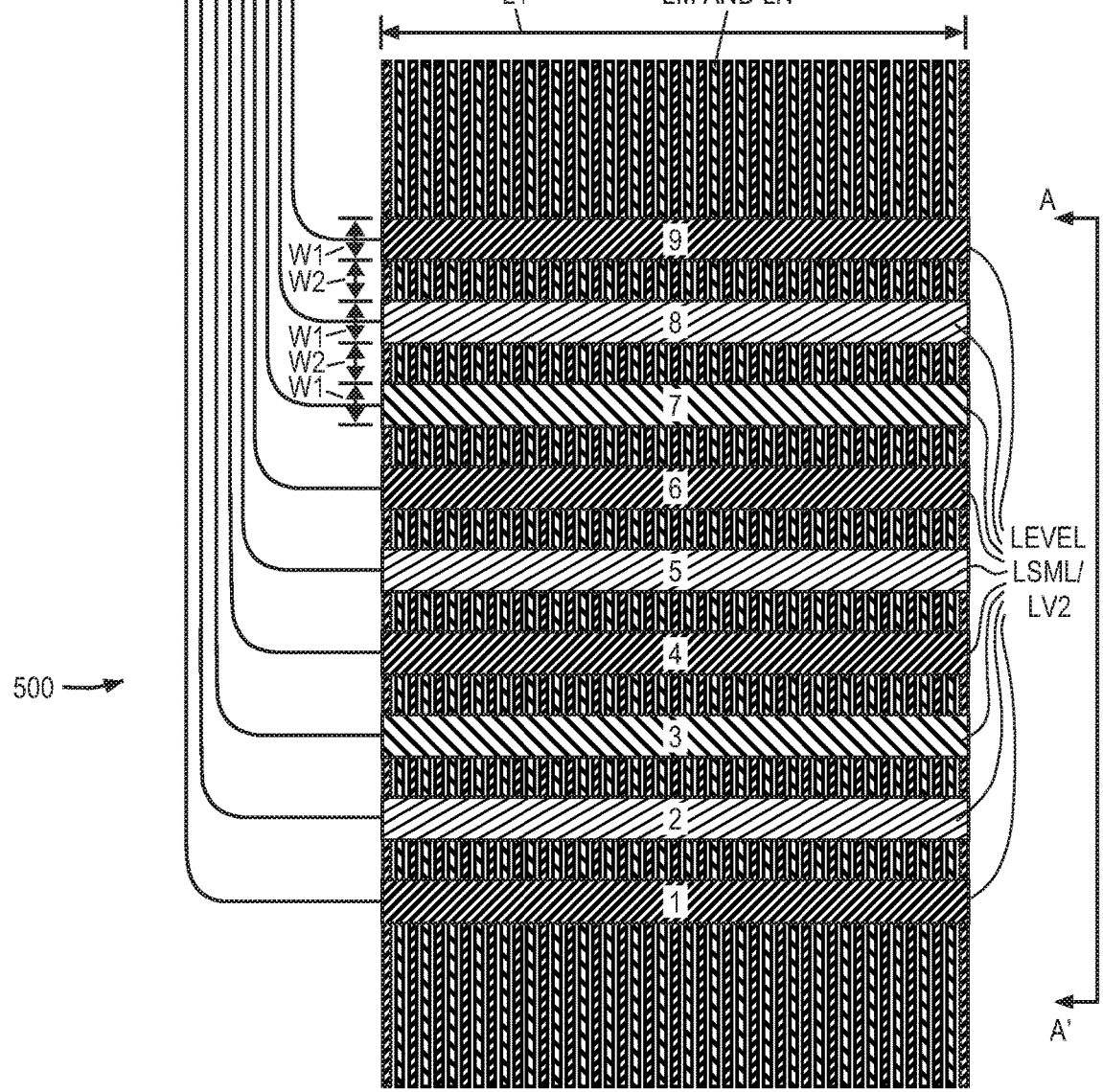

According to some embodiments, performance of data channel signaling of single-ended signaling interfaces (e.g., between a transmitter circuit on one chip that is attached through a package to a receiver circuit on a second chip) can be improved by, at the package-level, increasing package routing length (e.g., increasing length L2 of FIGS. 1A-B) and/or decreasing package routing density (e.g., increasing width W2 of FIGS. 5A-B). In some cases, this may meet the eye opening specifications of short single-ended MCP input and output interfaces such as OPIO. However, these solutions can result in an increased package form-factor and layer-count both of which increase cost. At the chip (e.g., silicon-level) one can include termination at the receiver end. Moreover, additional termination will consume significantly higher power than the non-terminated case.

Figure 1B:
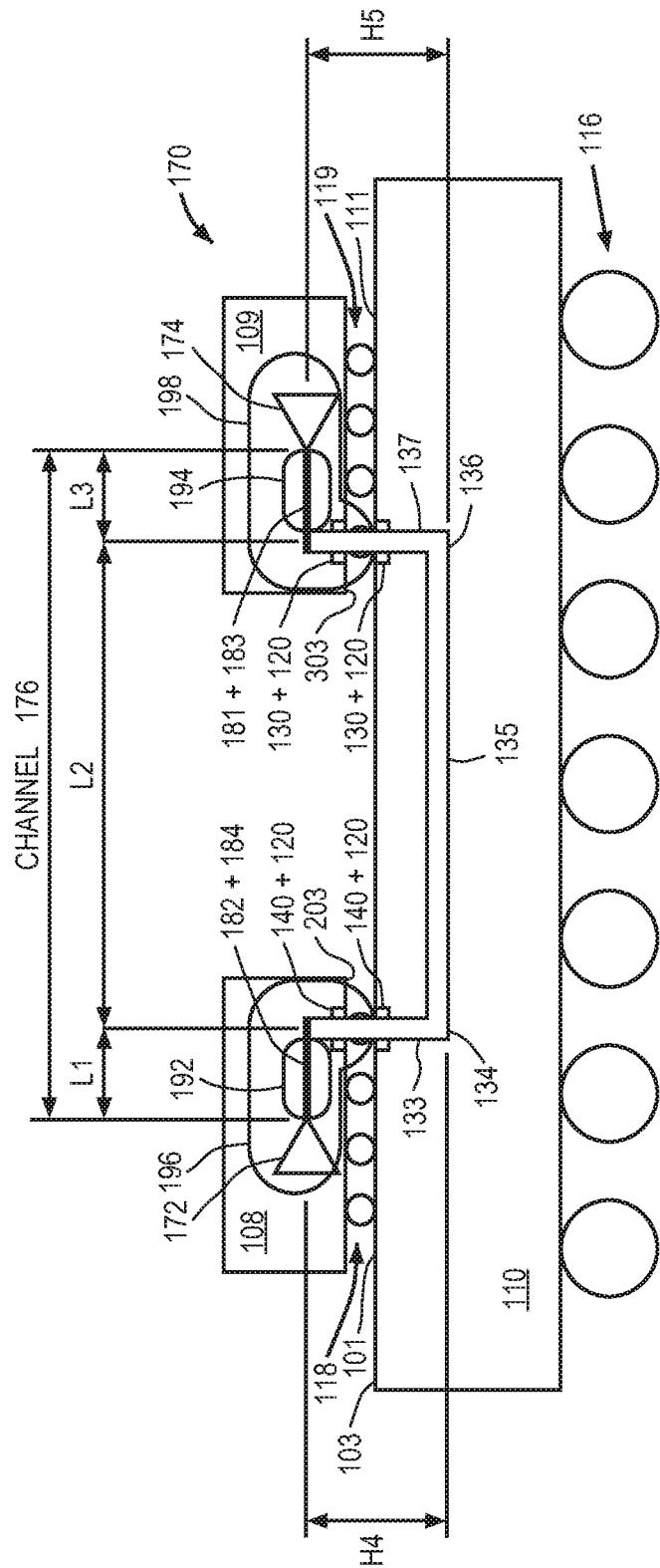
FIG. 1B is schematic cross-sectional side view of the computing system of FIG. 1A.

On the other hand, "cascading" well isolated on-silicon data signal LDW routing (e.g., using data signal LDW traces on data signal transmit and/or receive chips, see at least FIGS. 1A-B and 4) with dense package routing without having to change the package routing length is found to be an effective solution to this problem without having to increase cost (e.g., see at least FIGS. 6A-8). Cascaded isolated data signal LDW routing is a simple solution which cascades isolated silicon routing at last silicon metal layer (LSML) with the existing package routing. This is shown to have a negligible impact to silicon size and floor plan for OPIO-like circuits. In some cases, for an effective implementation, the isolated data signal LDW traces are implemented either on data signal receiver side only or on the receiver and the transmitters sides (e.g., chips) (e.g., see at least FIG. 4). Consequently, embodiments described herein provide on-die LDW routing for data signal channels and a comprehensive MCP interconnect architecture solution including the "LDW routing" structures (e.g., including data signal and isolation LDW traces; transmit and/or receive circuits; and surface and via contacts)(e.g., see at least FIGS. 1-4), the switched buffer (SB) circuit arrangement (e.g., see at least FIGS. 9A-11B), and the cascaded package interconnect (e.g., see at least FIGS. 1A-B and 4).

FIG. 1A is schematic top view of a computing system, including integrated circuit (IC) chip "on-die" interconnection features for improved signal connections and transmission through semiconductor device packages. FIG. 1B is schematic cross-sectional side view of the computing system of FIG. 1A. In some cases, FIGS. 1A-11B shows examples of "cascading" well isolated on-silicon data signal LDW routing (e.g., using SB pairs of data signal LDW traces) with the data signal channel through a package device (e.g., with the package routing) in order to make a serious impact on the signaling performance through the channel (e.g., see FIGS. 6-8).

FIGS. 1A-B show computing system 170 (e.g., a system routing signals from a computer processor or chip such as chip 108 to another device such as chip 109), including IC chip "on-die" interconnection features and circuitry on chips 108 and 109 for improved signal connections and transmission through semiconductor package device 110. In some cases, system 107 has chip 108 mounted on package 110 at first location 101; and chip 109 mounted on chip 110 at second location 111. In some cases, system 107 includes chip 108, solder bumps 118 physically attaching chip 108 to package 110 at first location 101, chip 109, solder bumps 119 physically attaching chip 109 to package 110 at second location 111. Package 110 may also be mounted on an interposer or patch. For example, a bottom surface of chip 108 is mounted on top surface 103 of package 110 at first location 101 using solder bumps or ball grid array (BGA) 118. A bottom surface of chip 109 is mounted on surface 103 of package 110 at location 111 using solder bumps or BGA 119. A bottom surface of package device 110 may in turn be mounted on an interposer or patch using solder bumps or BGAs.

Figure 2A:
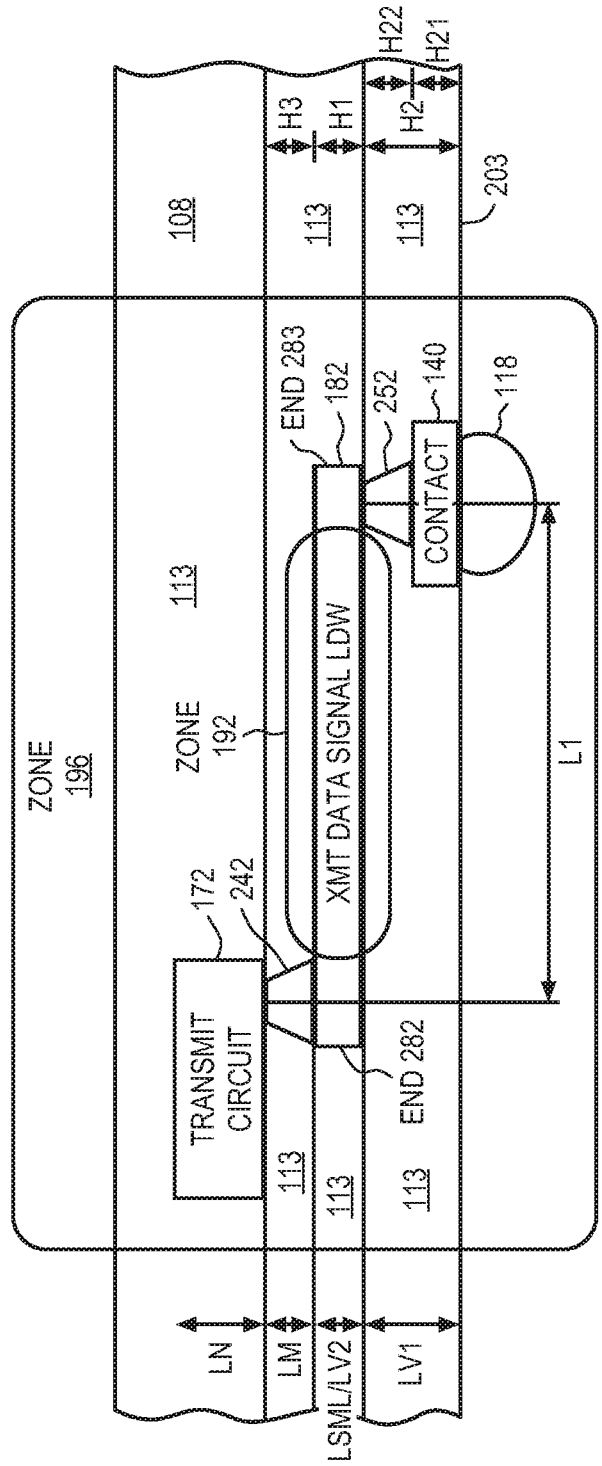
FIG. 2A is an expanded schematic cross-sectional side view of chip "on-die" interconnection feature zone of a first chip showing a chip transmit data signal "leadway" (LDW) routing trace of the computing system of FIG. 1A-B.
Figure 2B:
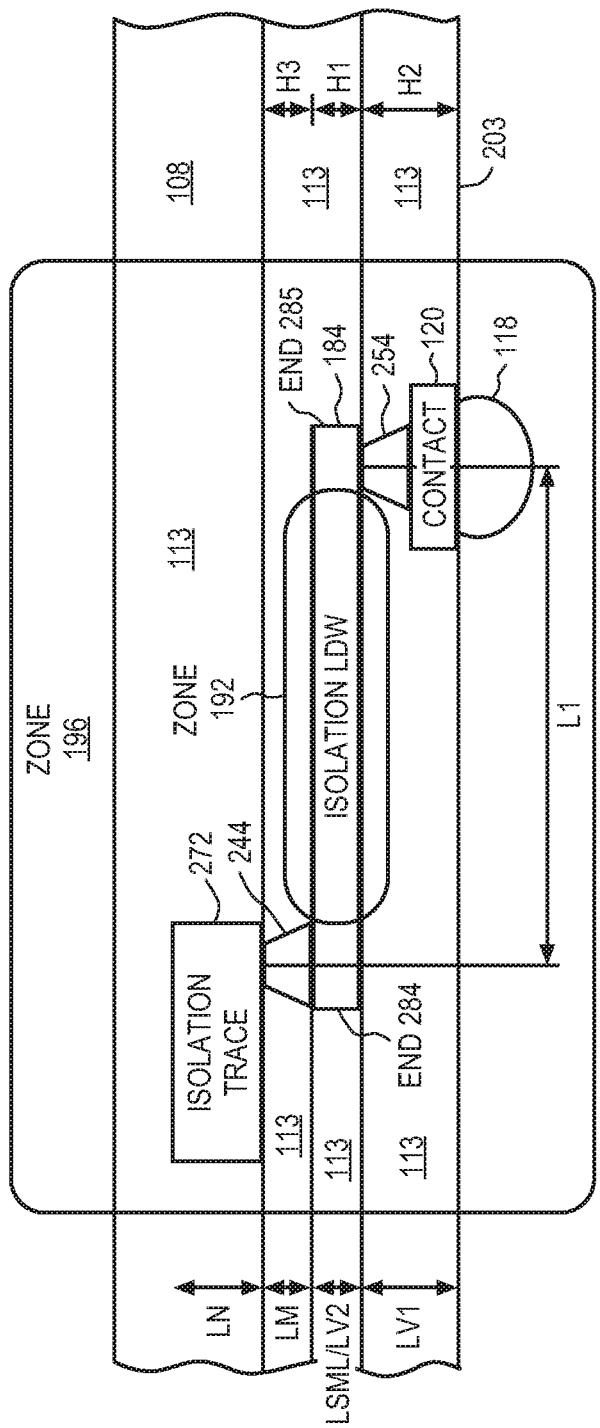
FIG. 2B is an expanded schematic cross-sectional side view of the chip "on-die" interconnection feature zone of FIG. 2A showing a chip isolation "leadway" (LDW) routing trace.
Figure 3A:
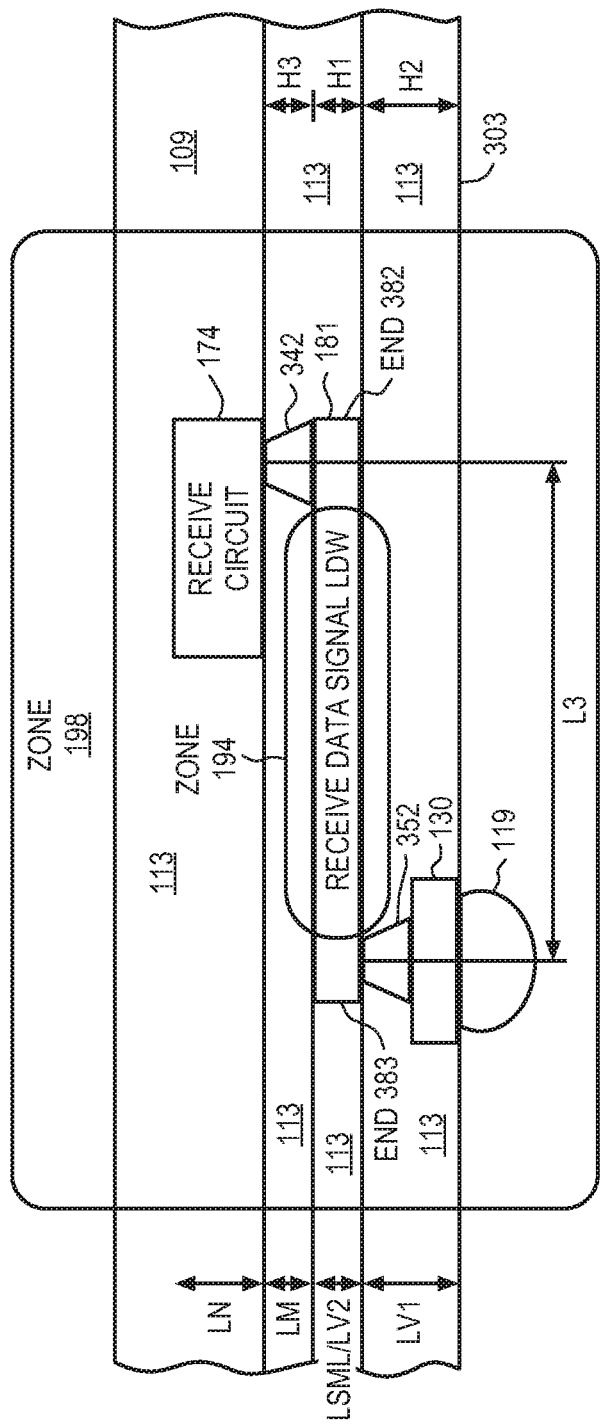
FIG. 3A is an expanded schematic cross-sectional side view of chip "on-die" interconnection feature zone of a first chip showing a chip receive data signal "leadway" (LDW) routing trace of the computing system of FIG. 1A-B.
Figure 3B:
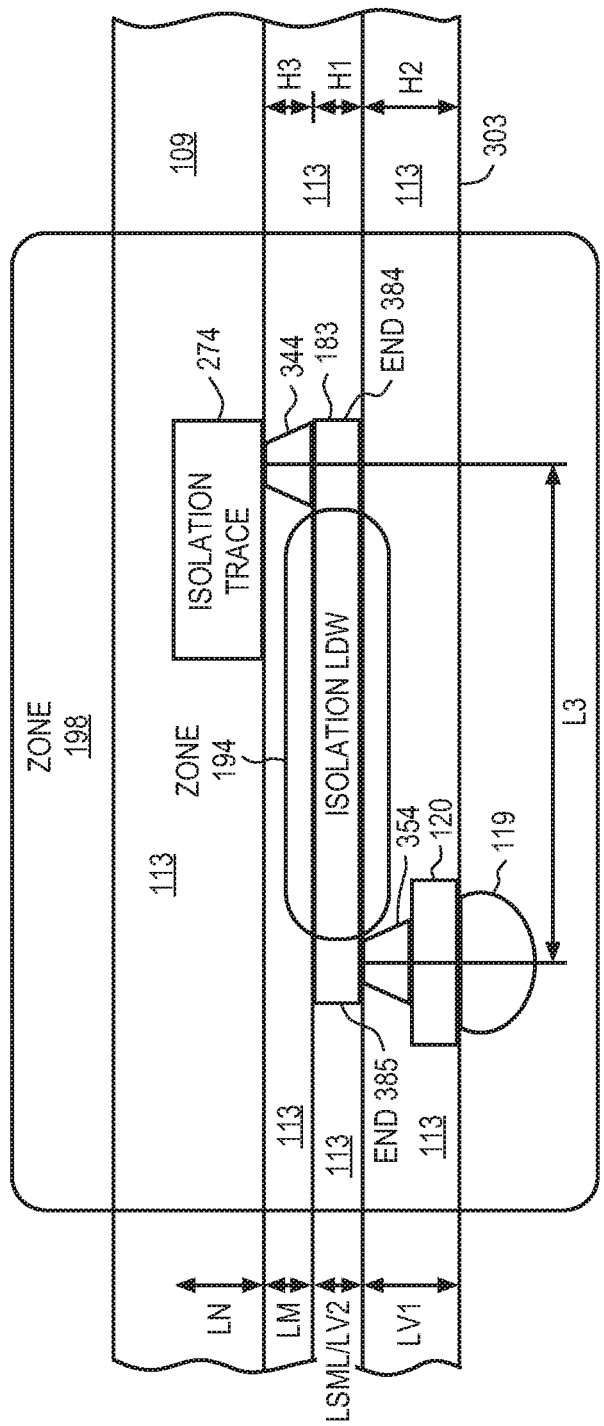
FIG. 3B is an expanded schematic cross-sectional side view of the chip "on-die" interconnection feature zone of FIG. 3A showing a chip isolation "leadway" (LDW) routing trace.

FIG. 2A is an expanded schematic cross-sectional side view of chip "on-die" interconnection feature zone of a first chip showing a chip transmit data signal "leadway" (LDW) routing trace of the computing system of FIG. 1A-B. FIG. 2B is an expanded schematic cross-sectional side view of the chip "on-die" interconnection feature zone of FIG. 2A showing a chip isolation "leadway" (LDW) routing trace. FIG. 3A is an expanded schematic cross-sectional side view of chip "on-die" interconnection feature zone of a first chip showing a chip receive data signal "leadway" (LDW) routing trace of the computing system of FIG. 1A-B. FIG. 3B is an expanded schematic cross-sectional side view of the chip "on-die" interconnection feature zone of FIG. 3A showing a chip isolation "leadway" (LDW) routing trace.

FIGS. 2A-3B show chips 108 and 109 having a first interconnect level LV1 with bottom surfaces 203 and 303, respectively. Level LV1 is below LSML or second level, LV2 level from the bottom of the chips. Level LV2 is below level LM of the chips; and level LM is below level LN of the chips. In some cases, if there is more than one switch buffer pair of data signal LDW traces, some pairs of LDW traces may be in one or more levels of the chips that are vertically disposed between levels LV2 and LM (e.g., LV4 and/or LV3). Level LV1 may be considered to "bottom" layer such as a lower, lowest or exposed layer (e.g., a final build-up (BU) layer, BGA, LGA, or die-backend-like layer) of an IC chip (e.g., such as microprocessor, coprocessor, graphics processor, memory chip, modem chip, or other microelectronic chip devices) which may be mounted onto (or have mounted onto it) a package device (e.g., a socket, an interposer, a motherboard, or another next-level component).

Chip 108 is shown having bottom surface 203, such as a bottom exposed surface of dielectric, upon or in which are formed (e.g., disposed) contacts 140 and 120 in an area of zone 196. Contacts 140 and 120 are shown in a row along width W3 of chip 108. In some cases, contacts 140 and 120 are located lengthwise along or at opposing ends of length L1, L11 or L111 (e.g., see FIGS. 9A-11B). In some cases, only contacts 140 are located lengthwise along or at opposing ends of length L1, L11 or L111 (e.g., see FIGS. 9A-11B) and contacts 120 are located at another lengthwise location in area 101 of package 110. In some cases, contacts 140 may be described as a signal cluster formed in a lengthwise 4-row deep die-bump pattern, where the first and second rows are SB pairs, and the third and fourth rows are SB pairs (e.g., see FIGS. 9A-11B).

Chip 109 is shown having bottom surface 303, such as a bottom exposed surface of dielectric, upon or in which are formed (e.g., disposed) contacts 130 and 120 in an area of zone 198. Contacts 130 and 120 are shown in a row along width W3 of chip 109. In some cases, contacts 130 and 120 are located lengthwise along or at opposing ends of length L3, L31 or L311 (e.g., see FIGS. 9A-11B). In some cases, only contacts 130 are located lengthwise along or at opposing ends of length L3, L31 or L311 (e.g., see FIGS. 9A-11B) and contacts 120 are located at another lengthwise location in area 111 of package 110. In some cases, contacts 130 may be described as a signal cluster formed in a lengthwise 4-row deep die-bump pattern, where the first and second rows are SB pairs, and the third and fourth rows are SB pairs (e.g., see FIGS. 9A-11B).

Package 110 is shown having top surface 103, such as a top exposed surface of dielectric, upon or in which are formed (e.g., disposed) contacts 140 and 120 in a zone of area 101 under of chip 108 (and optionally near an edge towards chip 109). In some cases, the pattern of contacts 140 and 120 in area 101 matches or is a mirror image of the pattern of contacts 140 and 120 in zone 196 of chip 108. Package 110 is also shown having top surface 103, such as a surface of dielectric, upon or in which are formed (e.g., disposed) contacts 130 and 120 in a zone of area 111 under of chip 109 (and optionally near an edge towards chip 108). In some cases, the pattern of contacts 130 and 120 in area 111 matches or is a mirror image of the pattern of contacts 140 and 120 in zone 198 of chip 109.

According to embodiments chip 108 and chip 109 may each be an IC chip such as microprocessor, coprocessor, graphics processor, memory chip, modem chip, or other microelectronic chip devices. According to embodiments chip 108 and chip 109 may each be an IC chip capable of being mounted or directly attached onto a socket, an interposer, a motherboard, or another next-level component (e.g., package device 110). In some cases, package device 110 may represent a substrate package, an interposer, a printed circuit board (PCB), a PCB an interposer, a "package", a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices) (e.g., chips 108 and 109). According to embodiments, chip 108 and chip 109 may each include (e.g., on one or more levels above level L2 or L5) active microprocessor circuitry and/or hardware logic (e.g., solid state hardware) such as microprocessor processing logic, memory, cache, gates, transistors (e.g., metal oxide semiconductor (MOS) field effect transistor (FET), fin FET and the like) as known to be on or part of an IC chip such as a central processing unit (CPU), microprocessor, coprocessor, graphics processor, memory chip, modem chip, or other microelectronic chip devices. A portion of such circuitry and/or logic may by electrically coupled or physically attached to circuits 172 and 174. According to embodiments, chip 108 and chip 109 may each include (e.g., on one or more levels above level L2 or L5, such as in level LM) active microprocessor circuitry and/or hardware logic of a multipurpose, clock driven, register based, programmable electronic device which accepts digital or binary data as input (e.g., at contact 130 of a channel having circuit 174 as an RX data signal circuit at chip 109), processes it according to instructions stored in its memory, and provides results as output (e.g., at contact 140 of a channel having circuit 172 as a TX data signal circuit of chip 108). According to embodiments, chip 108 and chip 109 may each contain both combinational logic and sequential digital logic; and may operate on numbers and symbols represented in the binary numeral system.

FIGS. 1-3 show chip 108 having chip "on-die" interconnection feature "zone" 196 and "zone" 192. FIGS. 1-3 show chip 109 having chip "on-die" interconnection feature "zone" 198 and "zone" 194. Such a "zone" as described herein may be considered a three dimensional part or portion of an IC chip. Such a zone may include various active and passive circuitry; traces; interconnects and/or other structure know to be on an IC chip.

FIGS. 1-3 show chip 108 including zone 196 which includes zone 192. In some cases, solder bumps 118 of zone 196 are considered not to be part of chip 108. Zone 196 is shown including data signal transmit circuits 172 electrically coupled (e.g., with zero or less than 20 Ohm resistance) to one end 282 (e.g., see FIG. 2A) of on-die "last silicon metal layer" (LSML) or last silicon metal level chip data signal "leadway" (LDW) routing traces 182. In some cases, "LSML" or "last silicon metal layer/level" refers to a level or layer of the chip having metal, such as traces, contacts and via contacts that is the level or layer immediately above a bottom exposed level or layer of the chip (e.g., above the level or layer having exposed surface contacts). In some cases, "leadway" (LDW) routing traces or "LDW traces" refers to a length of on-die data signal traces in a level of the chip that extends a length of the data signal channel in the chip, thus extending the total data signal channel length from a transmit circuit, through a package device and to a receive circuit, by extending that total channel length with the "leadway" routing/trace length added in the chip. The opposite end 283 of signal LDW traces 182 are electrically coupled to surface contact 140 (e.g., see FIG. 2A). In some cases, circuits 172 are or include on-die circuits or data buffers located above the LSML of chip 108 and for transmitting data signals across a data signal channel to data signal receiver circuits 174 of chip 109.

Zone 192 includes on-die "last silicon metal layer" (LSML) or last silicon metal level chip data signal "leadway" (LDW) routing traces 182. In some cases, traces 182 extend along a lower level or a planar surface of an on-die second or "LV2" level that is the level above the bottommost "LV1" level or a level having surface contacts 140 on which to form solder bumps 118 on for connecting the chip to a package 110. Some or all of traces 182 may be extending between and coupled to (e.g., electrically coupled to conduct electrical signals with zero or less than 20 Ohm resistance) data signal transmit circuits 172 of chip 108 and bottom level transmit data signal contact 140 of chip 108. Contacts 140 of chip 108 may be contacts upon which solder bumps (e.g., bumps 118) may be formed for attaching some or all of contacts 140 to an opposing, upper level transmit data signal contacts 140 of package 110.

In some cases, each of traces 182 has a first end 282 (e.g., see FIG. 2A) physically coupled to (e.g., through one or more via or other contacts) and electrically attached to (e.g., with zero or less than 20 Ohm electrical resistance) a transmit circuit 172 of chip 108 and a second end 283 (e.g., see FIG. 2A) physically coupled to (e.g., through a via or other contact) and electrically attached to (e.g., with zero electrical or less than 20 Ohm electrical resistance) a data transmit signal surface contact 140 of chip 108 (upon which a solder bump 118 may be formed to attach that contact to an opposing data transmit signal surface contact 140 of package 110).

Zone 192 also includes on-die "last silicon metal layer" (LSML) or last silicon metal level chip isolation (e.g., isolation signal) leadway routing traces 184 separating (e.g., extending along side and parallel to; and having a length similar to traces 182) adjacent pairs of traces 182. Traces 184 may include at least one of a power trace; a ground traces; or both a power and ground trace between each adjacent ones of traces 182 (e.g., see FIG. 4). There may be a number of traces of 184 disposed between two adjacent ones of traces 182. In some cases, there are one or two disposed between. In some cases, traces 184 extend along a lower level or a planar surface of an on-die second or "LV2" level. Some or all of traces 184 may be extending between and coupled to (e.g., electrically coupled to conduct electrical signals with zero or less than 20 Ohm resistance) isolation traces (e.g., see traces 272 of FIG. 2) of chip 108 and bottom level isolation contacts 120 of chip 108. Contact 120 of chip 108 may be a contact upon which a solder bump (e.g., bump 118) may be formed for attaching that contact to an opposing, upper level contact 120 of package 110.

In some cases, each of traces 184 has a first end 284 (e.g., see FIG. 2B) physically coupled to (e.g., through one or more via or other contact) and electrically attached to (e.g., with zero or less than 20 Ohm electrical resistance) an isolation trace 172 of chip 108. In some cases, each of traces 184 has a second end 285 (e.g., see FIG. 2B) physically coupled to (e.g., through at least one via or other contact) and electrically attached to (e.g., with zero or less than 20 Ohm electrical resistance) an isolation surface contact 120 of chip 108 (upon which a solder bump 118 may be formed to attach that contact to an opposing isolation surface contact 120 of package 110).

In some cases, the use of "level" describes a "layer" of material (e.g., dielectric and/or conductive material) of a chip as known. In some cases, the use of a top, bottom, and/or last silicon metal "level" describes a top, bottom, and/or last silicon metal "layer" of material (e.g., dielectric and/or conductive material) of a chip as known. In some cases, a "level" may have two layers, such as a lower main or contact layer; and an upper via layer to connect structures on the lower layer with structures above the via layer.

FIG. 2A shows chip "on-die" interconnection feature zones 196 and 192 of chip 108 and chip transmit data signal "leadway" (LDW) routing traces 182. FIG. 2A shows chip 108 including zone 196 which includes zone 192. Zone 196 is shown including circuit 172 physically and electrically attached to contact 242 (e.g., contact 242 may be formed onto or physically touching) which is physically and electrically attached end 282 of signal LDW trace 182. The opposite end 283 of LDW trace 182 is physically and electrically attached to contact 252; which is physically and electrically attached to surface contact 140.

Solder 118 may be mounted on the exposed surface of contact 140 which is on or has the exposed surface planar with the bottom surface of chip 108. The bottom (e.g., exposed) surface of chip 108 is shown as surface 203. The distance between the center of contact 242 and of contact 140 is shown as length L1 or pitch length PL. In some cases, length L1 is the length of data signal LDW traces 182 and 184. Zone 192 is shown as having a portion of length L1 that includes trace 182 between contacts 242 and 140. First exposed level LV1 of chip 108 is shown including contacts 252 and 140. In some cases, contact 252 may represent a single contact such as a via contact formed on the bottom surface of end 283 of trace 182. In some cases it represents more than one contact formed that way. In some cases, contact 140 may represent a single solder bump contact formed on the bottom surface of contact 252.

In some cases, contact 252 may represent between one and three contact levels, similar to but above level LV1. In some cases, it may represent between one and three of such levels including a contact similar to 252 and a contact similar to 140 located between the bottom surface of trace 182 and top surface 203. In some cases, trace 182 will be vertically located as low and close as possible to surface 203 or contact 140.

In some cases where switched buffer (SB) signal channels are implemented as described herein, level LV2 will represent a number of levels such as LV2, that is equal to the number of switched buffer (SB) signal channels; and each of these levels has contacts such as 252 and 140 for each pair of switch buffers (e.g. see FIGS. 9A-11B). In some cases, each of these levels will also include via contacts between each end of each data signal LDW trace, such as contacts 252 and 242 that connect one end to a data signal circuit and the other end to a solder bump surface contact of each data signal LDW trace, for each pair of switch buffers (e.g. see FIGS. 9A-11B).

In some cases, contact 242 may represent a single contact such as a via contact upon which the top surface of end 282 of trace 182 is formed. In some cases, contact 242 may also represent a single contact such as a via contact formed on the bottom surface of a data signal output contact of circuit 172. In some cases contact 242 represents more than one contact formed that way.

In some cases, trace 182 and optionally contact 242 exists on the LSML or second, LV2 level from the bottom of chip 108 (e.g., level LM is part of a level LV2). However, if there is more than one switch buffer pair, some pairs of traces 182 and some of contacts 242 may be in an upper level from surface 203 of chip 108 (e.g., LV4 and/or LV3).

In some cases, level LM and contact 242 represent more than one level of contacts. In some cases they represent a single contact such as via contact 242 as shown. In other cases they represent multiple levels of via and/or contacts such as contact 242 and contact 140 extending vertically between first end 282 of trace 182 and a contact of circuit 172. In some cases they represent between one and 50 levels between the top surface of trace 182 and the bottom surface of a contact of circuit 172.

FIG. 2A shows data signal (e.g., transmitter or buffer) circuit 172 on Level LN. It can be appreciated that Level LN may be any level above and including levels above Level LM.

FIG. 2A shows dielectric material 113 filling in any space between (e.g., above, below, and beside such as in the length, width and height directions) the chip on-die interconnect features: circuit 172, contact 242 trace 182, contact 252 and contact 140, such as shown in FIG. 2A.

In some cases, filling in the space between the interconnect features includes material 113 existing in any space where those features do not exist, and are not physically attached to (e.g., are not touching) each other, such as shown in FIG. 2A. In some cases, filling in the space between the interconnect features includes material 113 separating each and all of those features except where they are coupled or physically attached to each other, such as shown in FIG. 2A. In some cases, filling in the space between the interconnect features includes material 113 existing in any space where those features do not exist, are not coupled to each other, and are not physically attached to each other. In some cases, filling in the space between the interconnect features includes material 113 existing in any space where those features do not exist, are not coupled to each other, and are not physically attached to each other, except where other circuitry, traces, contacts exist, such as is known.

FIG. 2B shows chip "on-die" interconnection feature zones 196 and 192 of FIGS. 1A-B showing a chip isolation "leadway" (LDW) routing trace 184 to isolate a chip transmit data signal "leadway" (LDW) routing traces 182. In FIG. 2B zone 196 is shown including trace 272 physically and electrically attached to contact 244 (e.g., contact 244 may be formed onto or physically touching) which is physically and electrically attached end 284 of isolation LDW trace 184. The opposite end 285 of LDW trace 184 is physically and electrically attached to contact 254; which is physically and electrically attached to surface contact 120.

Solder 118 may be mounted on the exposed surface of contact 120 which is on or has the exposed surface planar with the bottom surface of chip 108. The distance between the center of contact 244 and of contact 120 is shown as length L1 or pitch length PL. Zone 192 is shown as having a portion of length L1 that includes trace 184 between contacts 244 and 120. First exposed level LV1 of chip 108 is shown including contacts 254 and 120. In some cases, contact 254 may represent a single contact such as a via contact formed on the bottom surface of end 285 of trace 184. In some cases it represents more than one contact formed that way. In some cases, contact 120 may represent a single solder bump contact formed on the bottom surface of contact 254.

In some cases, contact 254 may represent between one and three contact levels, similar to but above level LV1. In some cases, it may represent between one and three of such levels including a contact similar to 254 and a contact similar to 120 located between the bottom surface of trace 184 and top surface 203. In some cases, trace 184 will be vertically located as low and close as possible to surface 203 or contact 120.

In some cases where switched buffer (SB) signal channels are implemented as described herein, level LV2 will represent a number of levels such as LV2, that is equal to the number of switched buffer (SB) signal channels; and each of these levels has contacts such as 254 and 120 for each pair of switch buffers (e.g. see FIGS. 9A-11B). In some cases, each of these levels will also include via contacts between each end of each data signal LDW trace, such as contacts 254 and 244 that connect one end to a data signal circuit and the other end to a solder bump surface contact of each data signal LDW trace, for each pair of switch buffers (e.g. see FIGS. 9A-11B).

In some cases, contact 244 may represent a single contact such as a via contact upon which the top surface of end 284 of trace 184 is formed. In some cases, contact 244 may also represent a single contact such as a via contact formed on the bottom surface of a data signal output contact of circuit 174. In some cases contact 244 represents more than one contact formed that way.

In some cases, trace 184 and optionally contact 244 exists on the LSML or second, LV2 level from the bottom of chip 108 (e.g., level LM is part of a level LV2). However, if there is more than one switch buffer pair, some pairs of traces 184 and some of contacts 244 may be in an upper level from surface 203 of chip 108 (e.g., LV4 and/or LV3).

In some cases, level LM and contact 244 represent more than one level of contacts. In some cases they represent a single contact such as via contact 244 as shown. In other cases they represent multiple levels of via and/or contacts such as contact 244 and contact 120 extending vertically between first end 284 of trace 184 and a contact of circuit 174. In some cases they represent between one and 50 levels between the top surface of trace 184 and the bottom surface of a contact of circuit 174.

FIG. 2B shows isolation (e.g., ground or DC power signal trace or plane) trace 272 on Level LN. It can be appreciated that Level LN may be any level above and including levels above Level LM.

In some cases, zone 196 includes zone 192 and transmit circuits 172. In some cases, zone 196 includes zone 192, surface contacts 140 of chip 108, and transmit circuits 172. In some cases, zone 196 includes zone 192, surface contacts 140 of chip 108, solder bumps 118 attaching contacts 140 of chip 108 to contacts 140 of package 110, and transmit circuits 172. In some cases, transmit circuits 172 represent a transmit buffer, such as a part of a data signal transmission circuit that is connected to data signal traces, via contacts, or surface contacts to transmit the signal to another electronic device or chip.

In some embodiments, traces 182 and 184 (e.g., LDW traces on level LV2; or other data signal LDW traces of patterns 500, 900, 905, 1000, 1005, 1100 and 1105 on level LV2, LV3, LV4 and/or LV5) may have length L1, width W1 and Height H1.

In some embodiments, length L1 may be between 50 and 1 millimeter (mm). In some cases it is between 20 and 800 um. In some embodiments, length L1 may be between 100 and 600 micrometers (um). In some embodiments, length L1 may be between 200 and 500 micrometers (um). In some embodiments, length L3 may be approximately 400 micrometers (um) (e.g., see FIGS. 6A-B and 8). In some embodiments, length L3 may be between 100 and 400 micrometers (um) (e.g., see FIGS. 7A-B). In some embodiments, length L3 may be between 150 and 450 micrometers (um) (e.g., see FIGS. 9A-11B). In some embodiments, length L1 may be between 350 and 450 micrometers (um). In some embodiments, length L1 may be between 400 and 500 micrometers (um).

In some embodiments, width W1 may be between 1 and 8 micrometers (um). In some embodiments, width W1 may be between 1 and 5 micrometers (um). In some embodiments, width W1 may be between 2 and 4 micrometers (um). In some cases, W1 is between 1 and 10 um. In some cases it is between 3.5 and 7.5 um. In some cases it is between 5 and 6 um.

In some embodiments, level LV2 also has Height H1. In some embodiments, level LV3 also has Height H1 (e.g., see FIGS. 10A-11B). In some embodiments, level LV4 also has Height H1 (e.g., see FIGS. 11A-11B). In some embodiments, level LV5 (not shown) also has Height H1.

In some embodiments, height H1 may be between 1 and 8 micrometers (um). In some embodiments, height H1 may be between 1 and 5 micrometers (um). In some embodiments, height H1 may be between 2 and 4 micrometers (um). In some embodiments, height H1 may be between 4 and 8 micrometers (um). In some embodiments, height H1 may be between 5 and 7 micrometers (um).

In some embodiments, level LV1 of chip 108 may have height H2. In some embodiments, height H2 may be between 10 and 40 micrometers (um). In some embodiments, height H2 may be between 15 and 30 micrometers (um). In some embodiments, height H2 may be between 20 and 40 micrometers (um). In some embodiments, height H2 represents the height H21 of the surface contact (e.g., contact 120, 130 or 140 and the like of FIGS. 9-11) plus the height H22 of the dielectric between that contact and the LDW traces (or plus the height of the via contact between that contact and the LDW traces, such as the height of via contact 252, 254, 352 or 354; e.g., see FIG. 2A). In some embodiments, height H21 may be between 5 and 20 micrometers (um). In some embodiments, height H21 may be between 8 and 14 micrometers (um). In some cases it is between 8 and 12 um. In some embodiments, height H22 may be between 5 and 25 micrometers (um). In some embodiments, height H21 may be between 8 and 16 micrometers (um). In some embodiments, height H21 may be between 10 and 14 micrometers (um).

In some embodiments, level LM of chip 108 may have height H3. In some embodiments, height H3 may be between 0.5 and 5 micrometers (um). In some embodiments, height H3 may be between 1 and 3 micrometers (um). In some embodiments, height H3 may be between 1.5 and 2 micrometers (um). In some cases, it is between 1.6 and 1.8 um.

In some embodiments, height H3 may be for multiple layers (e.g., where level LM represents multiple levels) and be between 4 and 35 micrometers (um). In some embodiments, it may be between 4 and 26 micrometers (um). In some embodiments, it may be between 4 and 8 micrometers (um). In some embodiments, it may be between 8 and 16 micrometers (um). In some embodiments, it may be between 16 and 25 micrometers (um). In some embodiments, height H3 may be between 6 and 8 um per layer that LM represents.

In some embodiments, each of contacts 242, 244, 252, 254, 120 and 140 of chip 108 may have or represent one or more contacts that are each combined to have a length, width and height of between 14 and 45 micrometers.

FIGS. 1-3 show chip 109 including zone 198 which includes zone 194. In some cases, solder bumps 119 of zone 198 are considered not to be part of chip 108. Zone 198 is shown including data signal receive circuits 174 electrically coupled (e.g., with zero or less than 20 Ohm resistance) to one end 382 (e.g., see FIG. 3A) of on-die "last silicon metal layer" (LSML) or last silicon metal level chip data signal "leadway" (LDW) routing traces 181. The opposite end 383 of signal LDW traces 181 are electrically coupled to surface contact 130 (e.g., see FIG. 3A). In some cases, circuits 174 are or include on-die circuits or data buffers located below the LSML of chip 109 and for receiving data signals sent across a data signal channel by data signal transmit circuits 172 of chip 108.

Zone 194 includes on-die "last silicon metal layer" (LSML) or last silicon metal level chip data signal "leadway" (LDW) routing traces 181. In some cases, traces 181 extend along a top level or a planar surface of an on-die second or "LV2" level that is the level below the topmost "LV3" level or a level having surface contacts 130 on which to form solder bumps 119 on for connecting the chip to a package 110. Some or all of traces 181 may be extending between and coupled to (e.g., electrically coupled to conduct electrical signals with zero or less than 20 Ohm resistance) data signal receive circuits 174 of chip 109 and upper level receive data signal contact 130 of chip 109. Contacts 130 of chip 109 may be contacts upon which solder bumps (e.g., bumps 119) may be formed for attaching some or all of contacts 130 to an opposing, upper level receive data signal contacts 130 of package 110.

In some cases, each of traces 181 has a first end 382 (e.g., see FIG. 3A) physically coupled to (e.g., through one or more via or other contacts) and electrically attached to (e.g., with zero or less than 20 Ohm electrical resistance) a transmit circuit 174 of chip 109 and a second end 383 (e.g., see FIG. 3A) physically coupled to (e.g., through a via or other contact) and electrically attached to (e.g., with zero electrical or less than 20 Ohm electrical resistance) a data receive signal surface contact 130 of chip 109 (upon which a solder bump 119 may be formed to attach that contact to an opposing data receive signal surface contact 130 of package 110).

Zone 194 also includes on-die "last silicon metal layer" (LSML) or last silicon metal level chip isolation (e.g., isolation signal) leadway routing traces 183 separating (e.g., extending along side and parallel to; and having a length similar to traces 181) adjacent pairs of traces 181. Traces 183 may include at least one of a power trace; a ground traces; or both a power and ground trace between each adjacent ones of traces 181 (e.g., see FIG. 4). There may be a number of traces of 183 disposed between two adjacent ones of traces 181. In some cases, there are one or two disposed between. In some cases, traces 183 extend along a top level or a planar surface of an on-die second or "LV2" level. Some or all of traces 183 may be extending between and coupled to (e.g., electrically coupled to conduct electrical signals with zero or less than 20 Ohm resistance) isolation traces (e.g., see traces 274 of FIG. 3) of chip 109 and upper level isolation contacts 120 of chip 109. Contact 120 of chip 109 may be a contact upon which a solder bump (e.g., bump 119) may be formed for attaching that contact to an opposing, upper level contact 120 of package 110.

In some cases, each of traces 183 has a first end 384 (e.g., see FIG. 3B) physically coupled to (e.g., through one or more via or other contact) and electrically attached to (e.g., with zero or less than 20 Ohm electrical resistance) an isolation trace 274 of chip 109. In some cases, each of traces 183 has a second end 385 (e.g., see FIG. 3B) physically coupled to (e.g., through at least one via or other contact) and electrically attached to (e.g., with zero or less than 20 Ohm electrical resistance) an isolation surface contact 120 of chip 109 (upon which a solder bump 119 may be formed to attach that contact to an opposing isolation surface contact 120 of package 110).

FIG. 3A shows chip "on-die" interconnection feature zones 198 and 194 of chip 109 and chip receive data signal "leadway" (LDW) routing traces 181. FIG. 3A shows chip 109 including zone 198 which includes zone 194. Zone 198 is shown including circuit 174 physically and electrically attached to contact 342 (e.g., contact 342 may be formed onto or physically touching) which is physically and electrically attached end 382 of signal LDW trace 181. The opposite end 383 of LDW trace 181 is physically and electrically attached to contact 352; which is physically and electrically attached to surface contact 130.

Solder 119 may be mounted on the exposed surface of contact 130 which is on or has the exposed surface planar with the bottom surface of chip 109. The bottom (e.g., exposed) surface of chip 109 is shown as surface 303. The distance between the center of contact 342 and of contact 130 is shown as length L3 or pitch length PL. In some cases, length L3 is the length of data signal LDW traces 181 and 183.

Zone 194 is shown as having a portion of length L3 that includes trace 181 between contacts 342 and 130. First exposed level LV1 of chip 109 is shown including contacts 352 and 130. In some cases, contact 352 may represent a single contact such as a via contact formed on the bottom surface of end 383 of trace 181. In some cases it represents more than one contact formed that way. In some cases, contact 130 may represent a single solder bump contact formed on the bottom surface of contact 352.

In some cases, contact 352 may represent between one and three contact levels, similar to but above level LV1. In some cases, it may represent between one and three of such levels including a contact similar to 352 and a contact similar to 130 located between the bottom surface of trace 181 and top surface 303. In some cases, trace 181 will be vertically located as low and close as possible to surface 303 or contact 130.

In some cases where switched buffer (SB) signal channels are implemented as described herein, level LV2 will represent a number of levels such as LV2, that is equal to the number of switched buffer (SB) signal channels; and each of these levels has contacts such as 352 and 130 for each pair of switch buffers (e.g. see FIGS. 9A-11B). In some cases, each of these levels will also include via contacts between each end of each data signal LDW trace, such as contacts 352 and 342 that connect one end to a data signal circuit and the other end to a solder bump surface contact of each data signal LDW trace, for each pair of switch buffers (e.g. see FIGS. 9A-11B).

In some cases, contact 342 may represent a single contact such as a via contact upon which the top surface of end 382 of trace 181 is formed. In some cases, contact 342 may also represent a single contact such as a via contact formed on the bottom surface of a data signal receive contact circuit 174. In some cases contact 342 represents more than one contact formed that way.

In some cases, trace 181 and optionally contact 342 exists on the LSML or second, LV2 level from the bottom of chip 109 (e.g., level LM is part of a level LV2). In some cases, trace 181 and optionally contact 342 exists on the LSML or second, LV2 level from the bottom of chip 109. However, if there is more than one switch buffer pair, some pairs of traces 181 and some of contacts 342 may be in an upper level from surface 303 of chip 109 (e.g., LV4 and/or LV3).

In some cases, level LM and contact 342 represent more than one level of contacts. In some cases they represent a single contact such as via contact 342 as shown. In other cases they represent multiple levels of via and/or contacts such as contact 342 and contact 130 extending vertically between first end 382 of trace 181 and a contact of circuit 174. In some cases they represent between one and 50 levels between the top surface of trace 181 and the bottom surface of a contact of circuit 174.

FIG. 3A shows data signal (e.g., receive or buffer) circuit 174 on Level LN. It can be appreciated that Level LN may be any level above and including levels above Level LM.

FIG. 3B shows chip "on-die" interconnection feature zones 198 and 194 of FIGS. 1A-B showing a chip isolation "leadway" (LDW) routing trace 183 to isolate a chip receive data signal "leadway" (LDW) routing traces 181. In FIG. 3B zone 198 is shown including trace 274 physically and electrically attached to contact 344 (e.g., contact 344 may be formed onto or physically touching) which is physically and electrically attached end 384 of isolation LDW trace 183. The opposite end 385 of LDW trace 183 is physically and electrically attached to contact 354; which is physically and electrically attached to surface contact 120.

Solder 119 may be mounted on the exposed surface of contact 120 which is on or has the exposed surface planar with the bottom surface of chip 109. The distance between the center of contact 344 and of contact 120 is shown as length L3 or pitch length PL.

Zone 194 is shown as having a portion of length L3 that includes trace 183 between contacts 344 and 120. First exposed level LV1 of chip 109 is shown including contacts 354 and 120. In some cases, contact 354 may represent a single contact such as a via contact formed on the bottom surface of end 385 of trace 183. In some cases it represents more than one contact formed that way. In some cases, contact 120 may represent a single solder bump contact formed on the bottom surface of contact 354.

In some cases, contact 354 may represent between one and three contact levels, similar to but above level LV3. In some cases, it may represent between one and three of such levels including a contact similar to 354 and a contact similar to 120 located between the bottom surface of trace 183 and top surface 303. In some cases, trace 183 will be vertically located as low and close as possible to surface 303 or contact 120.

In some cases where switched buffer (SB) signal channels are implemented as described herein, level LV3 will represent a number of levels such as LV3, that is equal to the number of switched buffer (SB) signal channels; and each of these levels has contacts such as 354 and 120 for each pair of switch buffers (e.g. see FIG. 6).

In some cases where switched buffer (SB) signal channels are implemented as described herein, level LV2 will represent a number of levels such as LV2, that is equal to the number of switched buffer (SB) signal channels; and each of these levels has contacts such as 354 and 120 for each pair of switch buffers (e.g. see FIGS. 9A-11B). In some cases, each of these levels will also include via contacts between each end of each data signal LDW trace, such as contacts 354 and 344 that connect one end to a data signal circuit and the other end to a solder bump surface contact of each data signal LDW trace, for each pair of switch buffers (e.g. see FIGS. 9A-11B).

In some cases, contact 344 may represent a single contact such as a via contact upon which the top surface of end 384 of trace 183 is formed. In some cases, contact 344 may also represent a single contact such as a via contact formed on the bottom surface of a data signal output contact of circuit 174. In some cases contact 344 represents more than one contact formed that way.

In some cases, trace 183 and optionally contact 344 exists on the LSML or second, LV2 level from the bottom of chip 109 (e.g., level LM is part of a level LV2). In some cases, trace 183 and optionally contact 344 exists on the LSML or second, LV2 level from the bottom of chip 109. However, if there is more than one switch buffer pair, some pairs of traces 183 and some of contacts 344 may be in an upper level from surface 303 of chip 109 (e.g., LV4 and/or LV3).

In some cases, level LM and contact 344 represent more than one level of contacts. In some cases they represent a single contact such as via contact 344 as shown. In other cases they represent multiple levels of via and/or contacts such as contact 344 and contact 120 extending vertically between first end 384 of trace 183 and a contact of circuit 174. In some cases they represent between one and 50 levels between the top surface of trace 183 and the bottom surface of a contact of circuit 174.

FIG. 3B shows isolation signal (e.g., ground or DC power signal trace or plane) trace 274 on Level LN. It can be appreciated that Level LN may be any level above and including levels above Level LM.

In some cases, zone 198 includes zone 194 and receive circuits 174. In some cases, zone 198 includes zone 194, surface contacts 130 of chip 109, and receive circuits 174. In some cases, zone 198 includes zone 194, surface contacts 130 of chip 109, solder bumps 119 attaching contacts 130 of chip 109 to contacts 130 of package 110, and receive circuits 174. In some cases, receive circuits 174 represent a receive buffer, such as a part of a data signal receive circuit that is connected to data signal traces, via contacts, or surface contacts to receive a data signal from another electronic device or chip.

In some embodiments, traces 181 and 183 (e.g., LDW traces on level LV2; or other data signal LDW traces of patterns 500, 900, 905, 1000, 1005, 1100 and 1105 on level LV2, LV3, LV4 and/or LV5) may have length L3, width W1 and Height H1.

In some embodiments, length L3 may be between 50 and 1 millimeter (mm). In some embodiments, length L3 may be between 100 and 600 micrometers (um). In some embodiments, length L3 may be between 200 and 500 micrometers (um). In some embodiments, length L3 may be approximately 400 micrometers (um) (e.g., see FIGS. 6A-B and 8). In some embodiments, length L3 may be between 100 and 400 micrometers (um) (e.g., see FIGS. 7A-B). In some embodiments, length L3 may be between 150 and 450 micrometers (um) (e.g., see FIGS. 9A-11B). In some embodiments, length L3 may be between 350 and 450 micrometers (um). In some embodiments, length L1 may be between 400 and 500 micrometers (um). In some embodiments, L3 will be equal to L1.

In some embodiments, level LV1 of chip 109 may have height H2. In some embodiments, level LM of chip 109 may have height H3. In some embodiments, level LN of chip 109 may have height similar to that described for chip 108.

In some embodiments, each of contacts 342, 344, 352, 354, 120 and 130 of chip 109 may have or represent one or more contacts that are each combined to have a length, width and height of between 4 and 25 micrometers.

In some embodiments, level LN of chip 108 and 109 may have height of between 2 and 4 micrometers (um). In some embodiments, LN may represent multiple layers and be between 4 and 25 micrometers (um). In some embodiments, it may be between 4 and 16 micrometers (um). In some embodiments, it may be between 4 and 8 micrometers (um). In some embodiments, it may be between 8 and 16 micrometers (um). In some embodiments, it may be between 16 and 25 micrometers (um). In some embodiments, it may represent the total height of chip 108 or 109, minus the heights of layers LM, LV2 (and any of LV3-5 if they exist) and LV1. Above level LN, chip 108 and 109 may include various interconnect layers, chip layers, chip circuits and IC processor circuitry (e.g., electronic devices, transistors, diodes, logic, gates, and the like) as known in the industry for a semiconductor device IC chip.

In some cases, package device 110 may be cored or coreless package. In some cases, the package includes features formed according to a standard package substrate formation processes and tools such as those that include or use: lamination of dielectric layers such as ajinomoto build up films (ABF), laser or mechanical drilling to form vias in the dielectric films, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peel able core panel. The substrate may be a substrate used in an electronic device package or a microprocessor package.

In some cases, each of traces 182 and/or 181 coupled to a contact 140 and/or 130 may represent a data signal or high frequency (HF) data signal trace (e.g., having a data signal or high frequency (HF) data signal (e.g., transmit or "TX" data signal and receive or "RX" data signal, respectively) as described herein or known) coupled to a transmit or receive contact (e.g., see 182 coupled to 140 for transmit; and 181 coupled to 130 for receive of FIGS. 5A-B). In some cases, each of traces 182 and/or 181 coupled to a contact 140 and/or 130 may represent a first and second chip pair of an electronic system 170 that are connected and communicating with each other through a package (e.g., package 110).

In some cases, each of traces 184 and/or 183 coupled to a contact 120 may represent a ground or power trace (e.g., having a ground signal or direct current power signal as described herein or known) coupled to a ground or power contact (e.g., see 184G coupled to 120G for ground; and 184P coupled to 120P for power of FIGS. 5A-B). In some cases, each of traces 184 and/or 183 coupled to an isolation trace or plane 272 and/or 274. Each of traces 272 and 274 may be a trace or plane having an isolation (e.g., ground or DC power) signal capable of isolating one data signal from another (e.g., adjacent) data signal of adjacent ones of LDW traces 182 and/or 181, when that isolation signal is electrically coupled to traces 184 and/or 183 which are located between the adjacent ones of the LDW traces. This isolation signal may be a ground signal or direct current power signal as described herein or known. In some cases, each of traces 184 and/or 183 coupled to a contact 120 may represent a side by side pair (e.g., on the same level, such as LV2) of a ground and power trace coupled to a ground and power contact (e.g., see 184G coupled to 120G side by side with 184P coupled to 120P, between a pair of traces 182 of FIGS. 5A-B).

It is considered that trace 183, 184, 184G or 184P is capable of electronically isolating or shielding a data signal transmitted (or received) on one (e.g., on level LV2) signal trace 182 or 181 from a data signal transmitted (or received) of an adjacent (e.g., also on level LV2) signal trace 182 or 181. In some cases, each of trace 183, 184, 184G or 184P is capable of reducing data signal cross-talk, lossy lines, and reflections (e.g., singing) in a data signal transmitted (or received) on one (e.g., on level LV2) signal trace 182 or 181 from a data signal transmitted (or received) of an adjacent (e.g., also on level LV2) signal trace 182 or 181.

The electronically isolating or shielding may occur when such data signals are transmitted by a transmitter circuit on a first chip (to or) through traces 182 (and possibly other on-die features, chip connections, interfaces, attachments, solder bumps, etc.) to a semiconductor device package the first chip is mounted on, through the packaging, and (to or) through traces 181 of a second chip. In some cases, they occur when such signals are transmitted through traces 181 of a second chip but not through traces 182 on the first chip (e.g., traces 182 do not exist on the first chip).

Chip 108 is shown having bottom surface 203, such as a surface of dielectric, upon or in which are formed (e.g., disposed) contacts 140 and 120 in an area of zone 196. Contacts 140 and 120 are shown in a row along width W3 of chip 108. In some cases, contacts 140 and 120 are located lengthwise along or at opposing ends of length L1, L11 or L111 (e.g., see FIGS. 9A-11B). In some cases, only contacts 140 are located lengthwise along or at opposing ends of length L1, L11 or L111 (e.g., see FIGS. 9A-11B) and contacts 120 are located at another lengthwise location in area 101 of package 110. In some cases, contacts 140 may be described as a signal cluster formed in a lengthwise 4-row deep die-bump pattern, where the first and second rows are SB pairs, and the third and fourth rows are SB pairs (e.g., see FIGS. 9A-11B).

Chip 109 is shown having bottom surface 303, such as a surface of dielectric, upon or in which are formed (e.g., disposed) contacts 130 and 120 in an area of zone 198.

Contacts 130 and 120 are shown in a row along width W3 of chip 109. In some cases, contacts 130 and 120 are located lengthwise along or at opposing ends of length L3, L31 or L311 (e.g., see FIGS. 9A-11B). In some cases, only contacts 130 are located lengthwise along or at opposing ends of length L3, L31 or L311 (e.g., see FIGS. 9A-11B) and contacts 120 are located at another lengthwise location in area 111 of package 110. In some cases, contacts 130 may be described as a signal cluster formed in a lengthwise 4-row deep die-bump pattern, where the first and second rows are SB pairs, and the third and fourth rows are SB pairs (e.g., see FIGS. 9A-11B).

Package 110 is shown having top surface 103, such as a surface of dielectric, upon or in which are formed (e.g., disposed) contacts 140 and 120 in a zone of area 101 under of chip 108 (and optionally near an edge towards chip 109). In some cases, the pattern of contacts 140 and 120 in area 101 matches or is a mirror image of the pattern of contacts 140 and 120 in zone 196. Package 110 is also shown having top surface 103, such as a surface of dielectric, upon or in which are formed (e.g., disposed) contacts 130 and 120 in a zone of area 111 under of chip 109 (and optionally near an edge towards chip 108). In some cases, the pattern of contacts 130 and 120 in area 111 matches or is a mirror image of the pattern of contacts 140 and 120 in zone 198.

FIGS. 1A-B show system 170 having package 110 data signal transmission lines 133 135 and 137 disposed within levels of package 110 and forming a "connection" connecting data signal solder bumps 118 and 119 on top surface contacts on areas 101 and 111 of package 110 to each other. This connection may include bumps 118 and 119. This connection may be an electrically conductive connection that is part of a single channel between a single transmit circuit (e.g., circuit 172) and a corresponding single receive circuit (e.g., circuit 174) through which it is possible to transmit data signals. This connection may be an electrically conductive connection with zero or less than 30 Ohms of electrical resistance.

The combination of this connection (e.g., of package 110 data signal transmission (and receive) lines 133 135 and 137 connecting data signal solder bumps 118 and 119) and the chip on-die interconnection features (e.g., zone 192 (or pattern 900, pattern 1000 or pattern 1100) and/or zone 194 (or pattern 905, pattern 1005 or pattern 1105) such shown in FIGS. 1A-11B) may form a single channel between a single transmit circuit (e.g., circuit 172) and a corresponding single receive circuit (e.g., circuit 174). It can be appreciated that there may be many such channels (e.g., 5 channels are shown in FIGS. 1A-B, but there can be dozens or hundreds). Some embodiments of these data signal channels are also described with respect to FIGS. 4 and 9A-11B.

In some case, this connection plus the structures in chip on-die interconnection features (e.g., zone 192 (or pattern 900, pattern 1000 or pattern 1100) and/or zone 194 (or pattern 905, pattern 1005 or pattern 1105) between data transmit and receive circuits may form data signal transmission (and receive) channels (e.g., including through package 110) such as channel 176, channel 176B of FIG. 4, and similar channels with longer channel lengths of FIGS. 9A-11B. In some cases, these data signal transmission (and receive) channels include all of the data signal transmission LDW traces, package traces, bumps, contacts, and other structures between signal transmit circuits (e.g., circuits 172) and corresponding signal receive circuits (e.g., circuits 174) (e.g., see FIGS. 1-11B). In some cases, these data signal channels may also include signal transmit circuits (e.g., circuits 172) and corresponding signal receive circuits (e.g., circuits 174).

In some cases, there are isolation signal traces, connections or routing extending in package 110 parallel to, shielding and electronically isolating each of data signal lines 133 135 and 137 from other ones of data signal lines 133 135 and 137 within package 110 (e.g., on the same level or on different levels of package 110) between solder bumps 118 and 119. These isolation connections may include some of solder bumps 118 and 119 that attach isolation signal surface contacts in zones 101 and 111 of package 110 to corresponding isolation signal surface contacts in 196 and 198 of chips 108 and 109, respectively. In some cases, isolation (e.g., ground and/or power) signal transmission LDW traces, package traces, bumps, contacts, and other structures (e.g., between circuit 172 and circuit 174) are disposed parallel to, on the same level as, and provide electrical shielding and isolation of the data signal transmission LDW traces, package traces, bumps, contacts, and other structures between circuit 172 and circuit 174 of these data signal channels (e.g., see FIGS. 1-11B).

In some cases, this electrical shielding and isolation, through package 110, may be the same as described above (and/or for FIG. 5A-B) for each of trace 183, 184, 184G or 184P being capable of reducing data signal cross-talk, lossy lines, and reflections (e.g., singing) in a data signals transmitted (or received) on one (e.g., on level LV2, LV3, LV4, LV5, vertical via contacts, surface contacts, solder bumps, horizontal package levels) data signal LDW trace (e.g., trace 182 or 181, or those of FIGS. 9A-11B) from a data signals transmitted (or received) of an adjacent (e.g., also on level LV2, LV3, LV4, LV5, vertical via contacts, surface contacts, solder bumps, horizontal package levels, respectively) data signal LDW trace (e.g., trace 182 or 181, or those of FIGS. 9A-11B).

FIGS. 1A-B show vertical data signal transmission lines 133 (e.g., data signal transmit lines or traces) originating at chip 108 and extending vertically downward through bumps 118 and into vertical levels of package 110. In some cases, lines 133 may originate at (e.g., start at the bottom surface of transmit signal contacts 140 on) the bottom surface 203 of chip 108, extend downward through bumps 118 (e.g., include height of bumps 118), extend downward through (e.g., include signal contacts 140 on) a top surface 103 of package 110 at location 101, and extend downward to levels Lj-L1 of package 110 at first horizontal location 134 of package 110 (e.g., include vertical signal lines within vertical levels Ltop-L1 of package 110, such as where level Ltop is the topmost or uppermost level of package 110 and has an exposed top surface 103; and level L1 is below level Ltop).

FIGS. 1A-B also show package device horizontal data signal transmission lines 135 (e.g., data signal transmit lines or traces) originating at first horizontal location 134 in levels Lj-L1 of package 110 and extend horizontally along levels Lj-L1 along length L2 of levels Lj-L1 to second horizontal location 136 in levels Lj-L1 of package 110. Length L2 may be between 0.5 and 25 mm. In some cases it is between 1.0 and 15 mm. In some cases it is between 0.2 and 10 mm. In some cases it is between 2 and 10 mm. In some cases it is between 2 and 6 mm. In some cases it is between 3 and 5 mm. In some cases it is between 3.5 and 4.5 mm. In some cases it is between 4 and 5 mm. It can be appreciated that length L2 may be an appropriate line or trace length within a package device, that is less than or greater than those mentioned above.

Next, FIGS. 1A-B show vertical data signal transmission lines 137 (e.g., data signal transmission lines or traces) originating in package 110 and extending vertically upward through bumps 119 and terminating at chip 109. In some cases, lines 137 may originate at (e.g., from horizontal data signal transmission lines 135 in) levels Lj-L1 at second horizontal location 136 of package 110, extend upward through receive signal contacts 130 at location 111 on top surface 103 of package 110, extend upward through bumps 119 (e.g., include height of bumps 119), and extend upward to and terminate at receive signal contacts 130 on bottom surface 303 of chip 109.

In some cases the data signal transmit signals transmitted and received (or existing) on data signal transmission lines of lines 133, 135 and 137 originate at (e.g., are generated or are provided by) chip 108 and are sent or transmitted to chip 109. In some cases, these data signal transmission signals may be generated by active circuits, transistors, transmitter, buffer circuitry 172 or other components of chip 108.

In some cases the data signal transmit signals described herein are high frequency (HF) data signals (e.g., TX data signals). In some cases, the signals have a speed of between 4 and 10 gigatransfers per second (GT/s). In some cases, the signals have a speed of between 6 and 8 gigatransfers per second. In some cases, the signals have a speed of between 4 and 5 Gigabits per second. In some cases, the speed is between 4.1 and 4.5 Gigabits per second. In some cases, the signals have a speed of between 2 and 12 Gigabits per second. In some cases, the signals have a speed of between 3 and 12 Giga-Transfers per second. In some cases the signals have a speed between 7 and 25 GT/s; and a voltage of between 0.5 and 2.0 volts. In some cases the signal has a speed between 6 and 15 GT/s. In some cases the signal has a voltage of between 0.4 and 5.0 volts. In some cases it is between 0.5 and 2.0 volts. In some cases it is a different speed and/or voltage level that is appropriate for receiving or transmitting data signals through or within a package device. In some cases, they are in a range between a very low speed transfer rate such as from 50 MT/s to greater than 40 GT/s (or up to between 40 and 50 GT/s).

In some cases, lines 133, 135 and 137 also include power and ground signal lines or traces (e.g., in addition to high frequency data signals transmit lines or traces). These power and ground lines are not shown. In some cases, they extend horizontally from the bottom surface of contacts 120 of chip 108 to location 134 within levels Lj-L1 or other levels of package 110. In some cases they extend horizontally from location 134 to location 136 within levels Lj-L1 or within other levels of package 110. In some cases the power and ground signals transmitted and received (or existing) on the power and ground signal lines of lines 133, 135 and 137 originate at or are provided by chip 108 or by package 110 or by chip 109. In some cases, these power and ground signals may be generated by power and ground traces, transistors or other components of or attached to chip 108, package 110 or chip 109.

In some cases the power signal of lines 133, 135 and 137 (or of isolation LDW trace 184; or power LDW trace 184P—See FIGS. 5A-B) is or includes power signals to an IC chip (e.g., chip 108 or 109), package 110, or another device attached to thereto. In some cases this power signal is a direct current (DC) power signal (e.g., Vdd). In some cases the power signal has a DC voltage of between 0.4 and 7.0 volts. In some cases it is between 0.5 and 5.0 volts. In some cases it is a different voltage level that is appropriate for providing one or more electrical power signals through or within a package device or IC chip.

In some cases the ground signal of lines 133, 135 and 137 (or of isolation LDW trace 184 or ground LDW trace 184G—See FIGS. 5A-B) is or includes ground signals to an IC chip (e.g., chip 108 or 109), package 110, or another device attached to thereto. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

FIGS. 1A-B show system 170 having vertical height H4 between traces 182 (and optionally 184) and location (e.g., corner) 135. Height H4 may include structures in zone 196 levels LV1, LV2 and LM. In some cases, height H4 may include or be equal to height H1, plus height H2, plus height H3; plus the height of bumps 118; and the height from surface 103 to levels Lj-L1 of package 110. In some cases, H4 is between 10 and 150 um. In Some cases it is between 30 and 100 um. In some cases it is between 45 and 85 um. In some cases, H4 describes a vertical height from the top surface of the package (103) to levels Lj-L1 of package where the horizontal signal traces go between the two chips.

FIGS. 1A-B show system 170 having vertical height H5 between traces 181 (and optionally 183) and location (e.g., corner) 136. Height H5 may include structures in zone 198 levels LV1, LV2 and LM. In some cases, height H5 may include or be equal to height H1, plus height H2, plus height H3; plus the height of bumps 119; and the height from surface 103 to levels Lj-L1 of package 110. In some cases, height H5 may be equal to height H4. In some cases, they may be different heights. In some cases, H5 is between 10 and 150 um. In Some cases it is between 30 and 100 um. In some cases it is between 45 and 85 um.

The connection formed by data signal transmission lines 133 135 and 137 (including solder bumps 118 and 119) plus the structures in zones 196 and 198 between circuits 172 and 174 may form data signal transmission channel 176 (e.g., through package 110). In some cases, channel 176 has a "channel length" CL (e.g. see FIG. 4), such as a total length a signal must travel between circuits 172 and 174. In some cases length CL includes the lengths and heights of the signal transmission features, paths and traces between circuits 172 and 174. In some cases, this channel length CL is length L1, plus height H4, plus length L2, plus height H5, plus length L3. In some cases, channel length CL will be different depending on whether zone 192, zone 194, or both zones exist in system 170 (e.g., such as discussed with respect to FIGS. 4 and 6-8).

Data signal transmission lines 135 are shown having length L2. Thus, the horizontal distance between circuits 172 and 174 may be length L1, plus L2, plus L3. In some cases, the combination of the lengths traces 182, signal lines 133, 135 and 137; and traces 181 form data signal transmission channel 176 horizontal distance, such as of a data transmit channel from chip transmit circuits 172 of chip 108 to receive circuits 174 of chip 109.

Data signal transmission lines 133 and 137 are shown having height H4 and H5, respectively. Thus, the aggregate vertical distance between circuits 172 and 174 may be height H4 plus H5. In some cases, the combination of the heights of levels LM, LV2 and LV1; bumps 118 and 119; and signal lines 133 and 137 form data signal transmission channel 176 vertical distance, such as of a data transmit channel from chip transmit circuits 172 of chip 108 to receive circuits 174 of chip 109.

Figure 4A:
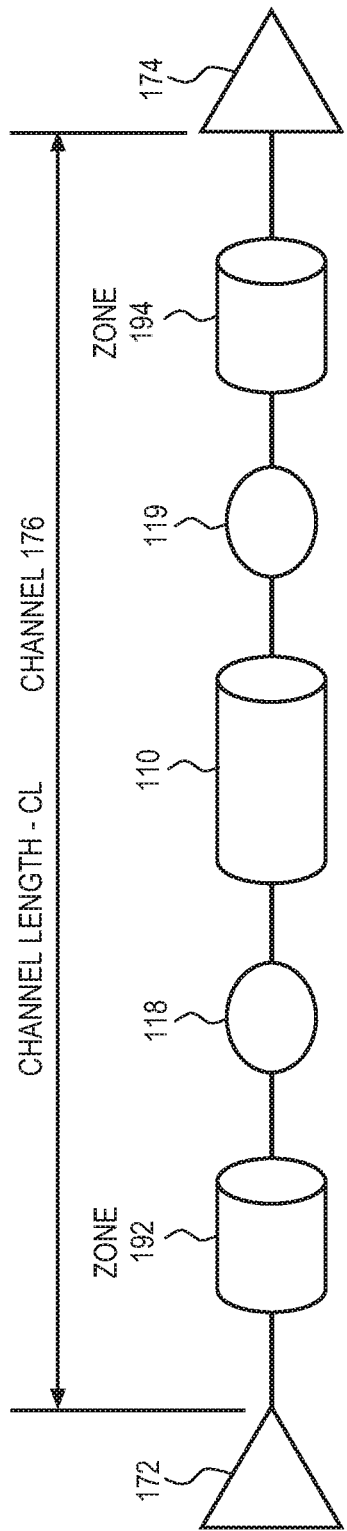
FIGS. 4A and B show embodiments of data signal transmission channels having data signal LDW traces (e.g., chip "on-die" interconnection features).
Figure 4B:
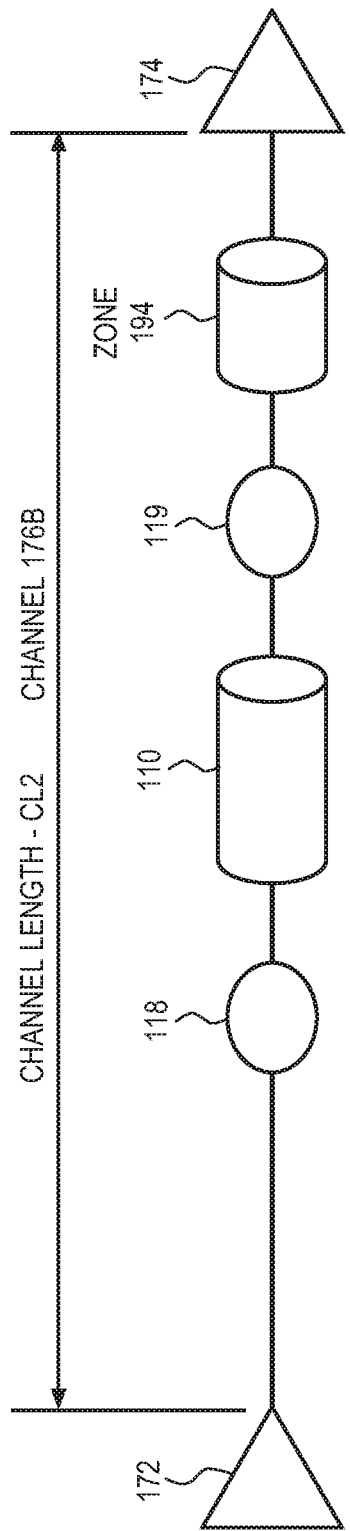

FIGS. 4A and B show embodiments of data signal transmission channels having data signal LDW traces (e.g., chip "on-die" interconnection features). FIGS. 4A-B may show embodiments of two feasible data signal channel topologies to maximize OPIO performance, which are LDW routing on TX and RX chips, and LDW routing on RX chip only. For some embodiments, FIG. 4A may describe one feasible channel topology (channels 176) to maximize on-package (e.g., package 110) input and output performance, using LDW traces (e.g., trace lengths, routes or "routing") for or on both a transmit chip 108 and receive 109 chip of a data communication channel. For some embodiments, FIG. 4B may describe one feasible channel topology (channels 176B) to maximize on-package (e.g., package 110) input and output performance, using LDW traces (e.g., trace lengths, routes or "routing") for or on only a receive 109 chip of a data communication channel. In some case, FIG. 4A shows channel 176 as one example of a data signal transmission channel (e.g., based on channel 176 herein) between and connecting circuit 172 of chip 108 to circuit 174 of chip 109, having data signal LDW traces on both chip 108 and 109. In some case, FIG. 4B shows channel 176B as a second example of a data signal transmission channel (e.g., based on parts of channel 176 herein) between and connecting circuit 172 of chip 108 to circuit 174 of chip 109, having data signal LDW traces on chip 109 but not on chip 108. In some cases, channel 176 or 176B may exist between and electronically connect circuit 172 of chip 108 to circuit 174 of chip 109 for transmitting high speed data signals as noted herein.

In some case, FIG. 4A shows data signal transmission channel 176 having data signal LDW traces (e.g., chip "on-die" interconnection features) at zones 192 and 194. Channel 176 may correspond to the descriptions herein, including descriptions for FIGS. 1-3, and have channel length CL. Channel 176 is shown having transmit circuit 172 physically and electrically coupled to LDW traces of zone 192, which are physically and electrically coupled to solder bumps 118, which are physically and electrically coupled to signal traces extending through package 110, which are physically and electrically coupled to solder bumps 119, which are physically and electrically coupled to LDW traces of zone 194, which are physically and electrically coupled to received circuits 174. Channel 176 may include these features as physically and electrically coupled to each other, extending between circuit 172 and 174.

In some cases, channel 176 represents the combination of package 110 data signal transmission (and receive) lines 133 135 and 137 connecting data signal solder bumps 118 and 119 (e.g., shown as feature "110" in FIG. 4A), and the chip on-die interconnection features of chips 108 and 109 (e.g., zone 192 (or pattern 900, pattern 1000 or pattern 1100 such shown in FIGS. 9A-11B), shown as "zone 192" in FIG. 4A) and zone 194 (or pattern 905, pattern 1005 or pattern 1105 such shown in FIGS. 9A-11B), shown as "zone 194" in FIG. 4A)), such as to form a single channel between a single transmit circuit (e.g., circuit 172) and a corresponding single receive circuit (e.g., circuit 174). It can be appreciated that there may be many such channels (e.g., 5 channels are shown in FIGS. 1A-B, but there can be dozens or hundreds).

In some case, FIG. 4B shows data signal transmission channel 176B having data signal LDW traces (e.g., chip "on-die" interconnection features) only at zone 194. Channel 176B is shown having a channel such as described above for channel 176 having zone 194 (e.g., with LDWs 181 and 183) but without zone 192 (e.g., without LDWs 182 and 184) and without having length L1 as described herein, including descriptions for FIGS. 1-3. Thus, instead of having channel length CL, channel 176B has channel length CL2 which may be equal to the length CL1 minus length L1 of zone 192. In some cases, channel length CL2 is height H4, plus length L2, plus height H5, plus length L3.

Channel 176B is shown having transmit circuit 172 physically and electrically coupled to solder bumps 118 (e.g., without LDW traces of zone 192 connected between circuit 172 and bumps 118), which are physically and electrically coupled to signal traces extending through package 110, which are physically and electrically coupled to solder bumps 119, which are physically and electrically coupled to LDW traces of zone 194, which are physically and electrically coupled to received circuits 174. In some cases, vertical via contacts and other contacts extend vertically through levels LM and LV2 (but not horizontally and without any horizontal length such as length L1) to physically and electrically coupled circuit 172 to contacts 140 of chip 108. Channel 176B may include these features as physically and electrically coupled to each other, extending between circuit 172 and 174.

In some cases, channel 176B represents the combination of package 110 data signal transmission (and receive) lines 133 135 and 137 connecting data signal solder bumps 118 and 119 (e.g., shown as feature "110" in FIG. 4B), and only the chip on-die interconnection features of chip 109 (e.g., excluding zone 192 (or pattern 900, pattern 1000 or pattern 1100 such shown in FIGS. 9A-11B), but including zone 194 (or pattern 905, pattern 1005 or pattern 1105 such shown in FIGS. 9A-11B), shown as "zone 194" in FIG. 4B)), such as to form a single channel between a single transmit circuit (e.g., circuit 172) and a corresponding single receive circuit (e.g., circuit 174). It can be appreciated that there may be many such channels (e.g., 5 channels are shown in FIGS. 1A-B, but there can be dozens or hundreds).

For some embodiments, a data signal transmission channel (e.g., channel 176 and/or 176B) represents a data signal: transmission path, separate path through which data signals can flow, transmission path of multiple such paths within a single link between network points (e.g., chip 108 transmit circuits 172 and chip 109 receive circuits 174), or physical transmission medium such as including contacts, solder bumps and traces. In some cases, a channel is used to convey a data information signal, for example a digital bit stream, from one or several senders (e.g., transmitters 172) to one or several receivers (e.g., receivers 174). In some cases, a channel has a certain capacity for transmitting data signal information, often measured by its bandwidth in hertz (Hz) or its data rate in bits per second.

FIGS. 5A and 5B show embodiments of data signal LDW routing features on an LSML layer of transmit and/or receive data chips (e.g., chip "on-die" interconnection features). FIGS. 5A-B show examples of the LSML isolated LDW trace routing in transmit and/or receive data chips (e.g., "silicon") with typical dense package data signal (and isolation) routing for cascading with short on-package MCP channels, according to embodiments.

FIG. 5A shows a cross-sectional length wise perspective view through perspective A-A' across a width of zone 192 (or zone 194) showing a pattern of data signal and isolation LDW traces, according to various embodiments. For example, it may be a cross section perspective through perspective A-A', such as a cross section of levels LV1, LV2, LM and LN perpendicular to length (e.g., looking at a cross sectional view of the plane of height and width, and down direction L1) and showing 500 a pattern of data signal and isolation LDW traces.

FIG. 5B shows a bottom perspective view of zone 192 (or of zone 194), as shown in FIG. 5A showing a pattern of data signal and isolation LDW traces extending along a length (e.g., L1 or L3), according to various embodiments of the application. It is noted that the bottom view of FIG. 5B shows embodiments from the perspective of looking upwards in FIGS. 1A-3B, such as a perspective viewing through exposed bottom surface 203 of chip 108 and/or surface 303 of chip 109. Thus, the descriptions of levels LV1, LV2, LM and LN for FIG. 5B may be in a reverse or inverted order (e.g., using bottommost for the top of the paper) as compared to looking down at the page, or as compared to the top of FIGS. 1A-3B. More specifically, the descriptions of FIGS. 9A, 10A and 11A may refer to level LV1 as a bottom (e.g., bottom most or lower) level as opposed to a top (e.g., topmost or upper) level LN such as shown for FIGS. 1A-3B.

FIGS. 5A and B show pattern 500 having each one of data signal LDW traces 182 isolated from each other one of (e.g., each of an adjacent trace 182 on level LV2) by an isolation LDW trace 184P and 184G. In some embodiments, each trace 184P and 184G represents an embodiment of isolation trace 184. In some examples, trace 184G represents an isolation ground signal LDW trace version of trace 184, such as by having a ground signal on trace 184G (e.g., representing a version of trace 184 where isolation is provided by trace 184G only having a ground signal transmitted on that trace). In some examples, trace 184P represents an isolation power signal LDW trace version of trace 184, such as by having a power signal on trace 184P (e.g., representing a version of trace 184 where isolation is provided by trace 184G only having a power signal transmitted on that trace). In some cases, traces 184G and 184P represent isolation ground and power signal LDW trace versions of traces 184G and 184P, respectively. Each trace 182, 184G and 184P is shown having width W1 and a distance between each trace as shown as width W2.

In some embodiments, width W2 may be between 1 and 8 micrometers (um). In some embodiments, width W2 may be between 1 and 5 micrometers (um). In some embodiments, width W2 may be between 2 and 4 micrometers (um). In some cases, W2 is between 1 and 10 um. In some cases it is between 3.5 and 7.5 um. In some cases it is between 5 and 6 um. In some cases, W2 is equal to W1 for the same embodiment.

FIG. 5A shows level LM including via contacts 244P and 244G. Level LN is represented in FIG. 5A by a horizontal plane, which may represent level LN as described herein, such as with respect to FIGS. 1A-3B. FIG. 5B shows level LM and LN represented by a cross-striped plane. In some cases, level LN is shown included in level LM as "level LM and LN". This level represents a combination of level LM and level LN and described herein. In some cases, level LM and level LN are represented by a lengthwise (e.g., along L1) strips of hash marks on a level above level LV2 or LSML, and between the signal and isolation LDW traces numbered 1-9.

Pattern 500 is shown having, left to right along width W3 along perspective A-A', trace numbers 1-9 which are LDW traces 184G, 182, 184P, 184G, 182, 184G, 184P, 182, and 184G. According to pattern 500, as shown, one of each, a power LDW trace 184P and ground LDW trace 184G trace are disposed widthwise between each adjacent pair (e.g., side by side along width W3) of signal LDW traces 182. For example, adjacent pair of signal traces number 5 and number 8 ground trace 184G which is trace number 6 and power isolation trace 184P which is trace number 7 located between that pair in level LV2 or the LSML. In other embodiments, only one isolation trace is located between each adjacent pair of signal traces. In this instance, the isolation trace can be a ground trace or a power trace.

In some cases, a pattern may be used similarly to pattern 500 with an arrangement of any order of one or two of traces 184G and/or 184P between each adjacent one or pair of LDW traces 182. In some cases the pattern on level LV2/LSML may be each data signal LDW trace 182 having at least one or two isolation traces 184P and 184G between and isolating from another trace 182. In some cases, there may be 184G then 184P, or 184P then 184G, left to right between each adjacent trace 182 on level LSML. In some cases, there may be either 184G then 184P; or 184P then 184G, left to right between each adjacent trace 182. In some embodiments, a sequence similar to pattern 500 may have each of data signal LDW traces 182 isolated from each of an adjacent (e.g., pair of traces 182) by only one of an isolation ground LDW trace 184G or an isolation power LDW trace 184P.

FIGS. 5A-B show the data signal and isolation LDW traces on level LV2 or LSML. Above level LV2 they show level LM including via contacts, such as those described for contacts 244 in embodiments of FIGS. 1A-3B. In some cases, similar to embodiments having isolation LDW traces 184 that are power or ground isolation traces, via contacts 244 will be power via contact 244P or ground via contact 244G, respectively. In some cases, similar to embodiments having isolation LDW traces 184 that are power or ground isolation traces, via contacts 254 will be power via contact 254P or ground via contact 254G, respectively. Also, in some cases, similar to embodiments having isolation LDW traces 184 that are power or ground isolation traces, surface bump contacts 120 will be power surface bump contact 120P or ground surface bump contact 120G, respectively.

FIGS. 5A-B also show power isolation signal via contact 254P and surface bump contact 120P for power isolation signal LDW trace number 7; data signal via contact 252 and surface bump contact 140 for data signal LDW trace number 8; ground isolation signal via contact 254G and surface bump contact 120G for ground isolation signal LDW trace number 9. It can be appreciated that the via contacts 254P and 254D, and 252; and surface contacts 120P and 120G and 140 also exist above the other data signal and isolation traces numbered 1-6, respectively, even thought not shown.

In some cases, any or all of the via contacts (e.g., 242 and 252; 244 (e.g., P or G) and 244 (e.g., P or G); 254 (e.g., P or G) and 254 (e.g., P or G); and the like) and surface contacts (e.g., 120G, 120 (e.g., P or G), 130 and 140) may have top view X,Y cross sectional areas (e.g., from view of FIGS. 1A and 9A-11B) that are circular having diameter or width W4. In some cases, width W4 is between 3 and 25 um. In some cases, it is between 5 and 10 micrometers (um). In some cases, it is between 5 and 15 micrometers. In some cases, these top view X,Y cross sectional areas (e.g., from view of FIGS. 1A and 9A-11B) are for a shape having a maximum width (maximum distance from one edge to another farthest edge from above) of an oval, a rectangle, a square, a triangle, a rhombus, a trapezoid, or a polygon shape.

According to some embodiments, via contact 244P and 244G may physically and electronically attach traces 184P and 184G to contacts 120P and 120G, respectively, along length L1 of trace 272, instead of just being located near trace 272, as shown in FIGS. 1A-3B. For example, an embodiment of FIGS. 1A-3B is considered where a length of contact 244 (e.g., 244P and 244G) is physically and electrically attached between traces 184 (e.g., 184P and 184G) and an isolation trace (e.g., a length of a long trace 272) or an isolation plane (e.g., having an isolation signal as described for trace 272), along at least half, most or all of the length L1. In some cases they physically and electrically are attached along most or all of length L1. In some cases they physically and electrically are attached along most of length L1. In some cases, most of length L1 is 70, 80 or 90 percent of length L1. In some cases, most of length L1 is 90, 95 or 98 percent of length L1. In some cases, most of length L1 is 95 percent of length L1.

In some cases, contact 244P describes a via contact attached between the power isolation trace 184P and a power plane disposed in level LN, along half, most, or all of length L1. In some cases they physically and electrically are attached along most or all of length L1. In some cases they physically and electrically are attached along most of length L1. In some cases, contact 244G describes a via contact attached between the power isolation trace 184G and a power plane disposed in level LN, along half, most, or all of length L1. In some cases they physically and electrically are attached along most or all of length L1. In some cases they physically and electrically are attached along most of length L1. In a more general embodiment, contact 244 describes a via contact attached between the an isolation trace 184 and an isolation plane disposed in level LN, along half, most, or all of length L1. In some cases they physically and electrically are attached along most or all of length L1. In some cases they physically and electrically are attached along most of length L1.

In some cases, circuits 172 are attached to the left end (e.g., left side of the page along length L1) of traces 182, and contacts 140 are attached to the right (e.g., right side of the page along length L1) of traces 182 along length L1 (although not shown in FIG. 5B). Also, in some cases, traces 272G (e.g., representing an isolation ground signal trace) and 272P (e.g., representing an isolation power signal trace) are attached to the left end of traces 184G and 184P; and contacts 120G and 120P are attached to the right end of traces 184G and 184P, respectively along length L1 (although not shown in FIG. 5B).

Although two isolation LDW traces (power and ground) are shown between each pair of signal LDW traces, it is considered that a different number may be disposed between each adjacent pair of signal LDW traces along level LV2. For example, there may only be one isolation LDW trace, 184P or 184G, disposed between each adjacent signal LDW trace pair. In other cases, there may be three isolation LDW traces, such as 184PGP (e.g., representing 184P, 184G and 184P); 184PPG; 184GGP; 184GPG; 184PPP; or 184GGG between each adjacent pair of signal LDW traces 182 on level LV2.

According to some embodiments, pattern 500 may be repeated such as where a new set of traces 1-9 repeat to the right of trace 9 as shown in FIG. 5A, along width W3. They may repeat between 1 and 20 times. According to some embodiments, pattern 500 may only include trace numbers 2-7 (e.g., traces 1 and 8-9 do not exist), and those traces may be repeated such as where a new set of traces 2-7 repeat to the right of trace 7 as shown in FIG. 5A, along width W3.

According to embodiments, the descriptions above for FIGS. 5A-B (e.g., and pattern 500) also apply to chip 109. For example, in some cases, chip 109 (e.g., in zone 198) may include the same structure described above for FIGS. 5A-B for chip 108 (e.g., in zone 196). In some cases, such a replacement includes (or optionally is) replacing zone 196 with zone 198. In some cases, such a replacement includes (or optionally is) replacing zone 192 with zone 194.

In some cases, such a replacement includes (or optionally is) using descriptions of pattern 500 or other patterns of signal traces 182 and isolation traces 184 (e.g., ground isolation traces 184G and power isolation traces 184P) of FIGS. 5A-B to describe pattern 500 or other patterns of traces 181 and isolation traces 183 of chip 109 (e.g., ground isolation traces 183G and power isolation traces 183P, similar to 184G and 184P); using descriptions of pattern 500 or other patterns of transmit data contacts 140 of FIGS. 5A-B to describe pattern 500 or other patterns of receive data contacts 130 of chip 109; and using descriptions of pattern 500 or other patterns of transmit circuits 172 of FIGS. 5A-B to describe pattern 500 or other patterns of receive circuits 174 of chip 109.

In some cases, such a replacement includes (or optionally is) using descriptions of pattern 500 or other patterns of circuits 172 and isolation traces 272 (e.g., ground isolation traces 272G and power isolation traces 272P) of FIGS. 5A-B to describe pattern 500 or other patterns of circuits 174 and isolation traces 274 of chip 109 (e.g., ground isolation traces 274G and power isolation traces 274P, similar to 272G and 272P). In some cases, such a replacement includes (or optionally is) using descriptions of pattern 500 or other patterns of contact 242, contact 252, contact 140, and bump 118 of FIGS. 5A-B to describe pattern 500 or other patterns of contact 342, contact 352, contact 130, and bump 119 of chip 109. In some cases, such a replacement includes (or optionally is) using descriptions of pattern 500 or other patterns of contact 244 (e.g., ground isolation contact 244G and power isolation contact 244P), contact 254 (e.g., ground isolation contact 254G and power isolation contact 254P), and contact 120 (e.g., ground isolation contact 120G and power isolation contact 120P) of FIGS. 5A-B to describe pattern 500 or other patterns of contact 344 (e.g., contact 344G and 344P), and contact 354 (e.g., contact 354G and 354P), contact 120 (e.g., contact 120G and 120P) of chip 109.

In some cases, each of circuits 172 and/or 174 coupled to traces 182 and/or 181 may represent a data signal or high frequency (HF) data signal transmit and receive circuits (e.g., transmitting and receiving, respectively, a data signal or high frequency (HF) data signal as described herein or known (such as a high speed data buffer circuit)) coupled through traces 182 and/or 181 to a transmit and/or receive contact (e.g., see circuit 172 coupled through trace 182 to contact 140 for transmit; and circuit 174 coupled through trace 181 to contact 130 for receive). In some cases, each of circuits 172 and/or 174 coupled to traces 182 and/or 181, which are then coupled to a contact 140 and/or 130 may represent a first and second chip transmit and receive data signal circuit pair of an electronic system that are connected and communicating with each other through a package (e.g., package 110).

In some cases, each of traces 184 (e.g., ground isolation traces 184G and power isolation traces 184P) and/or 183 (e.g., ground isolation traces 183G and power isolation traces 183P) coupled to a contact 120 (e.g., ground isolation contact 120G and power isolation contact 120P) may represent a ground or power trace (e.g., having a ground signal or direct current power signal as described herein or known) coupled to a ground or power contact (e.g., see 184G coupled to 120G for ground; and 184P coupled to 120P for power). In some cases, each of traces 184 (e.g., ground isolation traces 184G and power isolation traces 184P) and/or 183 (e.g., ground isolation traces 183G and power isolation traces 183P) coupled to a contact 120 (e.g., ground isolation contact 120G and power isolation contact 120P)

may represent a side by side pair (e.g., on the same level, such as LSML) of a ground and power trace coupled to a ground and power contact (e.g., see 184G coupled to 120G side by side with 184P coupled to 120P, between a pair of traces 182 or 181).

It is considered that trace 183, 184, 184G or 184P is capable of electronically isolating or shielding a data signal transmitted (or received) on one (e.g., on level LV2) signal trace 182 or 181 from a data signal transmitted (or received) of an adjacent (e.g., also on level LV2) signal trace 182 or 181. In some cases, each of trace 183, 184, 184G or 184P is capable of reducing data signal cross-talk, lossy lines, and reflections (e.g., singing) in a data signal transmitted (or received) on one (e.g., on level LV2) signal trace 182 or 181 from a data signal transmitted (or received) of an adjacent (e.g., also on level LV2) signal trace 182 or 181.

The electronically isolating or shielding may occur when such data signals are transmitted by a transmitter circuit on a first chip (to or) through traces 182 (and possibly other on-die features, chip connections, interfaces, attachments, solder bumps, etc.) to a semiconductor device package the first chip is mounted on, through the packaging, and (to or) through traces 181 of a second chip. In some cases, they occur when such signals are transmitted through traces 181 of a second chip but not through traces 182 on the first chip (e.g., traces 182 do not exist on the first chip).

It can be appreciated that the descriptions of isolation (e.g., power and/or ground) LDW traces, via contacts, surface contacts and signal circuits for FIG. 5A-B can also be applied to the isolation traces shown and described for FIGS. 9A-11B.

FIGS. 6A-8 may be examples of an results from or related to (e.g., laboratory or test) experiments or simulations performed on or for a chip having a on-package chip features described herein; and/or an electronic system having 2 chips having a on-package chip features described herein that can (or are) communicate high speed data signals through a chip package as described herein (e.g., such as based on FIGS. 1-5 and 9A-11B). In some cases, a data signal channel (e.g., channel 176; 176B, and data signal channels described for FIGS. 1-5 and 9A-11B); or another channel without isolated data signal LDW traces of system 170) is impedance tuned (e.g., see FIGS. 6A-8) to minimize impedance discontinuity and crosstalk between horizontally adjacent ones of isolated data signal LDW traces (e.g., traces 182 and/or 181; and isolated data signal traces of FIGS. 1-5 and 9A-11B) of the channel. In some cases, the terms "data signal channel including data signal LDW traces" will be used to refer to channel 176, channel 176B, and other data signal channels described for FIGS. 1-5 and 9A-11B.

In some cases, impedance tuning the data signal channel may include tuning to determine or identify a selected target length for L1, L2 and/or L3 (e.g., given other set or known heights and widths of traces 133, 135, 137, 182 and/or 181) that provides a the best channel performance as showed as the largest amplitude eye height (EH) and eye width (EW) charts of example FIGS. 6A-8 produced by testing one of isolated traces 182 and/or 181. In some cases, impedance tuning the data signal channel may include tuning to determine or identify a selected target length for data signal LDW traces of SB patterns 900, 905, 1000, 1005, 1100 and 1105, such as length L1 (and L3), L11 (and L31), L111 (and L311) which can be extended to be one times, two times or three times the pitch PL between each of the adjacent solder bump surface contact (e.g., see FIGS. 9A-11B) (e.g., given other set or known heights and widths of traces 133, 135, 137, isolation LDW traces and/or data signal LDW traces) that provides a the best channel performance as showed as the largest amplitude eye height (EH) and eye width (EW) charts of example FIGS. 6A-8 produced by testing one isolated data signal LDW traces of FIGS. 9A-11B.

The EH and EW charts may be output signal measure (or computer modeled) at a location of isolated data signal traces (e.g., of channel 176; 176B, and data signal channels described for FIGS. 1-5 and 9A-11B) when (e.g., as a result of running) one or more input test data signals are sent through the channel length (e.g., as described for example FIGS. 6A-8) of the channel. This testing may include sending simultaneous test signals, such as step up (e.g., ▁▔) and down (e.g., ▔▁) signals, through one type of isolated data signal traces traces for a channel having a given channel length. This may include performing such tuning to determine or identify lengths L1 (or L11 or L111), L2 and/or L3 (or L31 or L311) for FIGS. 1-5 and 9A-11B, for a channel having both, one or neither of isolated data signal LDW traces that are single line impedance tuned in the routing along the channel length.

Impedance tuning of the line may be based on or include as factors: horizontal data signal transmission line width W1, width W2, height H1, height H4, height H5. In some cases, once the W1, width W2, height H1, height H4, height H5 are known (e.g., predetermined or previously selected based on a specific design of system 170), then tuning is performed (e.g., computer simulation, actual "beta" device testing, or other laboratory testing) to determine or identify a range of lengths L1 (or L11 or L111), L2 and/or L3 (or L31 or L311) for FIGS. 1-5 and 9A-11B, that provide the best channel performance as showed as the lowest amplitude cross point of eye height (EH) or eye width (EW) curves of an eye diagram produced by testing one isolated data signal LDW traces of FIGS. 9A-11B.

Figure 6A:
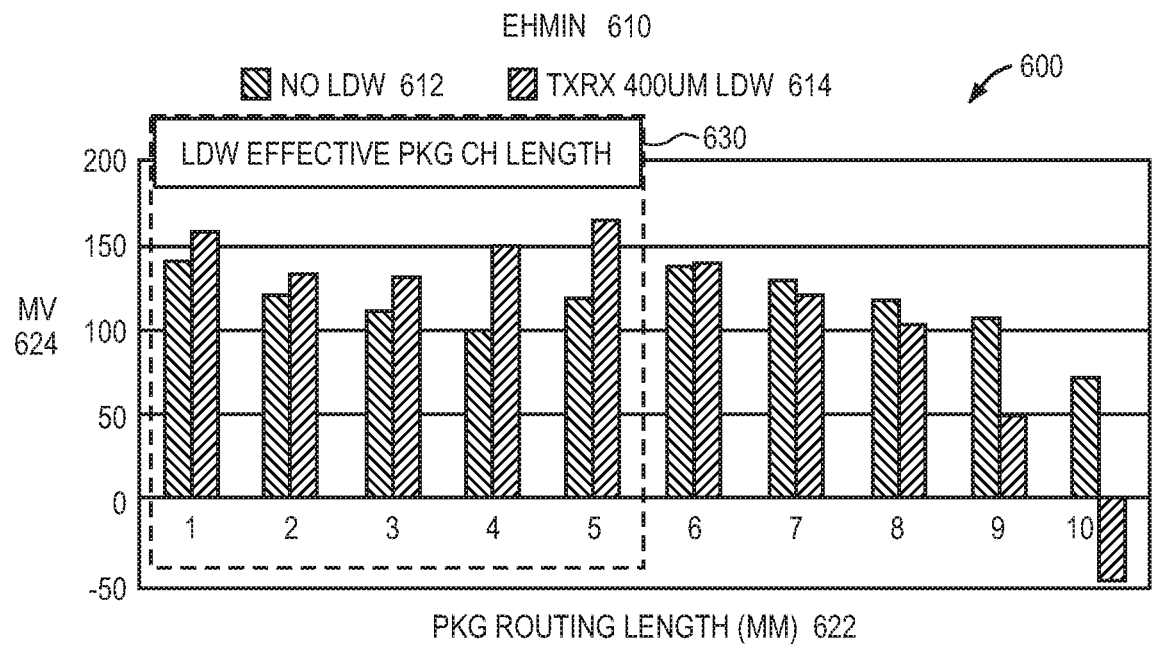
FIG. 6A shows an example of an a bar chart eye height minimum performance comparison of a data signal channel having various package channel/routing lengths between a transmit chip and a receive chip that have data signal LDW traces isolated by isolation LDW traces, as compared to such a channel excluding LDW traces.
Figure 6B:
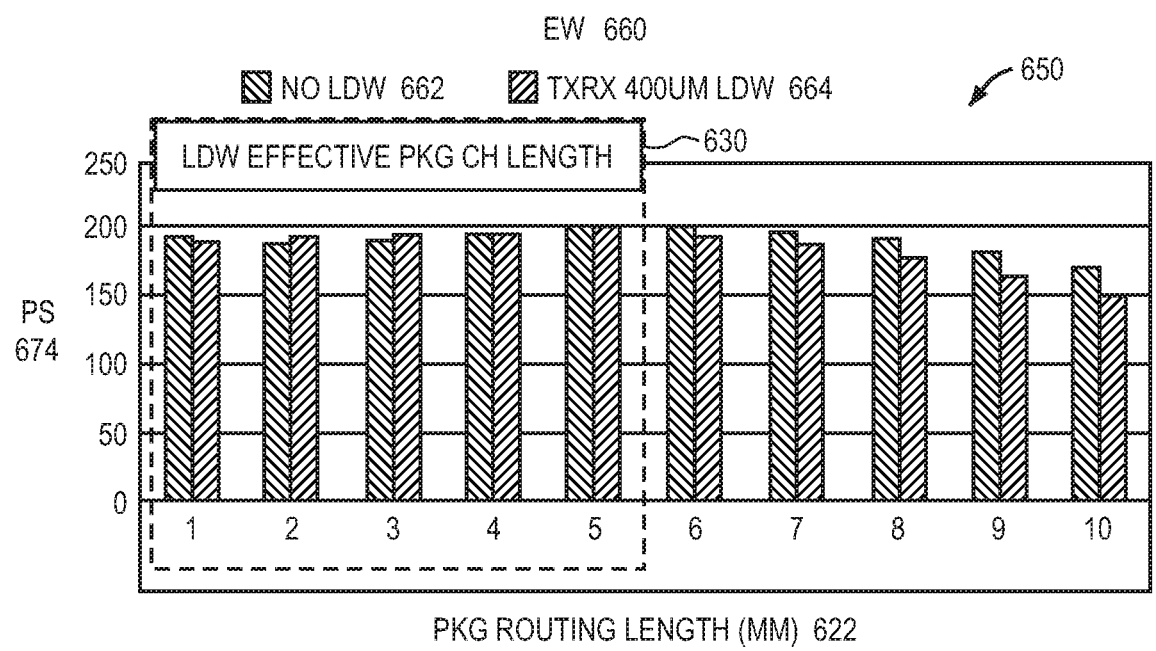
FIG. 6B shows an example of a bar chart eye width minimum performance comparison of a data signal channels of FIG. 6A.

FIGS. 6A-B may be an example of results from or related to (e.g., laboratory or test) experiments or simulations that show eye height and eye width comparison for an electronic system having a transmit chip and a receive chip that can (or are) communicate high speed data signals through a chip package using (1) a data signal channel having transmit chip and receive chip (e.g., "isolated") data signal LDW traces isolated by isolation LDW traces (e.g., having on-package features described herein), as compared to (e.g., with all other sizes, lengths, widths, heights, etc. being the same) (2) a data signal channel excluding LDW traces (e.g., excluding such on-package features) for various channel routing lengths of the package. FIG. 6A shows an example of an a bar chart eye height minimum performance comparison of a data signal channel having various package channel/routing lengths between a transmit chip and a receive chip that have data signal LDW traces isolated by isolation LDW traces, as compared to such a channel excluding LDW traces. FIG. 6A shows a bar chart eye height minimum 610 performance comparison 600 of (bars 614) a data signal channel (e.g., channel 176) having: (1) a zone of transmit data signal LDW traces isolated by isolation LDW traces (e.g., having zone 192, pattern 900, pattern 1000 or pattern 1100 of FIGS. 1-5, 9A, 10A and 11A), and (2) a zone of receive data signal LDW traces isolated by isolation LDW traces (e.g., having zone 194, pattern 905, pattern 1005 or pattern 1105 of FIGS. 1-5, 9A, 10A and 11A), as compared to (bars 612) a channel excluding those zones and/or patterns (e.g., channel 176 without those zones and patterns).

In some cases, FIG. 6A shows bar chart 600 graphing first vertical bars 612 for or representing eye height for a channel 176 excluding: zones 192 and 194; pattern 900 and 905; patterns 1000 and 1005; or patterns 1100 and 1105, and thus having a channel length equal to horizontal length L2 (e.g., ranging from 1-10 mm), plus vertical height H4' (e.g., H4–H1), plus vertical height H5' (e.g., H5–H1) (e.g., between circuits 172 and 174; 972A-B; 1072A-B; or 1172A-B). In some cases, it also shows second vertical bars 614 for or representing eye height for a channel having: (1) a zone of transmit data signal LDW traces isolated by isolation LDW traces and with length L1, L11 or L111 of 400 um (e.g., of FIGS. 1-5, 9A, 10A and 11A), and (2) a zone of receive data signal LDW traces isolated by isolation LDW traces and with length L3, L31 or L311 of 400 um (e.g., of FIGS. 1-5, 9B, 10B and 11B), as compared to (bars 612) a channel excluding those zones and/or patterns (e.g., channel 176 without those zones and patterns). Thus, bars 614 are for a data signal channel having a data signal channel length equal to horizontal length 400 um (e.g., L1, L11 or L111), plus L2 (e.g., ranging from 1-10 mm), plus 400 um (e.g., L3, L31 or L311), plus vertical height H4, plus vertical height H5 (e.g., between circuits 172 and 174).

Chart 600 has vertical axis 624 of eye height minimum 610 between 0 and 200 mV; and a horizontal axis 622 showing the package routing length (mm) of length L2. As shown in the LDW trace effective package channel length area 630 of chart 600, where axis 622 is between 1 and 5 mm, the eye height minimum or vertical axis 624 is greater in height by at least 10 percent for bars 614 than for bars 612. Notably, at length 622 of L2 of 5 mm, bar 614 is above 150 mV and appears to be at least 45% greater in height than bar 612 which is below 120 mV.

FIG. 6B shows an example of a bar chart eye width minimum 660 performance comparison 650 of a data signal channels of FIG. 6A. FIG. 6B shows a bar chart eye width 650 performance comparison 660 of (bars 664) a data signal channel (e.g., channel 176) having: (1) a zone of transmit data signal LDW traces isolated by isolation LDW traces (e.g., having zone 192, pattern 900, pattern 1000 or pattern 1100 of FIGS. 1-5, 9A, 10A and 11A), and (2) a zone of receive data signal LDW traces isolated by isolation LDW traces (e.g., having zone 194, pattern 905, pattern 1005 or pattern 1105 of FIGS. 1-5, 9A, 10A and 11A), as compared to (bars 662) a channel excluding those zones and/or patterns (e.g., channel 176 without those zones and patterns).

Chart 650 has vertical axis 674 of eye width minimum between 0 and 250 ps (pico seconds); and a horizontal axis 622 (e.g., same as FIG. 6A). As shown in the LDW trace effective package channel length area 630 of chart 650, where axis 622 is between 1 and 5 mm, the eye width minimum or vertical axis 674 is within 5 percent in height for bars 614 and 612. Notably, at length 622 of L2 of 5 mm, bar 664 is appears to be equal in height to that of bar 612.

In some cases, FIGS. 6A-B show the performance comparison results indicate that a data signal channel having (1) a zone of transmit data signal LDW traces isolated by isolation LDW traces, and (2) a zone of receive data signal LDW traces isolated by isolation LDW traces effectively improves the minimum eye opening by up to 50 percent (e.g., see FIG. 6A) while maintaining eye width margins for 1-5 mm package channel length (e.g., L2) for a data signal having a speed for frequency of 4.3 Gpbs data rate and 26 IO/mm routing density, as compared to a channel excluding zones of transmit and receive data signal LDW traces isolated by isolation LDW traces (e.g., channel 176 without zones 192 and 194). In some cases, the "Gpbs data rate" is a data rate or data transfer rate of how many bit can be transferred in 1 second at a single wire or an input or output (IO) wire, channel or trace. In some cases, the "IO/mm" is a routing density of how many wires (IO wires) can be routed out in a single layer in 1 mm height.

Figure 7A:
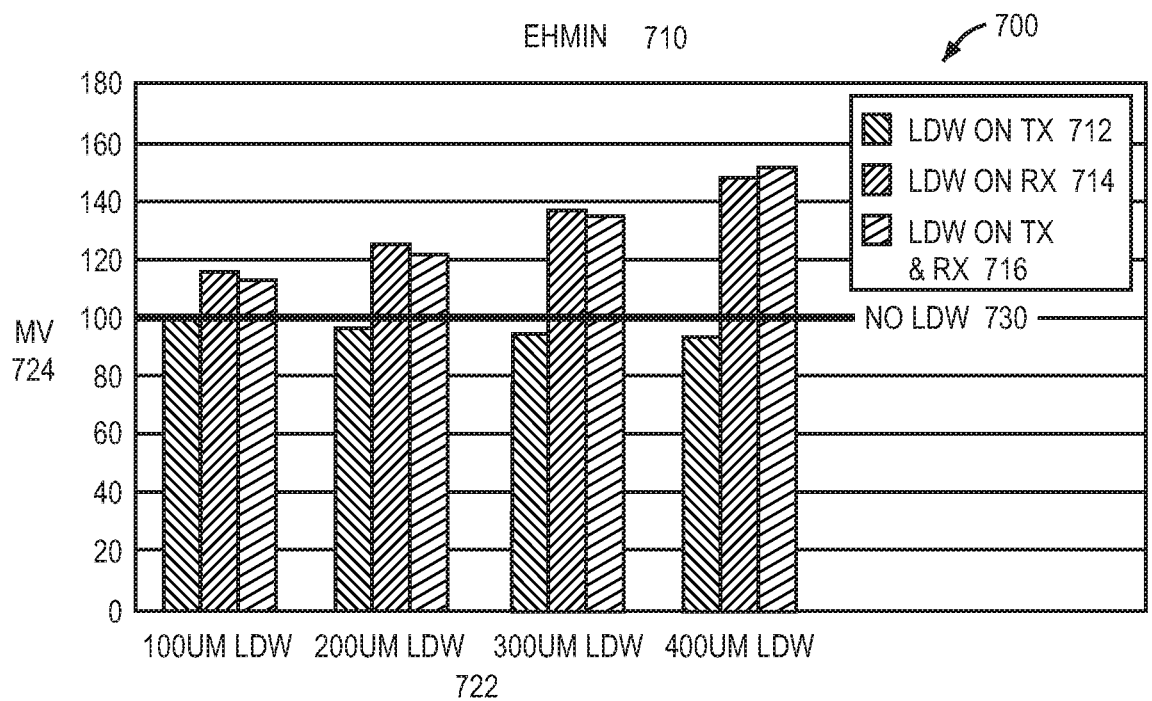
FIG. 7A shows an example of a bar chart eye height minimum performance comparison of a data signal channel having various transmit chip and/or receive chip isolated data signal LDW trace lengths for a channel between a transmit chip and a receive chip that have data signal LDW traces isolated by isolation LDW traces only on the transmit chip, only on the receive chip, and on both the receive and transmit chips.
Figure 7B:
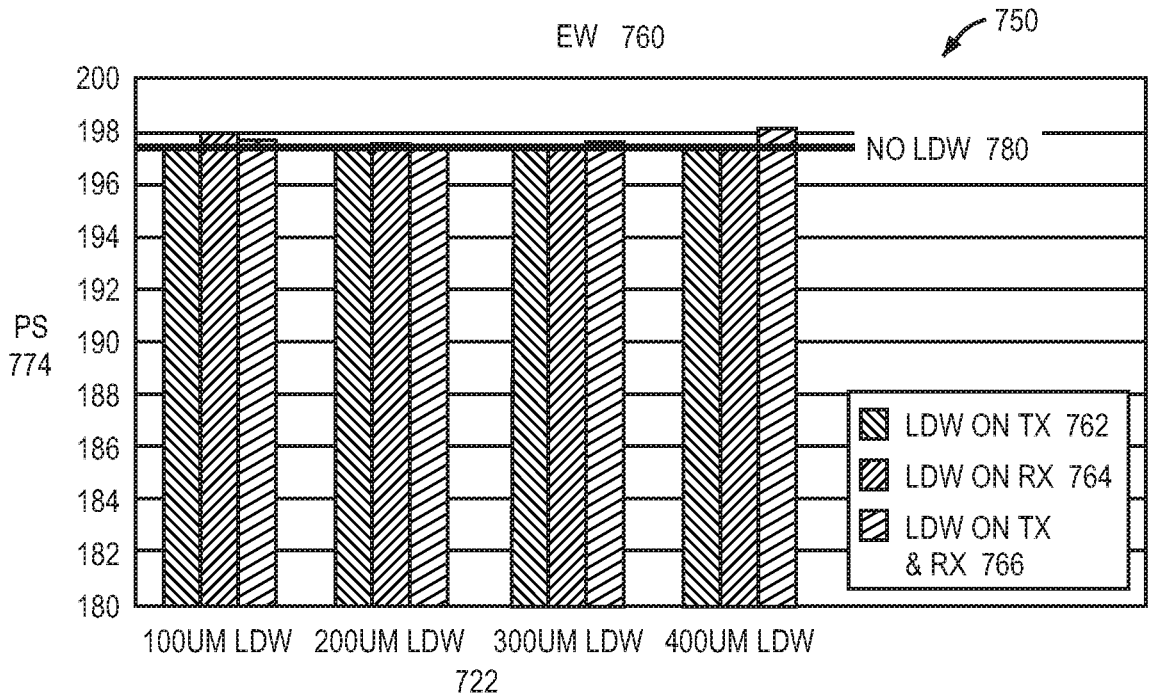
FIG. 7B shows an example of a bar chart eye width minimum performance comparison of a data signal channels of FIG. 7A.

FIGS. 7A-B may be example results from or related to (e.g., laboratory or test) experiments or simulations that show eye height and eye width comparison for an electronic system having a transmit chip and a receive chip that can (or are) communicate high speed data signals through a chip package using a data signal channel having transmit chip and/or receive chip (e.g., "isolated") data signal LDW traces isolated by isolation LDW traces (e.g., having on-package features described herein), for (1) a channel having various trace length isolated data signal LDW traces only on the transmit chip (e.g., no LDW traces on the receive chip); (2) a channel having various trace length isolated data signal LDW traces only on the receive chip (e.g., no LDW traces on the transmit chip); and (3) a channel having various trace length isolated data signal LDW traces on both the receive and transmit chips (e.g., with all other sizes, lengths, widths, heights, etc. being the same). FIG. 7A shows an example of a bar chart eye height minimum 710 performance comparison 700 of a data signal channel having various transmit chip and/or receive chip isolated data signal LDW trace lengths for a channel between a transmit chip and a receive chip that have data signal LDW traces isolated by isolation LDW traces, for (1) isolated data signal LDW traces only on the transmit chip (e.g., not on the receive chip); (2) isolated data signal LDW traces only on the receive chip (e.g., not on the transmit chip); and (3) isolated data signal LDW traces on both the receive and transmit chips (e.g., with all other sizes, lengths, widths, heights, etc. being the same).

FIG. 7A shows a bar chart eye height minimum performance comparison of a data signal channel (e.g., channel 176) having: (1) a zone of transmit data signal LDW traces isolated by isolation LDW traces (e.g., having zone 192, pattern 900, pattern 1000 or pattern 1100 of FIGS. 1-5, 9A, 10A and 11A), and/or (2) a zone of receive data signal LDW traces isolated by isolation LDW traces (e.g., having zone 194, pattern 905, pattern 1005 or pattern 1105 of FIGS. 1-5, 9A, 10A and 11A), for a fixed or predetermined package routing length L2 of 4 mm.

FIG. 7A shows bar chart 700 graphing first vertical bars 712 for or representing eye height for a data signal channel (e.g., channel 176) having (1) a zone of transmit data signal LDW traces isolated by isolation LDW traces (e.g., having zone 192, pattern 900, pattern 1000 or pattern 1100 of FIGS. 1-5, 9A, 10A and 11A), but excluding (2) a zone of receive data signal LDW traces isolated by isolation LDW traces (e.g., not including zone 194, pattern 905, pattern 1005 or pattern 1105 of FIGS. 1-5, 9A, 10A and 11A), for a fixed or predetermined package routing length L2 of 4 mm. Bars 712 may be for a data signal channel having a channel length equal to horizontal length L1, L11 or L111 (e.g., between 100 and 400 um), plus length L2 (e.g., of 4 mm), plus vertical height H4, plus vertical height H5, but excluding length L3, L31 or L311 (e.g., between circuits 172 and 174, or the like). In some cases, bars 712 are for isolated data signal LDW routing only including zone 192 (or pattern 900, pattern 1000 or pattern 1100) on chip 108, but excluding zone 194 (or pattern 905, pattern 1005 or pattern 1105) on chip 109. In some cases, the data signal channel length for bars 712 may be similar to that shown in FIGS. 1-3, 4 and 9-11, for a data signal channel 176 without zone 194, pattern 905, pattern 1005 or pattern 1105 of FIGS. 1-5, 9A, 10A and 11A FIG. 7A shows bar chart 700 graphing second vertical bars 714 for or representing eye height for a data signal channel (e.g., channel 176) excluding (1) a zone of transmit data signal LDW traces isolated by isolation LDW traces (e.g., excluding zone 192, pattern 900, pattern 1000 or pattern 1100 of FIGS. 1-5, 9A, 10A and 11A), but having (2) a zone of receive data signal LDW traces isolated by isolation LDW traces (e.g., including zone 194, pattern 905, pattern 1005 or pattern 1105 of FIGS. 1-5, 9A, 10A and 11A), for a fixed or predetermined package routing length L2 of 4 mm. Bars 714 may be for a data signal channel having a channel length equal to horizontal length L3, L31 or L311 (e.g., between 100 and 400 um), plus length L2 (e.g., of 4 mm), plus vertical height H4, plus vertical height H5, but excluding length L1, L11 or L111 (e.g., between circuits 172 and 174, or the like). In some cases, bars 714 are for isolated data signal LDW routing only including zone 194 (or pattern 905, pattern 1005 or pattern 1105) on chip 109, but excluding zone 192 (or pattern 900, pattern 1000 or pattern 1100) on chip 108. In some cases, the data signal channel length for bars 714 may be similar to that shown in FIGS. 1-3, 4 and 9-11, for a data signal channel 176 without zone 192, pattern 900, pattern 1000 or pattern 1100 of FIGS. 1-5, 9A, 10A and 11A FIG. 7A shows bar chart 700 graphing third vertical bars 716 for or representing eye height for a data signal channel (e.g., channel 176) having (1) a zone of transmit data signal LDW traces isolated by isolation LDW traces (e.g., having zone 192, pattern 900, pattern 1000 or pattern 1100 of FIGS. 1-5, 9A, 10A and 11A), and having (2) a zone of receive data signal LDW traces isolated by isolation LDW traces (e.g., including zone 194, pattern 905, pattern 1005 or pattern 1105 of FIGS. 1-5, 9A, 10A and 11A), for a fixed or predetermined package routing length L2 of 4 mm. Bars 716 may be for a data signal channel having a channel length equal to horizontal length L1, L11 or L111 (e.g., between 100 and 400 um), plus length L2 (e.g., of 4 mm), plus vertical height H4, plus vertical height H5, plus length L3, L31 or L311 (e.g., between circuits 172 and 174, or the like). In some cases, bars 716 are for isolated data signal LDW routing including both zone 192 (or pattern 900, pattern 1000 or pattern 1100) on chip 108; and including zone 194 (or pattern 905, pattern 1005 or pattern 1105) on chip 109. In some cases, the data signal channel length for bars 716 may be similar to that shown in FIGS. 1-3, 4 and 9-11, for a data signal channel 176 with zone 192, pattern 900, pattern 1000 or pattern 1100; and with zone 194, pattern 905, pattern 1005 or pattern 1105 of FIGS. 1-5, 9A, 10A and 11A. In some cases, the data signal channel length for bars 712 may be similar to that shown in FIGS. 1-3 and 4, for channel 176 (e.g., length CL, such as of FIG. 4).

Chart 700 has vertical axis 724 of eye height minimum 710 between 0 and 180 mV. Chart 700 has horizontal axis 722 showing trace lengths of 100 um, 200 um, 300 um and 400 um for lengths L1 (or L11 or L111) and/or L3 (or L31 or L311 of between 100 um and 400 mm) for isolated data signal LDW traces on the transmit chip and/or receive chip, respectively. Horizontal line 730 represents the system without isolated data signal LDW traces on the transmit chip and receive chip, such as where the channel length is equal to 4 mm (e.g., L2), plus H4 plus H5, and there are not data signal LDW traces or trace lengths.

As shown, for trace lengths between 100 um and 400 um of axis 722 having isolated data signal LDW traces on the receive chip; or transmit chip and receive chip, the eye height minimum or vertical axis 724 is greater in height by between 10 and 50 percent (e.g., for bars 714 and 716 than for bars 712). Also, as shown, for trace lengths of 300 um and 400 um of axis 722 having isolated data signal LDW traces on the receive chip; or transmit chip and receive chip, the eye height minimum or vertical axis 724 is greater in height by at least 40 and 50 percent respectively (e.g., for bars 714 and 716 than for bars 712). Notably, at length 722 of L1 and L3 of 400 um, bars 714 and 716 are above 140 mV and appear to be at least 50% greater in height than bar 712 which is below 100 mV.

It can also be seen in each case, having the receive zone 194 (or pattern 905, pattern 1005 or pattern 1105); or transmit and receive zones 192 (or pattern 900, pattern 1000 or pattern 1100) and 194 (or pattern 905, pattern 1005 or pattern 1105), result in a larger eye height minimum 710 than does the system or channel 176 without the receive zone as shown by bars 712; or without the transmit plus receive zone as shown by line 730. It is also noted that for a 400 mm length L1 and of length L3, the eye height minimum (e.g., bar 716) is above 150 millivolts (mV) as compared to being below 100 millivolts when there is no LDW length L3; or no length L1 and L3 (e.g., where zone 194; or 192 and 194 do not exist).

FIG. 7B shows an example of a bar chart eye width minimum 760 performance comparison 750 of a data signal channels of FIG. 7A. FIG. 7B shows bar chart 750 graphing first vertical bars 762 for or representing eye width for a data signal channel excluding zone 194 (or pattern 905, pattern 1005 or pattern 1105), and thus having a channel length equal to horizontal length L1, L11 or L111 (e.g., between 100 and 400 um), plus length L2 (e.g., of 4 mm), plus vertical height H4, plus vertical height H5, but excluding length L3, L31 or L311 (e.g., between circuits 172 and 174, or the like). It also shows second vertical bars 764 for or representing eye width for a data signal channel excluding zone 192 (or pattern 900, pattern 1000 or pattern 1100), and thus having a channel length equal to a horizontal length excluding length L1, L11 or L111 (e.g., between 100 and 400 um), but having length L2 (e.g., of 4 mm), plus length L3, L31 or L311 (e.g., between 100 and 400 um), plus vertical height H4, plus vertical height H5 (e.g., between circuits 172 and 174, or the like). It also shows third vertical bars 766 for or representing eye width for a data signal channel including zones 192 (or pattern 900, pattern 1000 or pattern 1100) and 194 (or pattern 905, pattern 1005 or pattern 1105); and thus having a channel length equal to horizontal length L1, L11 or L111, plus length L2 (e.g., of 4 mm), plus length L3, L31 or L311 (e.g., between 100 and 400 um), plus vertical height H4, plus vertical height H5 (e.g., between circuits 172 and 174, or the like).

Chart 750 has vertical axis 774 of eye width minimum 760 between 180 and 200 ps (pico seconds); and a horizontal axis 722 (e.g., same as FIG. 7A). Horizontal line 780 represents the system without isolated data signal LDW traces on the transmit chip and receive chip, such as where the channel length is equal to 4 mm (e.g., L2), plus H4 plus H5, and there are not data signal LDW traces or trace lengths.

As shown, for trace lengths between 100 um and 400 um of axis 722 having isolated data signal LDW traces on the transmit chip and/or receive chip, the eye width minimum or vertical axis 774 is within 0.5 percent in height for bars 712, 714 and 716. For example, the height for bars 712, 714 and 716 are all at or within 1 percent of line 780, or 197 ps (Pico seconds). Notably, the variation of width 760 appears to be less than 0.5 percent or zero; except at length 722 of L1 and L3 of 400 um, where bar 766 is appears to be 1 percent greater in height to that of bars 712 and 714.

In some cases, FIGS. 7A-B show the performance comparison results indicate that the minimum eye opening improvement is linearly proportional to the length of isolated data signal LDW routing for a data signal channel having zone 194 (or pattern 905, pattern 1005 or pattern 1105) (e.g., improvement in height 710 is linearly proportional to length L3; or zones 192 (or pattern 900, pattern 1000 or pattern 1100) and 194 (or pattern 905, pattern 1005 or pattern 1105) (e.g., improvement in height 710 is linearly proportional to length L1 plus L3) for an increase of up to 50 percent (e.g., see FIG. 7A) while maintaining eye width margins for fixed 4 mm package channel length (e.g., L2) for a data signal having a speed for frequency of 4.3 Gpbs data rate and 26 IO/mm routing density, as compared to a channel excluding zone 194; or excluding zones 192 and 194 (e.g., channel 176 without zones 194). In some cases, the "Gpbs data rate" is a data rate or data transfer rate of how many bit can be transferred in 1 second at a single wire or an input or output (IO) wire, channel or trace. In some cases, the "IO/mm" is a routing density of how many wires (IO wires) can be routed out in a single layer in 1 mm height.

Figure 8:
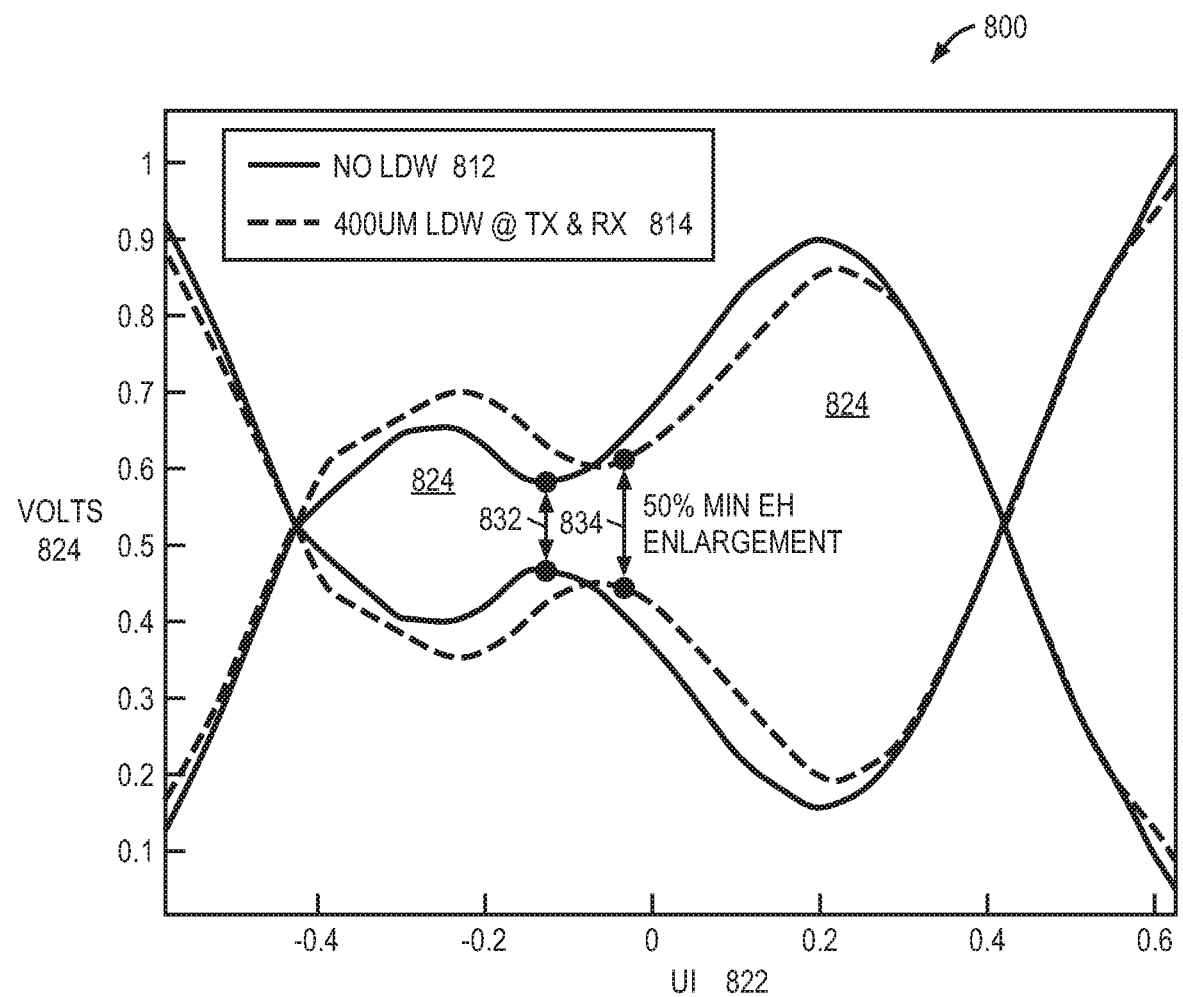
FIG. 8 shows an example of an eye diagram performance comparison of data signal channels having a 4 mm channel routing length of the package and 400 um trace lengths of isolated data signal LDW traces on both the receive and transmit chips, as compared to not having any isolated data signal LDW traces on either chip.

FIG. 8 may be example results from or related to (e.g., laboratory or test) experiments or simulations that show an eye diagram comparison for an electronic system having a transmit chip and a receive chip that can (or are) communicate high speed data signals through a chip package using (1) a data signal channel having transmit chip and receive chip (e.g., "isolated") data signal LDW traces isolated by isolation LDW traces (e.g., having on-package features described herein), as compared to (e.g., with all other sizes, lengths, widths, heights, etc. being the same) (2) a data signal channel excluding LDW traces (e.g., excluding such on-package features) for a set or predetermined 4 mm channel routing length (e.g., L2) of the package; and a set or predetermined 400 um trace length (e.g., for each of L1 and L3) for isolated data signal LDW traces on both the receive and transmit chips (e.g., with all other sizes, lengths, widths, heights, etc. being the same).

FIG. 8 shows an example of an eye diagram performance comparison of (1) a data signal channel having a 4 mm channel routing length (e.g., L2) of the package; and 400 um trace lengths (e.g., for L1, L11 or L111, as well as for L3, L31 or L311) of isolated data signal LDW traces on both the receive and transmit chips (e.g., as diagram 814), as compared to (2) a channel having a 4 mm channel routing length (e.g., L2) of the package but not having any (e.g., excluding) isolated data signal LDW traces on both the receive and transmit chips (e.g., as diagram 812) (e.g., with all other sizes, lengths, widths, heights, etc. being the same). FIG. 8 shows diagram 800 having vertical y-axis 824 indicating the amplitude of the output signal measured (e.g., "eye width") of eye diagram performance signals 812 and 814 when the test signal is applied to the data signal channel (e.g., channel 176); or at the output contact of circuit 172 (or the like), the input contact of circuit 174 (or the like), trace 133, trace 135, trace 137, bump 118, or or 119. X-axis 822 is a time scale mapping the an in-phase version of output data signals 812 and 814 measured (e.g., "eye height") when the output signals are time synchronized to be in phase such that the step up and step down test signals would normally form a rectangle or square, but form the central hexagon shaped "eye" 824. Eye 824 has y-axis eye-height minimum represented by its vertical distance along axis 824 within eye 824; and x-axis eye-width minimum represented by its horizontal distance along axis 822 within eye 824.

Thus, eye diagram performance signals 814 may be the output of or for (1) a data signal channel having a 4 mm channel routing length (e.g., L2) of the package; and 400 um trace lengths (e.g., for L1, L11 or L111, as well as for L3, L31 or L311) of isolated data signal LDW traces on both the receive and transmit chips. Also, thus, eye diagram performance signals 812 may be the output of or for (2) a channel having a 4 mm channel routing length (e.g., L2) of the package but not having any (e.g., excluding) isolated data signal LDW traces on both the receive and transmit chips (e.g., with all other sizes, lengths, widths, heights, etc. being the same for system 170).

In some cases, FIG. 8 shows an example of eye diagram 814 for a data signal channel (e.g., channel 176) having zone 192 (or pattern 900, pattern 1000 or pattern 1100) (e.g., having isolated transmit data signal LDW traces isolated by isolation LDW traces, both with length L1, L11 or L111 of 400 um) and zone 194 (or pattern 905, pattern 1005 or pattern 1105) (e.g., having isolated receive data signal LDW traces isolated by isolation LDW traces, both with length L3, L31 or L311 of 400 um), as compared to eye diagram 812 for a data signal channel excluding zones 192 (or pattern 900, pattern 1000 or pattern 1100) and 194 (or pattern 905, pattern 1005 or pattern 1105). In some cases, diagram 814 may be for a data signal channel having a channel length equal to that of a data signal channel (e.g., channel 176) having zone 192 (or pattern 900, pattern 1000 or pattern 1100) with length L1, L11 or L111 of 400 um; zone 194 (or pattern 905, pattern 1005 or pattern 1105) with length L3, L31 or L311 of 400 um; and a package routing length L2 equal to 4 mm. Thus, diagram 814 may be for a data signal channel having a data signal channel length equal to: horizontal length 400 um (e.g., L1, L11 or L111), plus horizontal length 400 um (e.g., L3, L31 or L311), plus package routing horizontal length 4 mm (e.g., plus L2), plus vertical height H4, plus vertical height H5 (e.g., between circuits 172 and 174; or the like). In some cases, diagram 812 may be for a data signal channel having a channel length equal to horizontal length L2 (e.g., 4 mm), plus vertical height H4, plus vertical height H5 (e.g., between circuits 172 and 174; or the like) (e.g., channel 176 without zones 192 (or pattern 900, pattern 1000 or pattern 1100) or 194 (or pattern 905, pattern 1005 or pattern 1105)).

Diagram 800 has vertical axis 824 of eye height minimum between 0.1 and 0.9 Volts; and a horizontal axis 822 showing the unit increments (UI) of between −0.4 and 0.6. in some cases, "unit increments" is a unit interval, or UI that is equal to 1/data_rate (e.g., as known in the art). As shown in diagram 800, there is a vertical eye height "funnel point" 832 having vertical axis 824 height 0.9 Volts (e.g., from 4.8 to 5.9 Volts) for eye diagram 812 at or close to UI value −0.16 of horizontal axis 822. Also, as shown in diagram 800, there is a vertical eye height "funnel point" 834 having vertical axis 824 height 1.5 Volts (e.g., from 4.5 to 6.0 Volts) for eye diagram 814 at or close to UI value −0.05 of horizontal axis 822. The funnel point minimum eye height expansion from eye 812 to eye 814 represents approximately a 50% minimum eye height increase or enlargement is gained by using 400 mm isolated transmit and receive data signal LDW traces (e.g., zones 192 (or pattern 900, pattern 1000 or pattern 1100) and 194 (or pattern 905, pattern 1005 or pattern 1105)) on both the transmit and receive chips 108 and 109 (e.g., shown as eye signal 814), as opposed to not having any of the isolated data signal LDW traces (e.g., shown as eye signal 812) for package horizontal channel length L2 of 4 mm.

It can be appreciated that an eye diagram (e.g., as shown in FIG. 8) can be a common indicator of the quality of signals in high-speed digital transmissions (e.g., along data signal channels described herein, such as including channel 176 or 176B). An oscilloscope can be used to generate an eye diagram by overlaying sweeps of different segments of a long data stream driven by a master clock. The triggering edge may be positive or negative, but the displayed pulse that appears after a delay period may go either way; there is no way of knowing beforehand the value of an arbitrary bit. Therefore, when many such transitions have been overlaid, positive and negative pulses are superimposed on each other (e.g., as shown by signals 812 and 814 in FIG. 8). Overlaying many bits produces an eye diagram, so called because the resulting image looks like the opening of an eye (e.g., as shown by eye 824, though not such a well shaped "eye" due to funnel points 832 and 834 in FIG. 8).

In an ideal world, eye diagrams (e.g., as shown by signals 812 and 814 in FIG. 8) would look like rectangular boxes. In reality, communications are imperfect, so the transitions do not line perfectly on top of each other, and an eye-shaped pattern results (e.g., as shown by eye 824 in FIG. 8). On an oscilloscope, the shape of an eye diagram will depend upon various types of triggering signals (e.g., input test signals), such as clock triggers, divided clock triggers, and pattern triggers. Differences in timing and amplitude from bit to bit cause the eye opening to shrink.

Also, for data links operating at gigahertz transmission frequencies (e.g., chip 108, chip 109 or system 170), variables that can affect the integrity of signals (e.g., the shape, EW and EH of the eye) can include: (e.g., data signal LDW traces of zones 192 (or pattern 900, pattern 1000 or pattern 1100) and/or 194 (or pattern 905, pattern 1005 or pattern 1105)) transmission-line effects; impedance mismatches; signal routing; termination schemes; grounding schemes; interference from other signal lines, connectors, and cables; and when signals on adjacent pairs of signal lines toggle, crosstalk among those signals on those lines can interfere with other signals on those lines (e.g., on data signal channels described herein, such as including channel 176 or 176B).

FIGS. 9A-11B show embodiments of some patterns of switched buffer (SB) data signal LDW trace pairs, according to embodiments. They may demonstrate the SB pattern examples to implement various routing lengths (e.g., data signal channel lengths) of LDW structures for cascading with data signal channels, without having to grow die size. They may show SB pattern example solutions designed to switch a pair of circuit buffers from their original locations directly on (e.g., under and at the same horizontal X,Y plane location) the solder bump surface contact pads, to exchange that own original location with the location of the other buffers pad by rout back to corresponding other buffers pad using LDW routing. In some cases, for targeted package and chip (e.g., silicon) technologies (e.g., see FIGS. 6A-11B), SB patterns allow feasible LDW trace length the range of (100 um-2 mm) increased trace routing length as compared to surface (e.g., "exit" data signal surface contact) pitch length PL (e.g., LDW trace length the range of 150 to 450 um) and allow sufficient on-die isolation.

FIGS. 9A-11B shows cross-sectional bottom views (e.g., through bottom surface 203 of chip 108 and/or bottom surface 303 of chip 109) of some patterns of chip "on-die" interconnection feature zones having data signal LDW traces between pairs of surface contacts and data signal circuits/buffers with switched X,Y horizontal locations (e.g., "switch buffer or SB pairs") in levels LV2-LV4, according to embodiments. It is noted that the bottom view of FIGS. 9A, 10A and 11A embodiments from the perspective of looking upwards in FIGS. 1A-3B and 5A (and the same perspective as FIG. 5B), such as a perspective viewing exposed bottom surfaces 203 of chip 108 and/or 303 of chip 109. Thus, the descriptions of levels LV1, LV2, LV3, LV4, LM and LN for FIGS. 9A, 10A and 11A may be in a reverse or inverted order (e.g., using bottommost for the top of the paper) as compared to looking down at the page, or as compared to the top of FIGS. 1A-3B, 9B, 10B and 11B. More specifically, the descriptions of FIGS. 9A, 10A and 11A may refer to level LV1 as a bottom (e.g., bottom most or lower) level as opposed to a top (e.g., topmost or upper) level LN such as shown for FIGS. 1A-3B, 9B, 10B and 11B. Similarly, the descriptions of FIGS. 9A, 10A and 11A may refer to level LV2 as above level LV1, level LV3 as above level LV2, level LV4 as above level LV3, level LM as above level LV4, and level LN as above level LM (e.g., ascending order in height) as opposed level LV2 as below level LV1, level LV3 as below level LV2, level LV4 as below level LV3, level LM as below level LV4, and level LN as below level LM (e.g., descending order in height) such as shown for FIGS. 1A-3B, 9B, 10B and 11B.

Figure 9A:
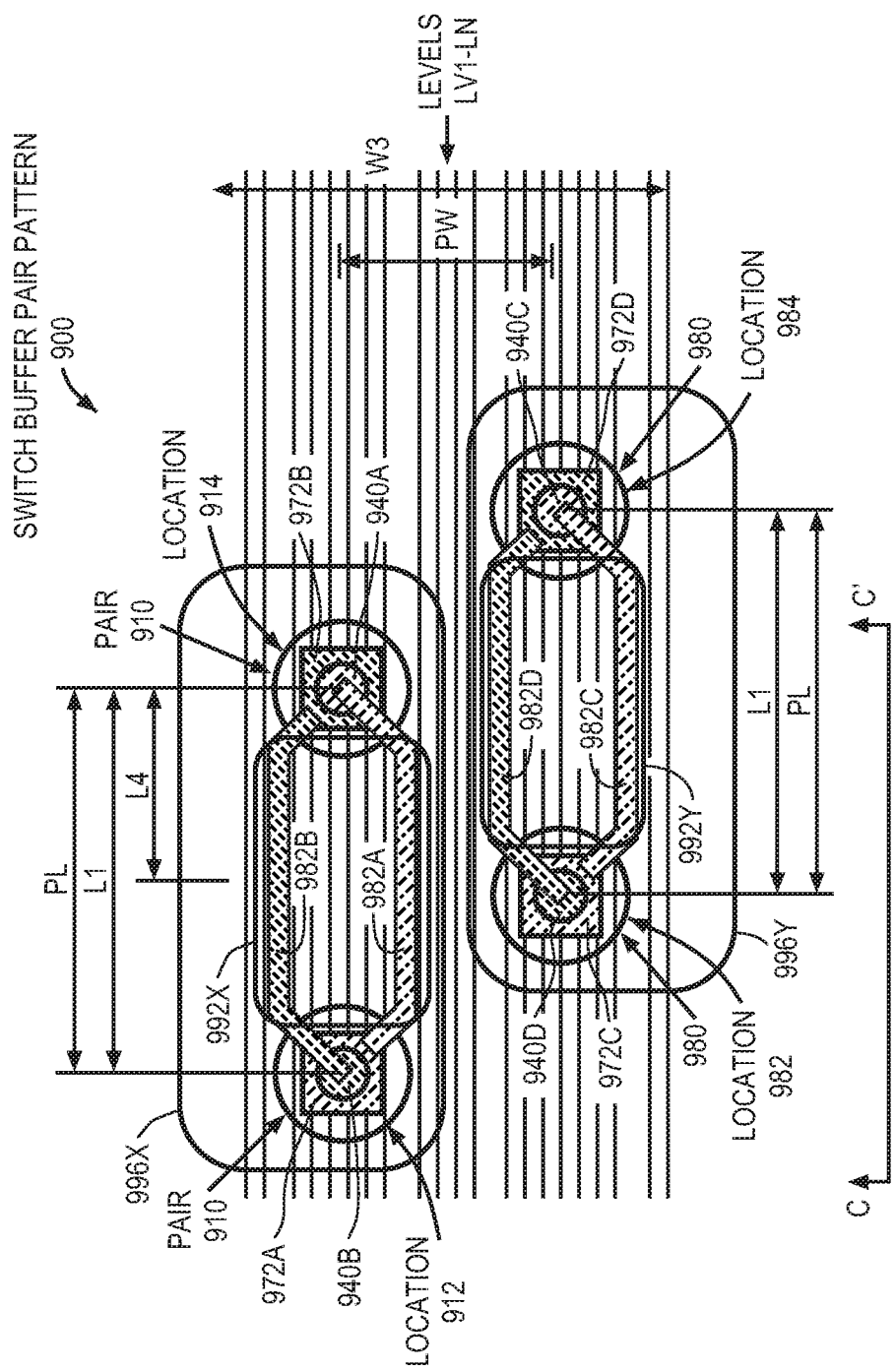
FIG. 9A shows a cross-sectional bottom view of some patterns of 2 chip "on-die" interconnection feature zones, each having single surface contact pitch length switched buffer (SB) data signal LDW traces, according to embodiments.

FIG. 9A shows a cross-sectional bottom view of some patterns of 2 chip "on-die" interconnection feature zones, each having single surface contact pitch length switched buffer (SB) data signal LDW traces, according to embodiments. FIG. 9A shows a cross-sectional bottom view of pattern 900 having chip "on-die" interconnection feature zones 996X and 996Y with single surface contact X,Y pitch length (PL) switched buffer (SB) data signal LDW trace pairs 910 and 960 respectively. In some cases of pattern 900, length L1 is equal to length PL. Embodiment 900 shows the location of a transmit circuit (e.g., circuit 172) and transmit contact (e.g., contact 140) of 2 data signal LWD traces have been switched, reversed, or otherwise had their locations exchanged in zone 996X and 996Y.

Pattern 900 is shown having first chip "on-die" interconnection feature zone 996X which includes zone 992X and first switch buffer (SB) pair 910. SB pair 910 may be or include a SB pair of data signal transmit (or receive) circuits. In some cases, SB pair 910 also includes a switched buffer (SB) pair of surface bump contacts. SB pair 910 may describe a "single pitch" or "1-pitch" SB data signal LDW trace embodiment of chip on-die interconnect features (e.g., where length L1 is equal to length PL).

Pair 910 may include signal data LDW trace 982A physically and electronically coupling transmit circuitry 972A (on the left of zone 996X) to transmit contact 940A (on the right of the zone 996X). Pair 910 may also include signal data LDW trace 982B physically and electronically coupling transmit circuitry 972B (on the right of zone 996X) to transmit contact 940B (on the left of the zone 996X). In some cases, such transmit contacts 940A and B may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW trace 982A or B physically and electronically coupling transmit circuitry 972A or B to transmit contact 940A or B may be part of a channel 176 or 176B, such as described for transmit contacts 140 or receive contacts 130 as described for FIGS. 1-8. In some cases, such a channel includes having transmit contact 940A or B physically and electronically coupled to corresponding surface contact at a location of a package (e.g., package 110) using solder bumps (e.g., bumps 118 or 119), such as described for transmit contacts 140 or receive contacts 130 as described for FIGS. 1-8.

In some cases, such a channel includes a channel from (e.g., between) circuit 972A or B of chip 108 and through zone 996X on chip 108, bumps 118, traces 133, traces 135, traces 137, bumps 119, and to zone 198 on chip 109 to circuit 174 of chip 109. In some cases, such a channel includes a channel from (e.g., between) circuit 172 of chip 108 and through zone 196 on chip 108, bumps 118, traces 133, traces 135, traces 137, bumps 119, and to zone 996X on chip 109 to circuit 974A or B (e.g., represented by 972A or B and functioning like 174) of chip 109 (e.g., see FIG. 9B). In some cases, such a channel includes a channel from (e.g., between) circuit 972A or B of chip 108 and through zone 996X on chip 108, bumps 118, traces 133, traces 135, traces 137, bumps 119, and to zone 996X on chip 109 to circuit 974A or B (e.g., represented by 972A or B and functioning like 174) of chip 109 (e.g., see FIG. 9B).

FIG. 9A may show a cross-sectional "bottom" or upward looking view such as shown for FIGS. 1 and 5B that includes vertical level LV1 (e.g., an exposed surface of bottommost level LV1 of zone 996X representing surface 203 of zone 196 and/or surface 303 of zone 198); vertical level LV2 (or LSML); vertical level LM and vertical level LN. In some cases, contacts 940A-B are on level LV1, traces 982A-B are on level LV2 (or LSML), and circuits 972A-B are on level LN (e.g., such as shown for corresponding contacts 140, traces 182 and circuits 172 of FIGS. 2A and 5).

In some cases, level LSML is an LV2 or LSML level that is the level directly above (e.g., having level LV1 formed onto and touching level LSML) and closest to exposed bottom surface 203 or 303). In this case, levels LSML (e.g., LV2) is vertically disposed in between level LV1 and LM (e.g., such as shown for corresponding levels of FIGS. 2-3 and 5).

It is also considered that one or both of trace pairs 982A-B and 982C-D may be on level LV3 (e.g., LSML-1) (and the other traces on level LV2), such as described above for level LV2.

In some cases, contact 940A is on level LV1, at the same horizontal X,Y location 914 as circuit 972B which is on level LN and disposed above contact 940A at the same horizontal X,Y location 914. Also, in some cases, contact 940B is on level LV1, at the same horizontal X,Y location 912 as circuit 972A which is on level LN and disposed above contact 940B at the same horizontal X,Y location 912.

In some cases, having contact 940A and circuit 972B at the same horizontal X,Y location 914; and having contact 940B and circuit 972A at the same and different horizontal X,Y location 912 may be described as switching, reversing, or otherwise exchanging the locations of a data signal transmit (or receive) circuit (e.g., circuit 972A and B) and of a transmit (or receive) contact (e.g., contact 940B and A) of (e.g., coupled by) 2 data signal LWD traces.

FIG. 9A represents isolation LDW traces and other structures of levels LV1-LN (e.g., as described herein, such as with respect to FIGS. 1-5) with the shading or lines (e.g., green colored lines) indicated by the label "Levels LV1-LN".

In some cases, zones 996X and 992X may include isolation LDW traces isolating traces 982A and 982B from horizontally adjacent (e.g., on the same level such as level LV2/LSML) data signal traces (including any adjacent ones of traces 982A, 982B, 982C and 982D), such as described for isolation LDW traces 184 (e.g., and 184G and 184P) as described for FIGS. 1-8. These isolation LDW traces may be show in FIG. 9A as green lengthwise lines or shading between the signal LDW traces 1082A, 1082B, 1682A and 1682B. Such isolation LDW traces may extend parallel to and between trace 982A and 982B thus electronically isolating (e.g., data signals transmitted on, when zone 996X represents zone 192; or data signals received on, when zone 996X represents zone 194) horizontally adjacent pair of data signal LDW trace 982A from trace 982B (e.g., as described herein). In some cases, such isolation LDW traces may also electronically isolate horizontally adjacent pair of data signal LDW trace 982B from trace 982A. In some cases, more isolation LDW traces may extend parallel to and between each of traces 982A and 982B, and another horizontally adjacent data signal LDW trace to shield each of traces 982A and 982B from the other horizontally adjacent data signal LDW traces.

In some cases, such isolation LDW traces may also be physically and electronically coupled to isolation signal traces and surface contacts, such as described for isolation traces 272 and 274 (e.g., and 272G or P; and 274G or P) and contacts 120 (e.g., and 120G or P) as described for FIGS. 1-8. In some cases, such isolation surface contacts may be physically and electronically coupled to corresponding isolation contacts of a package using solder bumps (e.g., bumps 118 or 119), such as described for isolation contacts 120 (e.g., and 120G or P) as described for FIGS. 1-8.

Although not show in FIG. 9A, for cases when zone 996X represents zone 192 of chip 108, it can be appreciated that in some cases, zone 996X may include (1) structure (e.g., one or more via contacts on level LM) vertically attaching one end of traces 982A and 982B to transmit circuitry 972A and 972B, respectively; and (2) structure (e.g., one or more via contacts on level LV1) vertically attaching the opposing end of traces 982A and 982B to transmit contacts 940A and 940B, respectively, such as described for vertically attaching trace 182 to transmit circuitry 172 and to transmit contact 140 as described for FIGS. 1-8 (e.g., see FIGS. 2A and 5). Although not show in FIG. 9A, (1) via contacts similar to 242 and 342 (e.g., a via contact on level LM) may physically, vertically attach (e.g., so they are touching) one end of traces 982A and 982B to transmit circuitry 972A and 972B, respectively; and (2) via contacts similar to 252 and 352 (e.g., a via contact on level LV1) may physically, vertically attach a second end of traces 982A and 982B to transmit contacts 940A and 940B, respectively, such as described for vertically attaching trace 182 to transmit circuitry 172 and to transmit contact 140 as described for FIGS. 2A and 5.

Figure 9B:
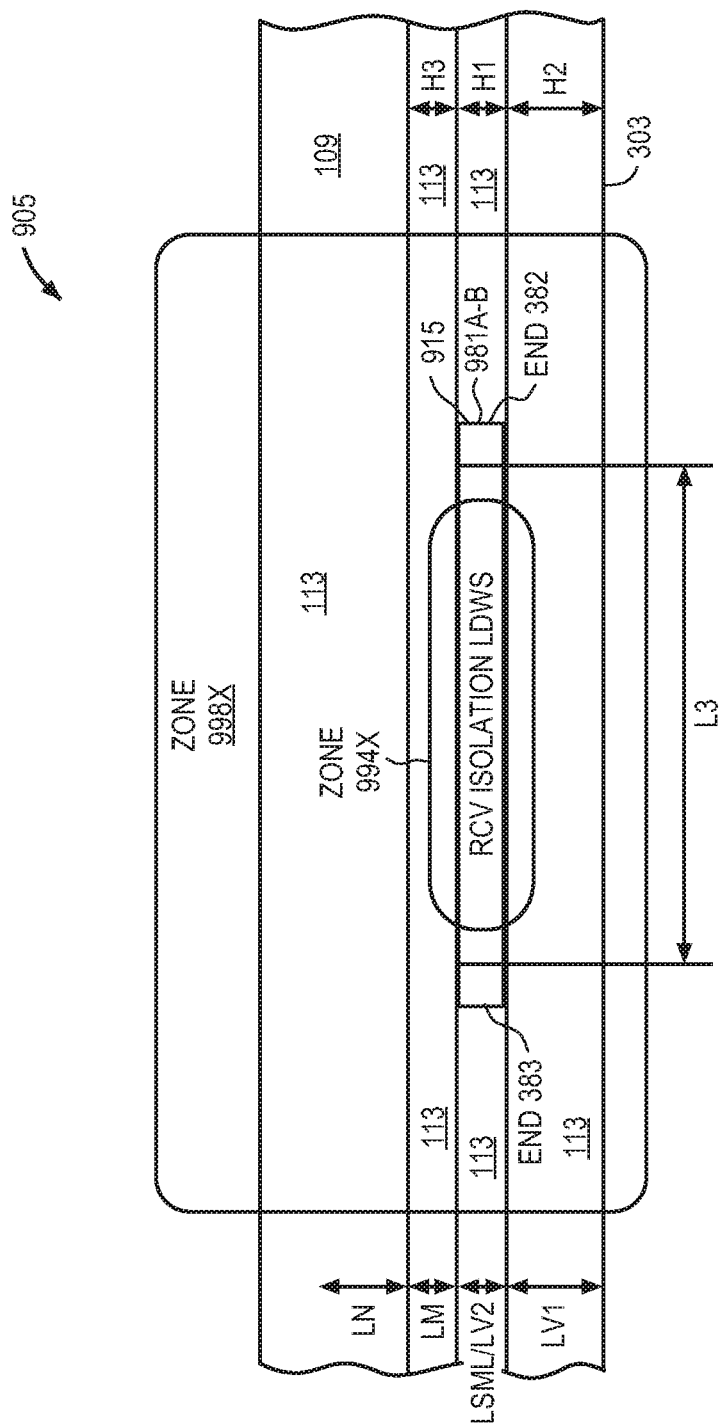
FIG. 9B shows a cross-sectional side view of some patterns of 2 chip "on-die" interconnection feature zones, each having single surface contact pitch length switched buffer (SB) data signal LDW traces, according to embodiments.

FIG. 9B shows a cross-sectional side view of some patterns of 2 chip "on-die" interconnection feature zones, each having single surface contact pitch length switched buffer (SB) data signal LDW traces, according to embodiments. The side view of FIG. 9B may be similar to that through perspective C-C' shown in FIG. 9A for an embodiment of a SB receive data signal LDW trace pair (e.g., as explained for FIG. 9A).

FIG. 9B shows a cross-sectional side view of a receive data signal LDW trace pattern 905 similar to pattern 900 having chip "on-die" interconnection feature zones 998X and 994X with single surface contact X,Y pitch length (PL) switched buffer (SB) receive data signal LDW trace pair 915 (e.g., traces 981A-B) similar to pair 910 for chip 109 for an embodiment of a SB receive data signal LDW trace pair (e.g., as explained for FIG. 9A). In some cases, length L3 is equal to length PL.

Pattern 905 does not show the location of the two receive circuits (e.g., circuits 974A-B, located similar to 972A-B of FIG. 9A and functioning similar to circuit 174) or of the two receive contacts (e.g., contacts 930A-B, located similar to 940A-B of FIG. 9A and functioning similar to contact 130). The locations of receive circuits 974A-B and contacts 930A-B of 2 data signal LWD traces 981A-B of FIG. 9B have been switched, reversed, or otherwise had their locations exchanged in zone 998X and 994X, similar to the description for circuits 972A-B and contacts 940A-B of FIG. 9A.

SB pair 915 may describe a "single pitch" or "1-pitch" SB data signal LDW trace embodiment of chip on-die interconnect features (e.g., where length L1 is equal to length PL). Pair 915 may include signal data LDW trace 981A physically and electronically coupling receive circuitry 974A (not shown but on the left end of trace 981A and on the left of zone 998X) to receive contact 930A (not shown but on the right end of trace 981A and on the right of the zone 998X). Pair 915 may also include signal data LDW trace 981B physically and electronically coupling receive circuitry 974B (not shown but on the right end of trace 981B and on the right of zone 998X) to receive contact 930B (not shown but on the left end of trace 981B and on the left of the zone 998X). In some cases, such receive contacts 930A and B may be physically and electronically coupled to corresponding transmit contacts at a location of a package (e.g., package 110) using solder bumps (e.g., bumps 119), such as described for transmit contacts 130 as described for FIGS. 1-9A. Pair 915 (e.g., traces 981A-B) may be on level LSML or LV2; and have height H1 and length L3. In some cases, length L3 is the same length as described for embodiments of length L1.

In some cases, isolated signal data LDW trace 981A or B physically and electronically coupling receive circuitry 974A or B to receive contact 930A or B may be part of a channel 176 or 176B, such as described for receive contacts 130 as described for FIGS. 1-9A. In some cases, such a channel includes a channel from (e.g., between) circuit 972A or B of chip 108 and through zone 996X on chip 108, bumps 118, traces 133, traces 135, traces 137, bumps 119, and to zone 998X on chip 109 to circuit 974A-B of chip 109. In some cases, such a channel includes a channel from (e.g., between) circuit 172 of chip 108 and through zone 196 on chip 108, bumps 118, traces 133, traces 135, traces 137, bumps 119, and to zone 996X on chip 109 to circuit 974A or B of chip 109.

FIG. 9B shows a case when zone 994X represents zone 194 of chip 109 and may include (1) structure (e.g., one or more via contacts on level LM) vertically attaching one end of traces 981A and 981B to receive circuitry 974A-B (e.g., represented by 972A and 972B in FIG. 9A, respectively); and (2) structure (e.g., one or more via contacts on level LV1) vertically attaching the opposing end of traces 981A and 981B to receive contacts 930A-B (e.g., represented by 940A and 940B in FIG. 9A, respectively), such as described for vertically attaching trace 181 to receive circuitry 174 and to receive contact 130 as described for FIGS. 1-9A (e.g., see FIGS. 3A and 5). Although not show in FIG. 9A, (1) via contacts similar to 244 and 344 (e.g., a via contact on level LM) may physically, vertically attach (e.g., so they are touching) one end (e.g., end 383 or 382, respectively) of traces 981A and 981B to receive circuitry 974A-B (e.g., represented by 972A and 972B in FIG. 9A, respectively); and (2) via contacts similar to 254 and 354 (e.g., a via contact on level LV1) may physically, vertically attach a second end (e.g., end 382 or 383, respectively) of traces 982A and 982B to receive contacts 930A-B (e.g., represented by 940A and 940B in FIG. 9A, respectively), such as described for vertically attaching trace 181 receive circuitry 174 and to receive contact 130 as described for FIGS. 3A, 5 and 9A.

Trace 982A and 982B may each also be "isolated" data signal LDW traces that are electronically isolated or shielded from adjacent data signal LDW traces on the same level (e.g., LV2 or LSML) by isolation LDW traces (represented by shading or green lines of FIG. 9A within width W3) such as described for traces 184 and 183 shielding traces 182 and 181 respectively.

Although not show in FIG. 9A-B, it can be appreciated that in some cases, zone 996X may include (1) structure (e.g., one or more via contacts such as 244 and/or 344 on level LM) vertically attaching one end of the isolation LDW traces to isolation traces and (2) structure (e.g., one or more via contacts such as 254 and/or 354 on level LV1) vertically attaching the opposing end of the isolation LDW traces to isolation contacts, such as described for vertically attaching trace 184 and/or 183 to isolation traces 272 and/or 274, and to isolation contacts 120 and/or 120, respectively as described for FIGS. 1-8 (e.g., see FIGS. 2B, 3B and 5).

Trace 982A and 982B may each have length L1, width W1 and height H1 such as described for trace 181 and 182. Zone 996X, or a number of zones 996X may extend widthwise across a portion of width W3 of a chip (e.g., such as chip 108 or 109).

According to embodiments, zone 996X may represent zone 196 or 198; and zone 992X may represent zone 192 or 194 (e.g., as described for FIGS. 1-8). Here, trace 982A may represent trace 182 or trace 181, physically and electronically attaching transmit circuitry 172 or receive circuitry 174 (on the left of zone 996X) to transmit contact 140 or receive contact 130, respectively (on the right of the zone 996X). In some cases, here, trace 982A may represent one of trace 182 or trace 181, physically and electronically attaching a transmit circuit or receive circuit 174 (on the right of zone 996X) to a transmit contact 140 or a receive contact 130, respectively (on the left of the zone 996X).

According to embodiments, zone 996X may represent zone 196 and 198; and zone 992X may represent zone 192 and 194 (e.g., as described for FIGS. 1-8). Here, trace 982A may be a representation of both trace 182 and trace 181, physically and electronically attaching transmit circuitry 172 and receive circuitry 174 (on the left of zone 996X) to transmit contact 140 and receive contact 130, respectively (on the right of the zone 996X). In some cases, here, trace 982A may represent both of trace 182 and trace 181, physically and electronically attaching a transmit circuit and receive circuit 174 (on the right of zone 996X) to a transmit contact 140 and a receive contact 130, respectively (on the left of the zone 996X).

According to embodiments, the two chips 108 and 109 will have corresponding X,Y lengthwise bump patters similar to pattern 900 so that the channel length of each location (e.g., of a contact 940A and 940B) is the same between the chips.

In some cases, pattern 900 has second chip "on-die" interconnection feature zone 996Y which includes zone 992Y for second switch buffer (SB) pair 980. In some cases, zone 996Y is widthwise adjacent to zone 996X along width W3. SB pair 980 may be or include a SB pair of data signal transmit (or receive) circuits similar to that described for zone 996X. In some cases, SB pair 980 also includes a switched buffer (SB) pair of surface bump contacts similar to that described for zone 996X. SB pair 980 may describe a "single pitch" or "1-pitch" SB data signal LDW trace embodiment of chip on-die interconnect features (e.g., where length L1 is equal to length PL) similar to that described for zone 996X.

Pair 980 may include signal data LDW trace 982C physically and electronically coupling transmit circuitry 972D (on the left of zone 996Y) to transmit contact 940D (on the right of the zone 996X). Pair 980 may also include signal data LDW trace 982D physically and electronically coupling transmit circuitry 972D (on the right of zone 996Y) to transmit contact 940D (on the left of the zone 996Y). In some cases, such transmit contacts 940C and D may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, pair 980 and zones 996Y and 992Y: (1) perform the same functions (e.g., for data signal LDW: traces, functions, transmission and receiving) as, (2) have the same dimensions (e.g., width and height) as, (3) have the same relative locations (e.g., length L1 is the same between location 982 and 984 as the length between location 912 and 914) as, (4) have the same length between data signal circuits and contacts (e.g., the length L1 of traces 982C and D are PL), have the same isolation (e.g., traces 982C and D are isolated by isolation LDW traces from other data signal LDW traces on the same level LV2 or LSML) as, (5) are located in the same chips (e.g., chip 108 and/or 109) as, (6) are in the same levels (e.g., surface contacts in level LV1, traces 982C and D in level LV2 or LSML, data circuits in level LN) as, (7) have the same additional via contacts (e.g., see FIGS. 2-3 and 5) as, (8) are part of channels similar and having lengths equal to (e.g., see channels 176 and 176B; and lengths CL and CL2) those of pair 190 and zones 996X and 992X, respectively.

In some cases, pair 980 and zones 996Y and 992Y are different than pair 190 and zones 996X and 992X, respectively because location 982 and 984 are X,Y offset widthwise by pitch width PW and offset lengthwise by half pitch length PL from locations 912 and 914, respectively.

In some cases, traces 982D and 982A (e.g., zones 996Y and 996X) are each also "isolated" data signal LDW traces that are electronically isolated or shielded from each other (represented by shading of figure within width W3) on the same level (e.g., LV2 or LSML) by isolation LDW traces (e.g., such as described for traces 184 and 183 shielding traces 182 and 181 respectively). In some cases, these isolation LDW traces may be one or more traces disposed widthwise between (e.g., along width W3, such as at a midpoint of pitch width PW) and extending lengthwise along where length L1 overlaps for traces 982D and 982A.

In some cases, there can be many SB pairs 910 and 980, such as on chip 108 or 109. According to embodiments, there can be many SB pairs 910 or 980 on chip 108 or 109, as there are pairs of 2 adjacent data signal LDW traces (e.g., pair of two of traces 182 or 181) on chip 108 or 109.

In some cases, the multiple SB pairs 910 and 980 on chip 108 or 109 can extend parallel to each other, X,Y lengthwise (e.g., along the direction of length L1) and are X,Y horizontally adjacent widthwise (e.g., along width W3). In some cases, the multiple SB pairs 910 and 980 on chip 108 or 109 can extend parallel to each other, lengthwise (e.g., along L1) and have X,Y pitch width PW horizontally between adjacent widthwise ones of SB pairs 910 and 980 (e.g., along width W3). In some cases, PW depends on the min center-to-center bump or surface contact pitch in this design. In some cases, PW between 110-130 um. In some cases, PW is between 79-103 um. In some cases, PW can be between 50-150 um.

In some cases, the multiple SB pairs 910 and 980 on chip 108 or 109 can extend parallel to each other, X,Y lengthwise (e.g., along L1); be horizontally adjacent X,Y widthwise (e.g., along width W3); and be offset X,Y lengthwise (e.g., have location 914 offset with respect to location 982 and/or 984 along direction of length L1) by length L4. In some cases, L4 may be ½ pitch length PL (and in this case ½ length L1). Such an offset may put one horizontal X,Y location 914 of a circuit and surface contact of a first SB pair 910 at the X,Y lengthwise midpoint between the two horizontal X,Y locations 982 and 984 of the circuits and surface contacts of a second SB pair 980. In some cases, the offset may be ⅕ length PL, ¼ length PL, or ⅓ pitch length PL. In some cases there may be no offset and the two horizontal X,Y locations of the circuits and surface contacts of both pair of SB pairs 910 and 980 are lengthwise aligned, and side by side along width W3.

Figure 10A:
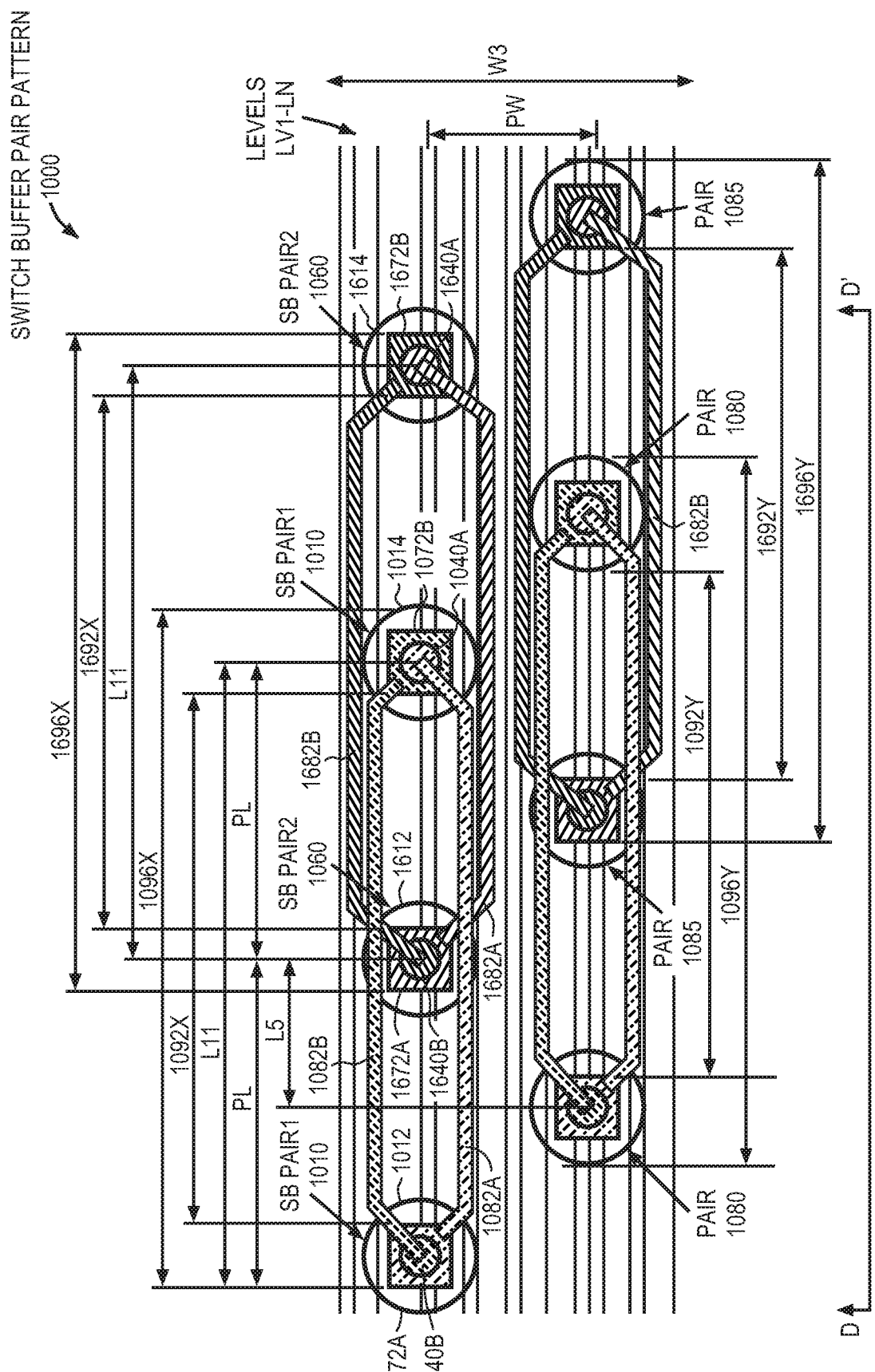
FIG. 10A shows a cross-sectional bottom view of some patterns of 4 chip "on-die" interconnection feature zones, each zone having double surface contact pitch length switched buffer (SB) data signal LDW traces, according to embodiments.

FIG. 10A shows a cross-sectional bottom view of some patterns of 4 chip "on-die" interconnection feature zones, each zone having double surface contact pitch length switched buffer (SB) data signal LDW traces, according to embodiments.

FIG. 10A shows a cross-sectional bottom view of pattern 1000 having chip "on-die" interconnection feature zones 1096X, 1696X, 1096Y and 1696Y with double surface contact pitch length (PL) switched buffer (SB) data signal LDW trace pairs. Zones 1096X and 1696X are shown having an "upper row" (e.g., located above pairs 1080 and 1085 along direction W3 in FIG. 10A) of double surface contact pitch length (PL) switched buffer (SB) data signal LDW trace pairs 1010 and 1060 respectively. In some cases, row of SB data signal LDW trace pairs 1010 and 1060 (1) extend in a lengthwise "row" of multiple SB data signal LDW trace pair along the direction of length L11, and are (2) at a single widthwise "column" of data signal LDW traces along width W3. In some cases, upper row of SB data signal LDW trace pairs 1010 and 1060, extend in a row at a column as noted, that are widthwise above zones 1096Y and 1696Y which are shown having a "lower row" of double surface contact PL SB data signal LDW trace pairs similar to "upper row" pairs 1010 and 1060 respectively, but in a lower "row" of pattern 1000 as shown. In some cases of pattern 1000, length L11 is equal to twice or 2× length PL. Embodiment 1000 may show the location of a transmit circuit (e.g., circuit 172) and transmit contact (e.g., contact 140) of 4 data signal LWD traces have been switched, reversed, or otherwise had their locations exchanged in zones 1096X+1696X and zones 1096Y+1696Y.

Pattern 1000 is shown having first chip "on-die" interconnection feature zone 1096X which includes zone 1092X and first switch buffer (SB) pair 1010. SB pair 1010 may be or include a SB pair of data signal transmit (or receive) circuits. In some cases, SB pair 1010 also includes a switched buffer (SB) pair of surface bump contacts. SB pair 1010 may describe a "double pitch" or "2×-pitch" SB data signal LDW trace embodiment of chip on-die interconnect features (e.g., where length L11 is equal to twice or 2× length PL).

Pair 1010 may include signal data LDW trace 1082A physically and electronically coupling transmit circuitry 1072A (on the left of zone 1096X) to transmit contact 1040A (on the right of the zone 1096X). Pair 1010 may also include signal data LDW trace 1082B physically and electronically coupling transmit circuitry 1072B (on the right of zone 1096X) to transmit contact 1040B (on the left of the zone 1096X). In some cases, such transmit contacts 1040A and B may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW trace 1082A or B physically and electronically coupling transmit circuitry 1072A or B to transmit contact 1040A or B may be part of a channel 176 or 176B, such as described for transmit contacts 140 or receive contacts 130 as described for FIGS. 1-8. In some cases, such a channel includes having transmit contact 1040A or B physically and electronically coupled to corresponding surface contact at a location of a package (e.g., package 110) using solder bumps (e.g., bumps 118 or 119), such as described for transmit contacts 140 or receive contacts 130 as described for FIGS. 1-8.

In some cases, such a channel includes a channel from (e.g., between) circuit 1072A or B of chip 108 and through zone 1096X on chip 108, bumps 118, traces 133, traces 135, traces 137, bumps 119, and to zone 198 on chip 109 to circuit 174 of chip 109. In some cases, such a channel includes a channel from (e.g., between) circuit 172 of chip 108 and through zone 196 on chip 108, bumps 118, traces 133, traces 135, traces 137, bumps 119, and to zone 1096X on chip 109 to circuit 1074A or B (e.g., represented by 1072A or B and functioning like 174) of chip 109 (e.g., see FIG. 10B). In some cases, such a channel includes a channel from (e.g., between) circuit 1072A or B of chip 108 and through zone 1096X on chip 108, bumps 118, traces 133, traces 135, traces 137, bumps 119, and to a zone 1096X on chip 109 to circuit 1074A or B (e.g., represented by 1072A or B and functioning like 174) of chip 109 (e.g., see FIG. 10B).

Pattern 1000 is shown also having second chip "on-die" interconnection feature zone 1696X which includes zone 1692X and second switch buffer (SB) pair 1060. SB pair 1060 may be or include a SB pair of data signal transmit (or receive) circuits. In some cases, SB pair 1060 also includes a switched buffer (SB) pair of surface bump contacts. SB pair 1060 may describe a "double pitch" or "2×-pitch" SB data signal LDW trace embodiment of chip on-die interconnect features (e.g., where length L1 is equal to twice or 2× length PL).

Pair 1060 may include signal data LDW trace 1682A physically and electronically coupling transmit circuitry 1672A (on the left of zone 1696X) to transmit contact 1640A (on the right of the zone 1696X). Pair 1060 may also include signal data LDW trace 1682B physically and electronically coupling transmit circuitry 1672B (on the right of zone 1696X) to transmit contact 1640B (on the left of the zone 1696X). In some cases, such transmit contacts 1640A and B may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW trace 1682A or B physically and electronically coupling transmit circuitry 1672A or B to transmit contact 1640A or B may be part of a channel 176 or 176B, such as described for transmit contacts 140 or receive contacts 130 as described for FIGS. 1-8. In some cases, such a channel includes having transmit contact 1640A or B physically and electronically coupled to corresponding surface contact at a location of a package (e.g., package 110) using solder bumps (e.g., bumps 118 or 119), such as described for transmit contacts 140 or receive contacts 130 as described for FIGS. 1-8.

In some cases, such a channel includes a channel from (e.g., between) circuit 1672A or B of chip 108 and through zone 1696X on chip 108, bumps 118, traces 133, traces 135, traces 137, bumps 119, and to zone 198 on chip 109 to circuit 174 of chip 109. In some cases, such a channel includes a channel from (e.g., between) circuit 172 of chip 108 and through zone 196 on chip 108, bumps 118, traces 133, traces 135, traces 137, bumps 119, and to zone 1696X on chip 109 to circuit 1674A or B (e.g., represented by 1672A or B and functioning like 174) of chip 109 (e.g., see FIG. 10B). In some cases, such a channel includes a channel from (e.g., between) circuit 1672A or B of chip 108 and through zone 1696X on chip 108, bumps 118, traces 133, traces 135, traces 137, bumps 119, and to zone 1696X on chip 109 to circuit 1674A or B (e.g., represented by 1672A or B and functioning like 174) of chip 109 (e.g., see FIG. 10B).

FIG. 10A may show a cross-sectional "bottom" or down looking view such as shown for FIGS. 1, 5B and 9A that includes (1) vertical level LV1 (e.g., an exposed surface of bottommost level LV1 of zones 1096X and 1696X representing surface 203 of zone 196 and/or surface 303 of zone 198); (2) vertical levels LV2 and LV3 (or LSML level and LSML-1 level); (3) vertical level LM and vertical level LN. In some cases, contacts 1040A-B and 1640A-B are on level LV1; traces 1082A-B and 1682A-B are on vertical levels LV2 and LV3 (LSML level and LSML-1 level); and circuits 1072A-B and 1672A-B are on level LN (e.g., such as shown for corresponding contacts 140, traces 182 and circuits 172 of FIGS. 2A and 5).

In some cases, level LSML is an LV2 or LSML level that is the level vertically directly above (e.g., having level LV1 formed onto and touching level LSML) and closest to exposed bottom surface 203 or 303); and levels LSML-1 is an LV3 (or LSML minus one level) level that is the level directly above (e.g., having level LV2 formed onto and touching level LSML-1) and closest to level LSML or LV2. In this case, levels LSML (e.g., LV2) and LSML-1 (e.g., LV3) are in between level LV1 and LM (e.g., such as shown for corresponding levels of FIGS. 2-3 and 5).

In some case, traces 1082A-B are on either vertical level LV2 or LV3 (LSML level or LSML-1 level) and traces 1682A-B of SB pair 1696X are also on either vertical level LV2 or LV3 (LSML level or LSML-1 level). In some case, traces 1082A-B are on one of vertical levels LV2 or LV3 (LSML level or LSML-1 level) because traces 1682A-B of SB pair 1696X are on a different one of either vertical level LV2 or LV3 (LSML level or LSML-1 level). In some cases, traces 1082A-B are on a different level of levels LV2 or LV3 (LSML level or LSML-1 level) because location 1662 of pair 1060 is located between locations 1012 and 1014 of pair 1010 so that traces 1082A-B can extend between locations 1012 and 1014 (e.g., from and between contact 1040A-B and circuit 1072A-B) without physically contacting traces 1682A-B (which would create an undesired electronic short between traces 1682A-B and traces 1082A-B). In some case, traces 1082A-B are on vertical level LV2 (LSML level) and traces 1682A-B of SB pair 1696X are on vertical level LV3 (LSML-1 level). In some case, traces 1682A-B are on vertical level LV2 (LSML level) and traces 1082A-B of SB pair 1096X are on vertical level LV3 (LSML-1 level).

It is also considered that either of traces 1082A-B or traces 1682A-B may be on level LV2 and the other traces on level LV4 (e.g., LSML-2), such as described above for levels LV2 and LV3.

In some cases, contact 1040A is on level LV1, at the same horizontal X,Y location 1014 as circuit 1072B which is on level LN and disposed vertically directly above contact 1040A at the same horizontal X,Y location 1014. Also, in some cases, contact 1040B is on level LV1, at the same horizontal X,Y location 1012 as circuit 1072A which is on level LN and disposed vertically above contact 1040B at the same horizontal X,Y location 1012.

In some cases, having contact 1040A and circuit 1072B at the same horizontal X,Y location 1014; and having contact 1040B and circuit 1072A at the same and different horizontal X,Y location 1012 may be described as switching, reversing, or otherwise exchanging the locations of a data signal transmit (or receive) circuit (e.g., circuit 1072A and B) and of a transmit (or receive) contact (e.g., contact 1040B and A) of (e.g., coupled by) 2 data signal LWD traces.

In some cases, contact 1640A is on level LV1, at the same horizontal X,Y location 1614 as circuit 1672B which is on level LN and disposed above contact 1640A at the same horizontal X,Y location 1614. Also, in some cases, contact 1640B is on level LV1, at the same horizontal X,Y location 1612 as circuit 1672A which is on level LN and disposed above contact 1640B at the same horizontal X,Y location 1612.

In some cases, having contact 1640A and circuit 1672B at the same horizontal X,Y location 1614; and having contact 1640B and circuit 1672A at the same and different horizontal X,Y location 1612 may be described as switching, reversing, or otherwise exchanging the locations of a data signal transmit (or receive) circuit (e.g., circuit 1672A and B) and of a transmit (or receive) contact (e.g., contact 1640B and A) of (e.g., coupled by) 2 data signal LWD traces.

In some case, horizontal X,Y location 1014 is X,Y lengthwise between (and lengthwise offset by pitch length PL) horizontal X,Y locations 1612 and 1614 of SB pair 1696X at the same widthwise X,Y location; and horizontal X,Y location 1612 is X,Y lengthwise between (and lengthwise offset by pitch length PL) horizontal X,Y locations 1012 and 1014 of SB pair 1096X at the same widthwise X,Y location. In some cases, SB pair 1010 and 1060 are two SB pair (e.g., pair 1010 and 1060) having lengthwise X,Y interleaved or alternating locations that are lengthwise offset by pitch length PL (e.g., of surface contacts and data signal circuits/buffers attached by data signal LDW traces) at the same widthwise X,Y location. In some cases, right side X,Y location 1014 of pair 1010 is lengthwise X,Y is interleaved or alternating with (e.g., and lengthwise offset by pitch length PL) locations 1612 and 1614 of pair 1060; and left side X,Y location 1614 of pair 1060 is lengthwise X,Y interleaved or alternating with (e.g., and lengthwise offset by pitch length PL) locations 1012 and 1014 of pair 1010. Such lengthwise X,Y interleaving or alternating may describe a "rung", "ladder", "zipper" or "switchback" or "zigzag" pattern (lengthwise offset by pitch length PL) of two upper SB pairs of surface contacts and data signal circuits/buffers locations (e.g., attached by data signal LDW traces).

FIG. 10A represents isolation LDW traces and other structures of levels LV1-LN (e.g., as described herein, such as with respect to FIGS. 1-5) with the shading or lines (e.g., green colored lines) indicated by the label "Levels LV1-LN".

In some cases, zones 1096X and 1696X may include isolation LDW traces isolating each of traces 1082A, 1082B, 1682A and 1682B from any (or all) horizontally adjacent (e.g., on the same level such as level LV2/LSML or level LV3/LSML-1) data signal traces (including any adjacent one of traces 1082A, 1082B, 1682A and 1682B), such as described for isolation LDW traces 184 (e.g., and 184G and 184P) as described for FIGS. 1-8. These isolation LDW traces may be show in FIG. 10 as green lengthwise lines or shading between the signal LDW traces 1082A, 1082B, 1682A and 1682B.

Such isolation LDW traces may extend parallel to and between traces 1082A, 1082B, 1682A and 1682B and any (or all) X,Y widthwise horizontally adjacent data signal LDW traces; thus electronically isolating (e.g., data signals transmitted on, when zones 1096X and 1696X represent zone 192; or data signals received on, when zones 1096X and 1696X represent zone 194) traces 1082A, 1082B, 1682A and 1682B from any (or all) X,Y widthwise horizontally adjacent data signal LDW traces (e.g., electronically isolating and shielding the data signal LDW traces as described herein). In some cases, such isolation LDW traces may also electronically isolate an X,Y widthwise horizontally adjacent data signal LDW trace from traces 1082A, 1082B, 1682A and 1682B. In some cases, more isolation LDW traces may extend parallel to and between each of traces 1082A, 1082B, 1682A and 1682B, and another widthwise horizontally adjacent data signal LDW trace to shield each of these traces from a lower pair of SB traces.

In some cases, such isolation LDW traces may also be physically and electronically coupled to isolation signal traces and surface contacts, such as described for isolation traces 272 and 274 (e.g., and 272G or P; and 274G or P) and contacts 120 (e.g., and 120G or P) as described for FIGS. 1-8. In some cases, such isolation surface contacts may be physically and electronically coupled to corresponding isolation contacts of a package using solder bumps (e.g., bumps 118 or 119), such as described for isolation contacts 120 (e.g., and 120G or P) as described for FIGS. 1-8.

Although not show in FIG. 10A, for cases when zones 1096X and 1696X represent zone 192 of chip 108, it can be appreciated that in some cases, zones 1096X and 1696X may include (1) structure (e.g., one or more via contacts on level LM) vertically attaching one end of traces 1082A-B and 1682A-B to transmit circuitry 1072A-B and 1672A-B, respectively; and (2) structure (e.g., one or more via contacts on level LV1) vertically attaching the opposing end of traces 1082A-B and 1682A-B to transmit contacts 1040A-B and 1640A-B, respectively, such as described for vertically attaching trace 182 to transmit circuitry 172 and to transmit contact 140 as described for FIGS. 1-9A (e.g., see FIGS. 2A, 5 and 9A). Although not show in FIG. 10A, (1) via contacts similar to 242 and 342 (e.g., a via contact on level LM) may physically, vertically attach (e.g., so they are touching) one end of traces 1082A-B and 1682A-B to transmit circuitry 1072A-B and 1672A-B, respectively; and (2) via contacts similar to 252 and 352 (e.g., a via contact on level LV1) may physically, vertically attach a second end of traces 1082A-B and 1682A-B to transmit contacts 1040A-B and 1640A-B, respectively, such as described for vertically attaching trace 182 to transmit circuitry 172 and to transmit contact 140 as described for FIGS. 2A, 5 and 9A.

Figure 10B:
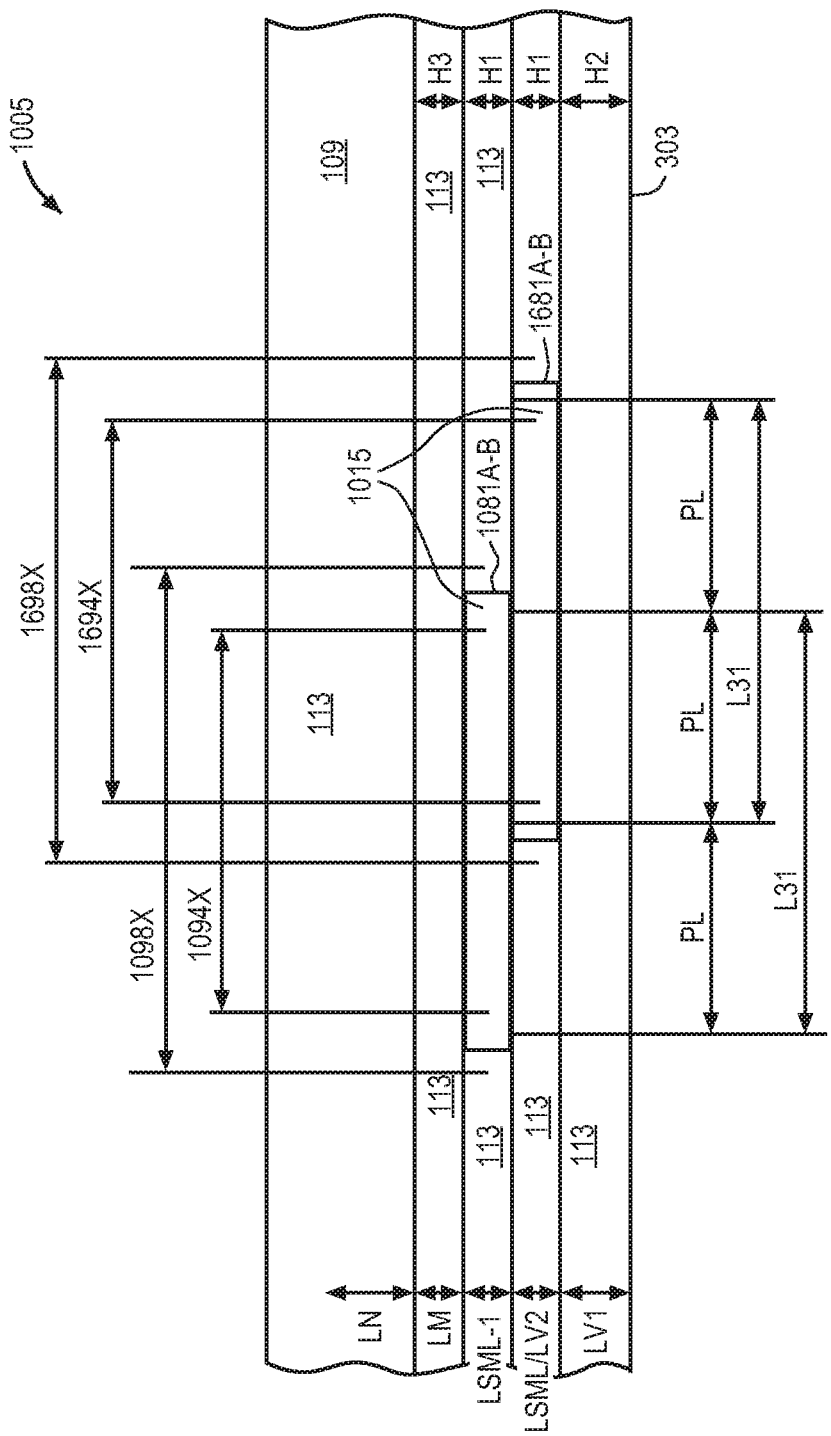
FIG. 10B shows a cross-sectional side view of some patterns of 4 chip "on-die" interconnection feature zones, each having double surface contact pitch length switched buffer (SB) data signal LDW traces, according to embodiments.

FIG. 10B shows a cross-sectional side view of some patterns of 4 chip "on-die" interconnection feature zones, each having double surface contact pitch length switched buffer (SB) data signal LDW traces, according to embodiments. The side view of FIG. 10B may be similar to that through perspective D-D' shown in FIG. 10A for an embodiment of a SB receive data signal LDW trace pair (e.g., as explained for FIG. 10A).

FIG. 10B shows a cross-sectional side view of a receive data signal LDW trace pattern 1005 similar to pattern 1000 having chip "on-die" interconnection feature zone 994X with double surface contact X,Y pitch length (PL) switched buffer (SB) receive data signal LDW trace pairs 1015 (e.g., traces 1081A-B and 1681A-B) similar to pairs 1010 and 1060 for chip 109 for an embodiment of a SB receive data signal LDW trace pair (e.g., as explained for FIG. 10A). In some cases, length L31 between the circuit and surface contact of each pair is equal to 2× length PL.

Pattern 1005 does not show the location of the 4 receive circuits (e.g., circuits 1074A-B and 1674A-B, located similar to 1072A-B and 1672A-B of FIG. 10A and functioning similar to circuit 174) or of the 4 receive contacts (e.g., contacts 1030A-B and 1630A-B, located similar to 1040A-B and 1640A-B of FIG. 10A and functioning similar to contact 130). The locations of receive circuits 1074A-B and 1674A-B and contacts 1030A-B and 1630A-B of the 4 data signal LWD traces 1081A-B and 1681A-B of FIG. 10B have been switched, reversed, or otherwise had their locations exchanged in zone 1094X, similar to the description for circuits 1072A-B and 1672A-B exchanged with contacts 1040A-B and 1640A-B of FIG. 10A.

SB pairs 1015 describe a "double pitch" or "2-pitch" SB data signal LDW trace embodiment of chip on-die interconnect features (e.g., where length L31 is equal to 2× length PL). Pairs 1015 may include signal data LDW trace 1081A physically and electronically coupling receive circuitry 1074A (not shown but on the left end of trace 1081A and on the left of zone 1094X) to receive contact 1030A (not shown but on the right end of trace 1081A and on the right of the zone 1094X). Pair 1015 may also include signal data LDW trace 1081B physically and electronically coupling receive circuitry 1074B (not shown but on the right end of trace 1081B and on the right of zone 1094X) to receive contact 1030B (not shown but on the left end of trace 1081B and on the left of the zone 1094X).

Pairs 1015 may include signal data LDW trace 1681A physically and electronically coupling receive circuitry 1674A (not shown but on the left end of trace 1681A and on the left of zone 1094X) to receive contact 1630A (not shown but on the right end of trace 1681A and on the right of the zone 1094X). Pairs 1015 may also include signal data LDW trace 1681B physically and electronically coupling receive circuitry 1674B (not shown but on the right end of trace 1081B and on the right of zone 1094X) to receive contact 1630B (not shown but on the left end of trace 1681B and on the left of the zone 1094X). In some cases, such receive contacts 1030A-B and 1630A-B may be physically and electronically coupled to corresponding transmit contacts at a location of a package (e.g., package 110) using solder bumps (e.g., bumps 119), such as described for transmit contacts 130 as described for FIGS. 1-10A.

Pairs 1015 (e.g., traces 1081A-B and 1681A-B) may be on levels LV2/LSML and LV3/LSML-1; and each trace may have height H1 and length L31. In some cases, traces 1081A-B are on level LV3/LSML-1 and traces 1681A-B are on level LV2/LSML (e.g., as shown). In another case, traces 1081A-B are on level LV2/LSML and traces 1681A-B are on level LV3/LSML-1 (e.g., not as shown). In some cases, length L31 is the same length as described for embodiments of length L11.

In some cases, each of isolated signal data LDW traces 1081A-B and 1681A-B physically and electronically coupling receive circuitry to a receive contact may be part of a channel 176 or 176B, such as described for receive contacts 130 as described for FIGS. 1-10A. In some cases, such channels include channels from (e.g., between) circuits 1072A-B and 1672A-B of chip 108 and through zone 1096X on chip 108, bumps 118, traces 133, traces 135, traces 137, bumps 119, and to zone 1094X on chip 109 to circuits 1074A-B and 1674A-B of chip 109. In some cases, such channels include channels from (e.g., between) circuits 172 of chip 108 and through zone 196 on chip 108, bumps 118, traces 133, traces 135, traces 137, bumps 119, and to 1094X on chip 109 to circuit 1074A-B and 1674A-B of chip 109.

In some cases zones 1096X and 1696X represent zone 194 of chip 109. FIG. 10B shows a case when zone 1094X represents zone 194 of chip 109 and may include (1) structure (e.g., one or more via contacts on level LM) vertically attaching one end of traces 1081A-B and 1681A-B to receive circuitry 1074A-B and 1674A-B (e.g., represented by 1072A-B and 1672A-B in FIG. 10A, respectively); and (2) structure (e.g., one or more via contacts on level LV1) vertically attaching the opposing end of traces 1081A-B and 1681A-B to receive contacts 1030A-B and 1630A-B (e.g., represented by 1040A-B and 1640A-B in FIG. 10A, respectively), such as described for vertically attaching trace 181 to receive circuitry 174 and to receive contact 130 as described for FIGS. 1-10A (e.g., see FIGS. 3A and 5). Although not show in FIG. 10A, (1) via contacts similar to 244 and 344 (e.g., a via contact on level LM) may physically, vertically attach (e.g., so they are touching) one end of traces 1081A-B and 1681A-B to receive circuitry 1074A-B and 1674A-B (e.g., represented by 1072A-B and 1672A-B in FIG. 10A, respectively); and (2) via contacts similar to 254 and 354 (e.g., a via contact on level LV1) may physically, vertically attach a second end of traces 1081A-B and 1681A-B to receive contacts 1030A-B and 1630A-B (e.g., represented by 1040A-B and 1640A-B in FIG. 10A, respectively), such as described for vertically attaching trace 181 receive circuitry 174 and to receive contact 130 as described for FIGS. 3A, 5 and 9-10A.

Trace 1082A, 1082B, 1682A and 1682B may each also be "isolated" data signal LDW traces that are electronically isolated or shielded from adjacent data signal LDW traces on the same level (e.g., LV2 or LSML; or LV3 or LSML-1) by isolation LDW traces (represented by shading or green lines of FIG. 10 within width W3) such as described for traces 184 and 183 shielding traces 182 and 181 respectively.

Although not show in FIG. 10A-B, it can be appreciated that in some cases, zones 1096X and 1696X may include (1) structure (e.g., one or more via contacts such as 244 and/or 344 on level LM) vertically attaching one end of the isolation LDW traces to isolation traces; and (2) structure (e.g., one or more via contacts such as 254 and/or 354 on level LV1) vertically attaching the opposing end of the isolation LDW traces to isolation contacts, such as described for vertically attaching trace 184 and/or 183 to isolation traces 272 and/or 274, and to isolation contacts 120 and/or 120, respectively as described for FIGS. 1-8 (e.g., see FIGS. 2B, 3B and 5).

Traces 1082A, 1082B, 1682A and 1682B may each have length L11=twice length L1, width W1 and height H1 such as described for trace 181 and 182. Zones 1096X and 1696X, or a number of zones 1096X and 1696X may extend widthwise across a portion of width W3 of a chip (e.g., such as chip 108 or 109).

According to embodiments, zones 1096X and 1696X may represent zone 196 or 198; and zones 1092X and 1696X may represent zone 192 or 194 (e.g., as described for FIGS. 1-8). Here, each of trace 1082A and 1682A may represent one of trace 182 or trace 181, physically and electronically attaching transmit circuitry 172 or receive circuitry 174 (on the left of zone 1096X and 1696X) to transmit contact 140 or receive contact 130, respectively (on the right of the zone 1096X and 1696X). In some cases, here, each of trace 1082A and 1682A may represent one of trace 182 or trace 181, physically and electronically attaching a transmit circuit or receive circuit 174 (on the right of zone 1096X and 1696X) to a transmit contact 140 or a receive contact 130, respectively (on the left of the zone 1096X and 1696X).

According to embodiments, zones 1096X and 1696X may represent zone 196 and 198; and zones 1092X and 16962 may represent zone 192 and 194 (e.g., as described for FIGS. 1-8). Here, each of trace 1082A and 1682A may represent both of trace 182 and trace 181, physically and electronically attaching transmit circuitry 172 and receive circuitry 174 (on the left of zone 1096X and 1696X) to transmit contact 140 and receive contact 130, respectively (on the right of the zone 1096X and 1696X). In some cases, here, each of trace 1082A and 1682A may represent both of trace 182 and trace 181, physically and electronically attaching a transmit circuit and receive circuit 174 (on the right of zone 1096X and 1696X) to a transmit contact 140 and a receive contact 130, respectively (on the left of the zone 1096X and 1696X). According to embodiments, the two chips 108 and 109 will have corresponding X,Y lengthwise bump patters similar to pattern 1000 so that the channel length of each location (e.g., of a contact 1040A, 1040B, 1640A and 1640B) is the same between the chips.

In some cases, each of pair 1010 and 1060: (1) perform the same functions (e.g., for data signal LDW: traces, functions, transmission and receiving) as, (2) have the same dimensions (e.g., width and height) as, are located in the same chips (e.g., chip 108 and/or 109) as, have the same additional via contacts (e.g., see FIGS. 2-3 and 5) as those of pair 910.

In some cases, each of pair 1010 and 1060 are different than pair 910 because: (1) locations 1012-1014 and 1612-1614 have relative locations twice as far apart (e.g., length L11 is twice the length as that between location 912 and 914), (2) circuits 1072A-B and contacts 1040A-B have twice the length between locations of data signal circuits and contacts (e.g., the length L11 of traces 1082A-B and 1682A-B is twice or 2×PL), (3) more isolation LDW traces are used to isolate traces 1082A-B and 1682A-B from other data signal LDW traces (e.g., on the same level LV2 or LSML, and LV3 or LSML-1), (4) more levels are used (e.g., surface contacts in level LV1; traces 1082A-B and 1682A-B in levels LV2 or LSML, and LV3 or LSML-1; data circuits in level LN), are part of channels similar to but have longer channel lengths by length 2×PL (e.g., see channel 176 and channel 176B but using length L11 in place of L1; and lengths CL plus length 2×PL, and CL2 plus length 1×PL, respectively). In some cases, embodiments having pair 1010 and 1060 on chip 108 and 109 will have channel 176 with channel length increased from length CL by length 1×PL on chip 108, plus length 1×PL on chip 109. In some cases, embodiments having pair 1010 and 1060 on chip 108 or 109 will have channel 176 with channel length increased from length CL2 by length 1×PL on chip 108 or on chip 109.

In some cases, pattern 1000 has third chip "on-die" interconnection feature zone 1096Y which includes zone 1092Y for a third switch buffer (SB) pair 1080. In some cases, zone 1096Y is widthwise adjacent to zone 1096X along width W3. SB pair 1080 may be or include a SB pair of data signal transmit (or receive) circuits similar to that described for zone 1096X. In some cases, SB pair 1080 also includes a switched buffer (SB) pair of surface bump contacts similar to that described for zone 1096X. SB pair 1080 may describe a "double pitch" or "2×-pitch" SB data signal LDW trace embodiment of chip on-die interconnect features (e.g., where length L11 is equal to twice or 2× length PL) similar to that described for zone 1096X.

Pair 1080 may include a signal data LDW trace (e.g., similar to trace 1082A) physically and electronically coupling transmit circuitry (e.g., similar to circuit 1072A) (on the left of zone 1096Y) to a transmit contact (e.g., similar to contact 1040A) (on the right of the zone 1096Y). Pair 1080 may also include signal data LDW trace (e.g., similar to trace 1082B) physically and electronically coupling transmit circuitry (e.g., similar to circuit 1072B) (on the right of zone 1096Y) to transmit contact (e.g., similar to contact 1040B) (on the left of the zone 1096Y). In some cases, such transmit contacts may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW traces of pair 1080 physically and electronically coupling transmit circuitry of pair 1080 to transmit contacts of pair 1080, may be part of a channel 176 or 176B, such as described for pair 1010 (e.g., and transmit contacts 140 or receive contacts 130 as described for FIGS. 1-8).

In some cases, pattern 1000 has fourth chip "on-die" interconnection feature zone 1696Y which includes zone 1692Y and fourth switch buffer (SB) pair 1085. In some cases, zone 1696Y is widthwise adjacent to zone 1696X along width W3. SB pair 1085 may be or include a SB pair of data signal transmit (or receive) circuits similar to that described for zone 1696X. In some cases, SB pair 1085 also includes a switched buffer (SB) pair of surface bump contacts similar to that described for zone 1696X. SB pair 1085 may describe a "double pitch" or "2×-pitch" SB data signal LDW trace embodiment of chip on-die interconnect features (e.g., where length L11 is equal to twice or 2× length PL) similar to that described for zone 1696X.

Pair 1085 may include a signal data LDW trace (e.g., similar to trace 1682A) physically and electronically coupling transmit circuitry (e.g., similar to circuit 1672A) (on the left of zone 1696Y) to a transmit contact (e.g., similar to contact 1640A) (on the right of the zone 1696Y). Pair 1085 may also include signal data LDW trace (e.g., similar to trace 1682B) physically and electronically coupling transmit circuitry (e.g., similar to circuit 1672B) (on the right of zone 1696Y) to transmit contact (e.g., similar to contact 1640B) (on the left of the zone 1696Y). In some cases, such transmit contacts may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW traces of pair 1085 physically and electronically coupling transmit circuitry of pair 1085 to transmit contacts of pair 1085, may be part of a channel 176 or 176B, such as described for pair 1060 (e.g., and transmit contacts 140 or receive contacts 130 as described for FIGS. 1-8).

In some cases, pair 1080 and 1085 (e.g., data signal circuits, contacts, data signal LDW traces, isolation LDW traces and locations (e.g., of surface contacts vertically below circuits/buffers)): (1) perform the same functions (e.g., for data signal LDW: traces, functions, transmission and receiving) as, have the same dimensions (e.g., width and height) as, (2) have the same relative locations (e.g., length L11 is the same length between data signal circuits and contacts, which is 2×PL) as, (3) have the same isolation (e.g., data signal LDW traces are isolated by isolation LDW traces from other data signal LDW traces on the same level LV2/LSML and level LV3/LSML-1) as, (4) are located in the same chips (e.g., chip 108 and/or 109) as, (5) are in the same levels (e.g., surface contacts in level LV1; data signal and isolation LDW traces in level LV2/LSML and level LV3/LSML-1; and data circuits in level LN) as, (6) have the same additional via contacts (e.g., see FIGS. 2-3 and 5) as, and are part of channels similar and having lengths equal to as, those of pair 1010 and 1065, respectively. In some cases, for embodiments having 1010 and 1065 (and 1080 and 1085) at chip 108 and/or 109 channel 176 has length CL=(2×L1+H41+L2+H51+2×L1), and channel 176B has length CL2=(H4+L2+H51+2×L1), where height H41 is equal to H4+H1 (e.g., height of the interleaved SB pair on level LV3) and height H51 is equal to H5+H1 (e.g., height of the interleaved SB pair on level LV3) (e.g., see FIGS. 2-3, 5 and 9A-10B).

In some cases, traces 1082A and 1682A (e.g., zones 1096X and 1696X) are each also "isolated" data signal LDW traces that are electronically isolated or shielded from data signal LDW traces of zones 1096Y and 1696Y (e.g., and vice versa) (represented by green lines or shading of figure within width W3) on the same level (e.g., LV2 or LSML; and level LV3 or LSML-1) by isolation LDW traces (e.g., such as described for traces 184 and 183 shielding traces 182 and 181 respectively).

In some cases, traces 1082A-B and 1682A-B (e.g., zones 1096X and 1696X) are each also "isolated" data signal LDW traces that are electronically isolated or shielded from all data signal LDW traces of zones 1096Y and 1696Y (e.g., and vice versa) (represented by green lines or shading of figure within width W3) on the levels LV2 or LSML; and level LV3 or LSML-1 by isolation LDW traces (e.g., such as described for traces 184 and 183 shielding traces 182 and 181 respectively).

In some cases, these isolation LDW traces may be one or more traces disposed widthwise between (e.g., along width W3, such as at a midpoint of pitch width PW) and extending lengthwise along where length L11 of pairs 1010 and 1060 overlap with length L11 of pairs 1080 and 1085.

In some cases, there can be many of SB pairs 1010, 1060, 1080 and 1085 on a chip, such as on chip 108 or 109. According to embodiments, there can be many SB pairs 1010, 1060, 1080 and 1085 on chip 108 or 109, as there are pairs of 2 adjacent data signal LDW traces (e.g., pairs of 2 traces 182 or 181) on chip 108 or 109.

In some cases, the multiple SB pairs 1010+1060 (e.g., the combination of pair 1010 interleaved with pair 1060) and 1080+1085 (e.g., the combination of pair 1080 interleaved with pair 1085) on chip 108 or 109 can extend parallel to each other, X,Y lengthwise (e.g., pair 1010+1060 parallel to pair 1080+1085 along the direction of length L11) and are X,Y horizontally adjacent widthwise (e.g., pair 1010+1060 horizontally adjacent to pair 1080+1085 along width W3). In some cases, the multiple SB pairs 1010+1060 and 1080+ 1085 on chip 108 or 109 can extend parallel to each other, lengthwise (e.g., along L11) and have X,Y pitch width PW horizontally between adjacent widthwise ones of SB pairs 1010+1060 and 1080+1085 (e.g., along width W3).

In some cases, the multiple SB pairs 1010+1060 and 1080+1085 on chip 108 or 109 can extend parallel to each other, X,Y lengthwise (e.g., along L11); be horizontally adjacent X,Y widthwise (e.g., along width W3); and be offset X,Y lengthwise (e.g., the location of a surface contact of 1010+1060 as compared to the location of a surface contact of pair 1080+1085 along direction of length L11) by length L5. In some cases, L5 may be ½ pitch length PL (and in this case ¼ length L11). Such an offset may put one horizontal X,Y location 1612 of a circuit and surface contact of a second SB pair 1060 at the X,Y lengthwise midpoint between the two horizontal X,Y locations (leftmost two) of the circuits and surface contacts of a third and fourth interleaved SB pair 1080+1085. In some cases, the offset length L5 may be ⅕ length PL, ¼ length PL, or ⅓ pitch length PL. In some cases there may be no offset and the two horizontal X,Y locations of the circuits and surface contacts of both pair of SB pairs 1010+1060 and 1080+1085 are lengthwise aligned, and side by side along width W3.

Figure 11A:
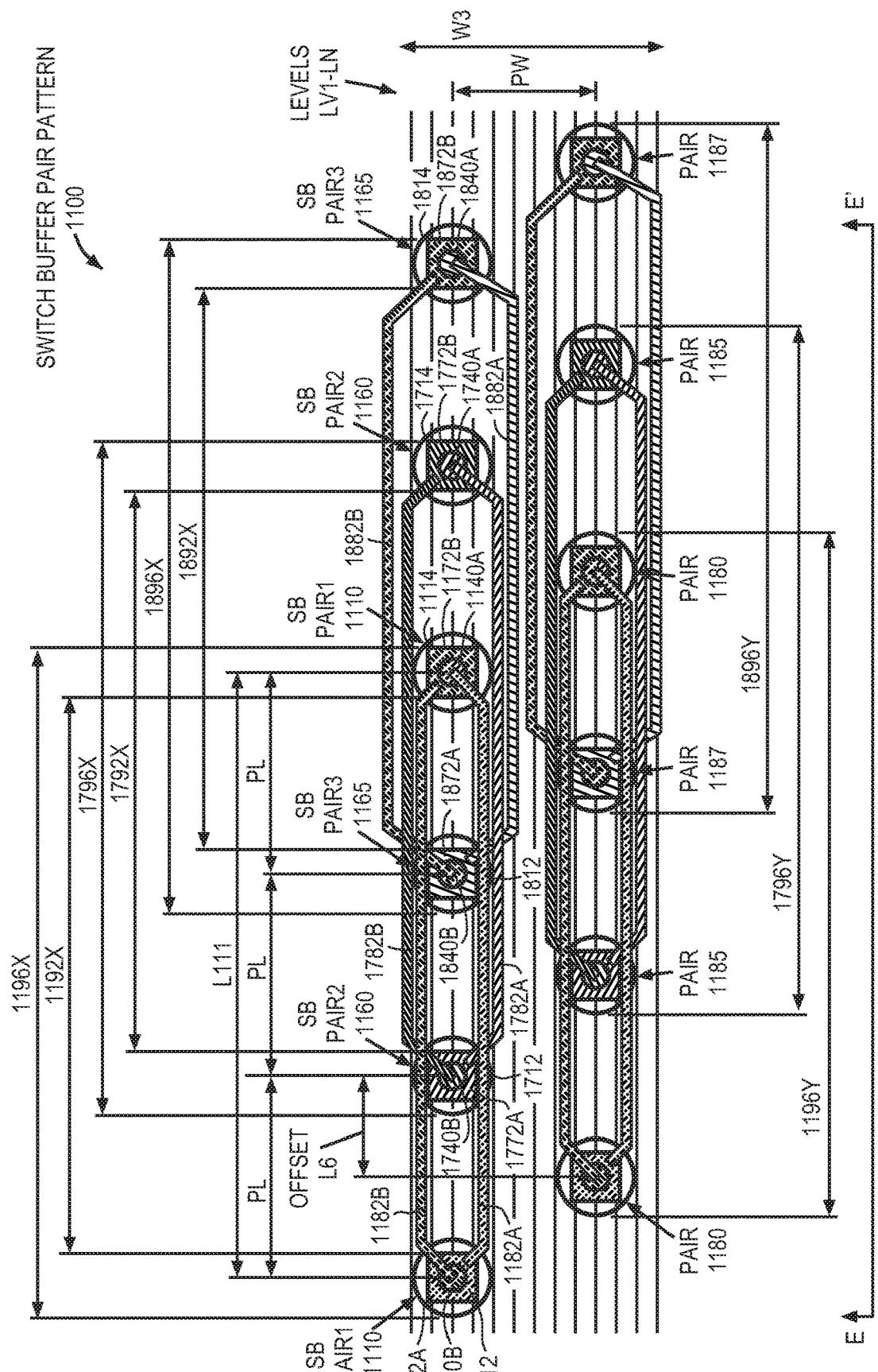
FIG. 11A shows a cross-sectional bottom view of some patterns of 6 chip "on-die" interconnection feature zones, each zone having triple surface contact pitch length switched buffer (SB) data signal LDW traces, according to embodiments.

FIG. 11A shows a cross-sectional bottom view of some patterns of 6 chip "on-die" interconnection feature zones, each zone having triple surface contact pitch length switched buffer (SB) data signal LDW traces, according to embodiments.

FIG. 11A shows a cross-sectional bottom view of pattern 1100 having chip "on-die" interconnection feature zones 1196X, 1796X, 1896X, 1196Y, 1796Y and 1896Y with triple surface contact pitch length (PL) switched buffer (SB) data signal LDW trace pairs 1110, 1160, 1165, 1180, 1185 and 1187, respectively. Zones 1196X, 1796X, and 1896X are shown having an "upper row" (e.g., located above pairs 1180, 1185 and 1187 along direction W3 in FIG. 11A) of triple surface contact pitch length (PL) switched buffer (SB) data signal LDW trace pairs 1110, 1160, and 1165 respectively. In some cases, row of SB data signal LDW trace pairs 1110, 1160, and 1165 (1) extend in a lengthwise "row" of multiple SB data signal LDW trace pair along the direction of length L111, and are (2) at a single widthwise "column" of data signal LDW traces along width W3. In some cases, upper row of SB data signal LDW trace pairs 1110, 1160, and 1165, extend in a row at a column as noted, that are widthwise above zones 1196Y, 1796Y and 1896Y which are shown having a "lower row" of triple surface contact PL SB data signal LDW trace pairs similar to "upper row" pairs 1110, 1160, and 1165 respectively, but in a lower "row" of pattern 1100 as shown. In some cases of pattern 1100, length L111 is equal to thrice or 3× solder bump surface contact pitch length PL. Embodiment 1100 may show the location of a transmit circuit (e.g., circuit 172) and transmit contact (e.g., contact 140) of 6 data signal LWD traces have been switched, reversed, or otherwise had their locations exchanged in zones 1196X+1796X+1896X and 1196Y+ 1796Y+1896Y.

Pattern 1100 is shown having first chip "on-die" interconnection feature zone 1196X which includes zone 1192X and first switch buffer (SB) pair 1110. SB pair 1110 may be or include a SB pair of data signal transmit (or receive) circuits. In some cases, SB pair 1110 also includes a switched buffer (SB) pair of surface bump contacts. SB pair 1110 may describe a "triple pitch" or "3×-pitch" SB data signal LDW trace embodiment of chip on-die interconnect features (e.g., where length L111 is equal to thrice or 3× length PL).

Pair 1110 may include signal data LDW trace 1182A physically and electronically coupling transmit circuitry 1172A (on the left of zone 1196X) to transmit contact 1140A (on the right of the zone 1196X). Pair 1110 may also include signal data LDW trace 1182B physically and electronically coupling transmit circuitry 1172B (on the right of zone 1196X) to transmit contact 1140B (on the left of the zone 1196X). In some cases, such transmit contacts 1140A and B may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW trace 1182A or B physically and electronically coupling transmit circuitry 1172A or B to transmit contact 1140A or B may be part of a channel 176 or 176B, such as described for transmit contacts 140 or receive contacts 130 as described for FIGS. 1-8. In some cases, such a channel includes having transmit contact 1140A or B physically and electronically coupled to corresponding surface contact at a location of a package (e.g., package 110) using solder bumps (e.g., bumps 118 or 119), such as described for transmit contacts 140 or receive contacts 130 as described for FIGS. 1-8.

In some cases, such a channel includes a channel from (e.g., between) circuit 1172A or B of chip 108 and through zone 1196X on chip 108, bumps 118, traces 133, traces 135, traces 137, bumps 119, and to zone 198 on chip 109 to circuit 174 of chip 109. In some cases, such a channel includes a channel from (e.g., between) circuit 172 of chip 108 and through zone 196 on chip 108, bumps 118, traces 133, traces 135, traces 137, bumps 119, and to zone 1196X on chip 109 to circuit 1174A or B (e.g., represented by 1172A or B and functioning like 174) of chip 109 (e.g., see FIG. 11B). In some cases, such a channel includes a channel from (e.g., between) circuit 1772A or B of chip 108 and through zone 1196X on chip 108, bumps 118, traces 133, traces 135, traces 137, bumps 119, and to a zone 1196X on chip 109 to circuit 1174A or B (e.g., represented by 1172A or B and functioning like 174) of chip 109 (e.g., see FIG. 11B).

Pattern 1100 is shown also having second chip "on-die" interconnection feature zone 1796X which includes zone 1792X and second switch buffer (SB) pair 1160. SB pair 1160 may be or include a SB pair of data signal transmit (or receive) circuits. In some cases, SB pair 1160 also includes a switched buffer (SB) pair of surface bump contacts. SB pair 1160 may describe a "double pitch" or "2×-pitch" SB data signal LDW trace embodiment of chip on-die interconnect features (e.g., where length L1 is equal to twice or 2× length PL).

Pair 1160 may include signal data LDW trace 1782A physically and electronically coupling transmit circuitry 1772A (on the left of zone 1796X) to transmit contact 1740A (on the right of the zone 1796X). Pair 1160 may also include signal data LDW trace 1782B physically and electronically coupling transmit circuitry 1772B (on the right of zone 1796X) to transmit contact 1740B (on the left of the zone 1796X). In some cases, such transmit contacts 1740A and B may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW trace 1782A or B physically and electronically coupling transmit circuitry 1772A or B to transmit contact 1740A or B may be part of a channel 176 or 176B, such as described for transmit contacts 140 or receive contacts 130 as described for FIGS. 1-8. In some cases, such a channel includes having transmit contact 1740A or B physically and electronically coupled to corresponding surface contact at a location of a package (e.g., package 110) using solder bumps (e.g., bumps 118 or 119), such as described for transmit contacts 140 or receive contacts 130 as described for FIGS. 1-8.

In some cases, such a channel includes a channel from (e.g., between) circuit 1772A or B of chip 108 and through zone 1796X on chip 108, bumps 118, traces 133, traces 135, traces 137, bumps 119, and to zone 198 on chip 109 to circuit 174 of chip 109. In some cases, such a channel includes a channel from (e.g., between) circuit 172 of chip 108 and through zone 196 on chip 108, bumps 118, traces 133, traces 135, traces 137, bumps 119, and to zone 1796X on chip 109 to circuit 1774A or B (e.g., represented by 1772A or B and functioning like 174) of chip 109 (e.g., see FIG. 11B). In some cases, such a channel includes a channel from (e.g., between) circuit 1772A or B of chip 108 and through zone 1796X on chip 108, bumps 118, traces 133, traces 135, traces 137, bumps 119, and to zone 1796X on chip 109 to circuit 1774A or B (e.g., represented by 1772A or B and functioning like 174) of chip 109 (e.g., see FIG. 11B).

Pattern 1100 is shown also having third chip "on-die" interconnection feature zone 1896X which includes zone 1892X and third switch buffer (SB) pair 1165. SB pair 1165 may be or include a SB pair of data signal transmit (or receive) circuits. In some cases, SB pair 1165 also includes a switched buffer (SB) pair of surface bump contacts. SB pair 1165 may describe a "double pitch" or "2×-pitch" SB data signal LDW trace embodiment of chip on-die interconnect features (e.g., where length L1 is equal to twice or 2× length PL).

Pair 1165 may include signal data LDW trace 1882A physically and electronically coupling transmit circuitry 1872A (on the left of zone 1896X) to transmit contact 1840A (on the right of the zone 1896X). Pair 1165 may also include signal data LDW trace 1882B physically and electronically coupling transmit circuitry 1872B (on the right of zone 1896X) to transmit contact 1840B (on the left of the zone 1896X). In some cases, such transmit contacts 1840A and B may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW trace 1882A or B physically and electronically coupling transmit circuitry 1872A or B to transmit contact 1840A or B may be part of a channel 176 or 176B, such as described for transmit contacts 140 or receive contacts 130 as described for FIGS. 1-8. In some cases, such a channel includes having transmit contact 1840A or B physically and electronically coupled to corresponding surface contact at a location of a package (e.g., package 110) using solder bumps (e.g., bumps 118 or 119), such as described for transmit contacts 140 or receive contacts 130 as described for FIGS. 1-8.

In some cases, such a channel includes a channel from (e.g., between) circuit 1872A or B of chip 108 and through zone 1896X on chip 108, bumps 118, traces 133, traces 135, traces 137, bumps 119, and to zone 198 on chip 109 to circuit 174 of chip 109. In some cases, such a channel includes a channel from (e.g., between) circuit 172 of chip 108 and through zone 196 on chip 108, bumps 118, traces 133, traces 135, traces 137, bumps 119, and to zone 1896X on chip 109 to circuit 1874A or B (e.g., represented by 1872A or B and functioning like 174) of chip 109 (e.g., see FIG. 11B). In some cases, such a channel includes a channel from (e.g., between) circuit 1872A or B of chip 108 and through zone 1896X on chip 108, bumps 118, traces 133, traces 135, traces 137, bumps 119, and to zone 1896X on chip 109 to circuit 1874A or B (e.g., represented by 1872A or B and functioning like 174) of chip 109 (e.g., see FIG. 11B).

FIG. 11A may show a cross-sectional "bottom" or upward looking view such as shown for FIGS. 1, 5B and 9-10 that includes (1) vertical level LV1 (e.g., an exposed surface of topmost level LV1 of zones 1196X, 1796X, and 1896X representing surface 203 of zone 196 and/or surface 303 of zone 198); (2) vertical levels LV2, LV3 and LV4 (or LSML level, LSML-1 level, and LSML-2 level); (3) vertical level LM and vertical level LN. In some cases, contacts 1140A-B, 1740A-B and 1840A-B are on level LV1; traces 1182A-B, 1782A-B and 1882A-B are on vertical levels LV2, LV3 and LV4 (LSML level, LSML-1 level, and LSML-2 level); and circuits 1172A-B, 1772A-B and 1872A-B are on level LN (e.g., such as shown for corresponding contacts 140, traces 182 and circuits 172 of FIGS. 2A and 5).

In some cases, level LSML-2 is an LV4 or (LSML minus two levels) level that is the level directly above (e.g., having level LV3 formed onto and touching level LSML-2) and closest to level LSML-1 or LV3. In this case, levels LSML (e.g., LV2), LSML-1 (e.g., LV3), and LSML-2 (e.g., LV4) are in between level LV1 and LM (e.g., such as shown for corresponding levels of FIGS. 2-3 and 5).

In some case, each pair of traces 1182A-B, 1782A-B and 1882A-B are on one of either vertical level LV2, LV3 or LV4 (e.g., one pair per level). In some cases, each pair of traces 1182A-B, 1782A-B and 1882A-B are on a different level of levels LV2, LV3 or LV4 because location 1812 of pair 1165 is located between locations 1112 and 1114 of pair 1110, and is located between locations 1712 and 1714 of pair 1160, so that traces 1882A-B can extend between locations 1812 and 1814 (e.g., from and between contact 1840A-B and circuit 1872A-B) without physically contacting traces 1182A-B or 1782A-B (which would create an undesired electronic short between traces 1882A-B and traces 1182A-B or 1782A-B).

In some case, each pair of traces 1182A-B, 1782A-B and 1882A-B are on a different level of levels LV2, LV3 or LV4, respectively as follows: LV2, LV3, LV4 (e.g., 1182A-B on LV2, 1782A-B on LV3, and 1882A-B on LV4); or LV2, LV4, LV3; or LV3, LV4, LV2; or LV3, LV2, LV4; or LV4, LV2, LV3; or LV4, LV3, LV2. In some case, each pair of traces 1182A-B, 1782A-B and 1882A-B are on a different level of levels LV2, LV3 or LV4, respectively as follows: LV2, LV3, LV4; or LV4, LV2, LV3; or LV3, LV4, LV2. In some case, each pair of traces 1182A-B, 1782A-B and 1882A-B are on a different level of levels LV2, LV3 or LV4, respectively as follows: LV2, LV3, LV4; or LV4, LV3, LV2.

It is also considered that one of pair of traces 1182A-B, 1782A-B and 1882A-B in the above level sequences may be removed from the sequence between Levels LV2-LV4 and may be on level LV5 (e.g., LSML-3), such as described above for levels LV2-LV4. In this case, none of the pairs is on the level that the pair on level LV5 was removed from.

In some cases, each corresponding contact and circuit of pairs 1140B+1172A (e.g., the pair of contact 1140B and circuit 1172A), 1140A+1172B, 1740B+1772A, 1740A+1772B, 1840B+1872A, and 1840A+1872B have a contact on level LV1, at the same horizontal X,Y location (e.g., locations 1112, 1114, 1712, 1714, 1812 and 1814 respectively) as the corresponding circuit which is on level LN and disposed vertically directly above the corresponding contact at the same horizontal X,Y location (e.g., as described for FIGS. 9-10).

In some cases, having one of (e.g., 1140B+1172A) corresponding contact and circuit of pairs 1140B+1172A and 1140A+1172B; or 1740B+1772A and 1740A+1772B; or 1840B+1872A and 1840A+1872B at a first same horizontal X,Y location, and having the second one of (e.g., 1140A+1172B) corresponding contact and circuit of those pairs at a same and different horizontal X,Y location may be described as switching, reversing, or otherwise exchanging the locations of a data signal transmit (or receive) circuit (e.g., circuit 1072A and B) and of a transmit (or receive) contact (e.g., contact 1040B and A) of (e.g., coupled by) 2 data signal LWD traces (e.g., as described for FIGS. 9-10).

In some case, horizontal X,Y location 1712 is X,Y lengthwise between (and lengthwise offset by pitch length PL) horizontal X,Y locations 1112 and 1812 at the same widthwise X,Y location; horizontal X,Y location 1812 is X,Y lengthwise between (and lengthwise offset by pitch length PL) horizontal X,Y locations 1712 and 1114 at the same widthwise X,Y location; and horizontal X,Y location 1114 is X,Y lengthwise between (and lengthwise offset by pitch length PL) horizontal X,Y locations 1812 and 1714 at the same widthwise X,Y location. In some cases, SB pair 1110, 1160 and 1165 are three SB pair having lengthwise X,Y interleaved or alternating locations that are lengthwise offset by pitch length PL (e.g., of surface contacts and data signal circuits/buffers attached by data signal LDW traces) at the same widthwise X,Y location. In some cases, right side X,Y location 1114 is lengthwise X,Y interleaved or alternating with (e.g., and lengthwise offset by pitch length PL) locations 1812 and 1714; and left side X,Y location 1812 is lengthwise X,Y interleaved or alternating with (e.g., and lengthwise offset by pitch length PL) locations 1712 and 1114. Such lengthwise X,Y interleaving or alternating may describe a "rung", "ladder", "zipper" or "switchback" or "zigzag" pattern (lengthwise offset by pitch length PL) of three upper SB pairs of surface contacts and data signal circuits/buffers locations (e.g., attached by data signal LDW traces).

FIG. 11A represents isolation LDW traces and other structures of levels LV1-LN (e.g., as described herein, such as with respect to FIGS. 1-5) with the shading or lines (e.g., green colored lines) indicated by the label "Levels LV1-LN".

In some cases, zones 1196X, 1796X and 1896X may include isolation LDW traces isolating each of traces 1182A-B, 1782A-B and 1882A-B from any (or all) horizontally adjacent (e.g., on the same level such as level LV2/LSML, level LV3/LSML-1, or level LV4/LSML-2) data signal traces (including any adjacent one of traces 1182A-B, 1782A-B and 1882A-B; and data signal LDW traces of pair 1180, 1185 and 1187), such as described for isolation LDW traces 184 (e.g., and 184G and 184P) as described for FIGS. 1-8. These isolation LDW traces may be show in FIG. 11A as green lengthwise lines or shading between the signal LDW traces 1182A-B, 1782A-B and 1882A-B; and data signal LDW traces of pair 1180, 1185 and 1187.

Such isolation LDW traces may extend parallel to and between each of traces 1182A-B, 1782A-B and 1882A-B and any (or all) X,Y widthwise horizontally adjacent data signal LDW traces; thus electronically isolating (e.g., data signals transmitted on, when zones 1196X, 1796X and 1896X represent zone 192; or data signals received on, when zones 1196X, 1796X and 1896X represent zone 194) traces 1182A-B, 1782A-B and 1882A-B from any (or all) X,Y widthwise horizontally adjacent data signal LDW traces (e.g., electronically isolating and shielding the data signal LDW traces as described herein). In some cases, such isolation LDW traces may also electronically isolate an X,Y widthwise horizontally adjacent data signal LDW trace from traces 1182A-B, 1782A-B and 1882A-B. In some cases, more isolation LDW traces may extend parallel to and between each of traces 1182A-B, 1782A-B and 1882A-B, and another widthwise horizontally adjacent data signal LDW trace to shield each of these traces from a lower pair of SB traces.

In some cases, such isolation LDW traces may also be physically and electronically coupled to isolation signal traces and surface contacts, such as described for isolation traces 272 and 274 (e.g., and 272G or P; and 274G or P) and contacts 120 (e.g., and 120G or P) as described for FIGS. 1-8. In some cases, such isolation surface contacts may be physically and electronically coupled to corresponding isolation contacts of a package using solder bumps (e.g., bumps 118 or 119), such as described for isolation contacts 120 (e.g., and 120G or P) as described for FIGS. 1-8.

Although not show in FIG. 11A, for cases when zones 1196X, 1796X and 1896X represent zone 192 of chip 108, it can be appreciated that in some cases, zones 1196X, 1796X and 1896X may include (1) structure (e.g., one or more via contacts on level LM) vertically attaching one end of traces 1182A-B, 1782A-B and 1882A-B to transmit circuitry 1172A-B, 1772A-B and 1872A-B, respectively; and (2) structure (e.g., one or more via contacts on level LV1) vertically attaching the opposing end of traces 1082A-B and 1682A-B to transmit contacts 1140A-B, 1740A-B and 1840A-B, respectively, such as described for vertically attaching trace 182 to transmit circuitry 172 and to transmit contact 140 as described for FIGS. 1-9 (e.g., see FIGS. 2A, 5 and 9). Although not show in FIG. 11A, (1) via contacts similar to 242 and 342 (e.g., a via contact on level LM) may physically, vertically attach (e.g., so they are touching) one end of traces 1182A-B, 1782A-B and 1882A-B to transmit circuitry 1172A-B, 1772A-B and 1872A-B, respectively; and (2) via contacts similar to 252 and 352 (e.g., a via contact on level LV1) may physically, vertically attach a second end of traces 1182A-B, 1782A-B and 1882A-B to transmit contacts 1140A-B, 1740A-B and 1840A-B, respectively, such as described for vertically attaching trace 182 to transmit circuitry 172 and to transmit contact 140 as described for FIGS. 2A, 5 and 9-10.

Although not show in FIG. 11A, for cases when zones 1196X, 1796X and 1896X represents zone 194 of chip 109, it can be appreciated that in some cases, zones 1196X, 1796X and 1896X may include (1) structure (e.g., one or more via contacts on level LM) vertically attaching one end of traces 1182A-B, 1782A-B and 1882A-B to receive circuitry (e.g., represented here by 1172A-B, 1772A-B and 1872A-B, respectively); and (2) structure (e.g., one or more via contacts on level LV1) vertically attaching the opposing end of traces 1182A-B, 1782A-B and 1882A-B to receive contacts (e.g., represented here by 1140A-B, 1740A-B and 1840A-B, respectively), such as described for vertically attaching trace 181 to receive circuitry 174 and to receive contact 130 as described for FIGS. 1-8 (e.g., see FIGS. 3A and 5). Although not show in FIG. 11A, (1) via contacts similar to 244 and 344 (e.g., a via contact on level LM) may physically, vertically attach (e.g., so they are touching) one end of traces 1182A-B, 1782A-B and 1882A-B to receive circuitry (e.g., represented here by 1172A-B, 1772A-B and 1872A-B, respectively); and (2) via contacts similar to 254 and 354 (e.g., a via contact on level LV1) may physically, vertically attach a second end of traces 1182A-B, 1782A-B and 1882A-B to receive contacts (e.g., represented here by 1140A-B, 1740A-B and 1840A-B, respectively) such as described for vertically attaching trace 181 receive circuitry 174 and to receive contact 130 as described for FIGS. 3A, 5 and 9-10.

Figure 11B:
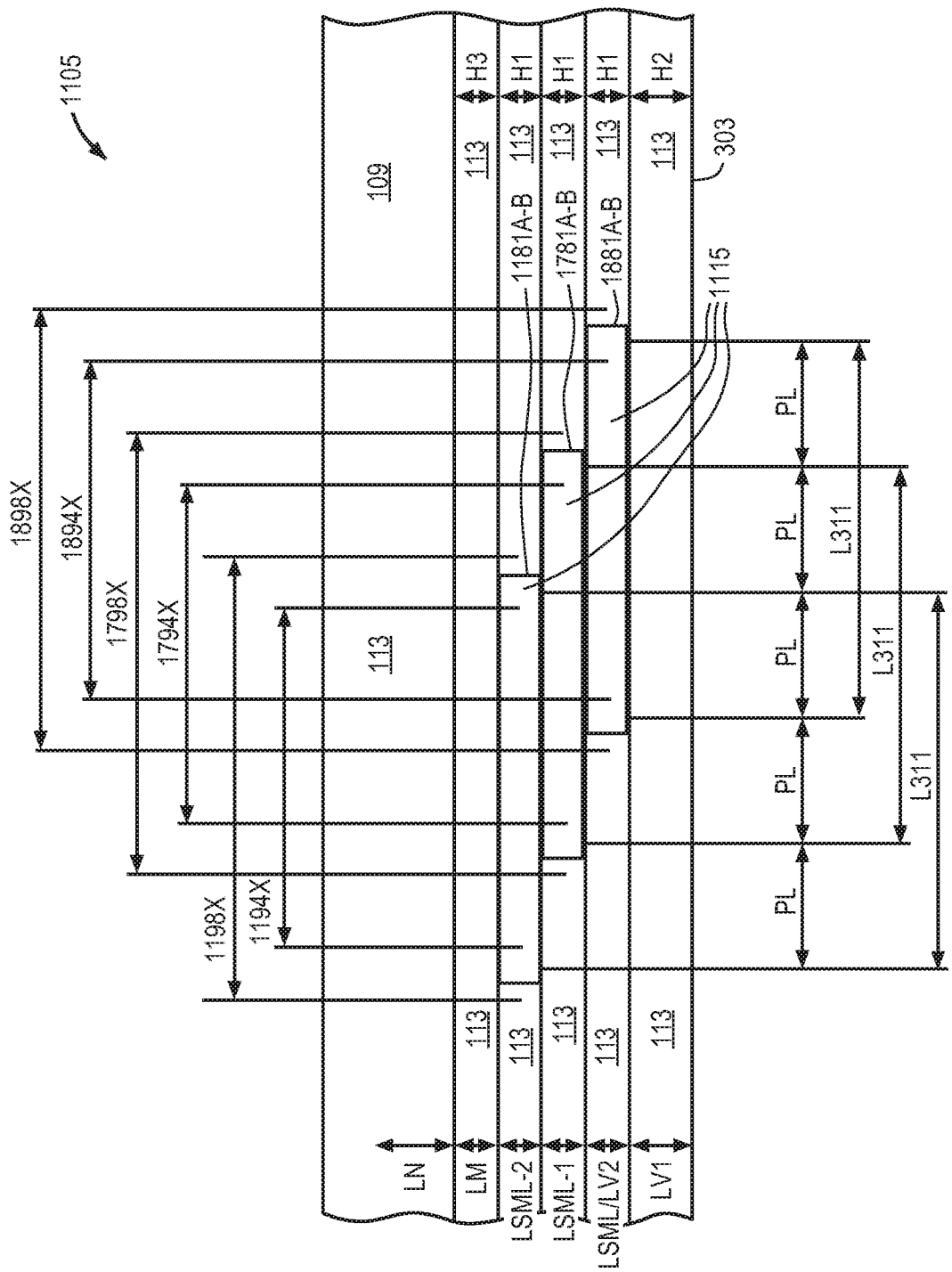
FIG. 11B shows a cross-sectional side view of some patterns of 6 chip "on-die" interconnection feature zones, each zone having triple surface contact pitch length switched buffer (SB) data signal LDW traces, according to embodiments.

FIG. 11B shows a cross-sectional side view of some patterns of 2 chip "on-die" interconnection feature zones, each having triple surface contact pitch length switched buffer (SB) data signal LDW traces, according to embodiments. The side view of FIG. 11B may be similar to that through perspective E-E' shown in FIG. 11A for an embodiment of a SB receive data signal LDW trace pair (e.g., as explained for FIG. 11A).

FIG. 11B shows a cross-sectional side view of a receive data signal LDW trace pattern 1105 similar to pattern 1100 having chip "on-die" interconnection feature zone 1194X with triple surface contact X,Y pitch length (PL) switched buffer (SB) receive data signal LDW trace pairs 1115 (e.g., traces 1181A-B, 1781A-B and 1881A-B) similar to pairs 1110, 1160 and 1165 for chip 109 for an embodiment of a SB receive data signal LDW trace pair (e.g., as explained for FIG. 11A). In some cases, length L311 between the circuit and surface contact of each pair is equal to 3× length PL.

Pattern 1105 does not show the location of the 6 receive circuits (e.g., circuits 1174A-B, 1774A-B and 1874A-B, located similar to 1172A-B, 1772A-B and 1872A-B of FIG. 11A and functioning similar to circuit 174) or of the 6 receive contacts (e.g., contacts 1130A-B, 1730A-B and 1830A-B, located similar to 1140A-B, 1740A-B and 1840A-B of FIG. 11A and functioning similar to contact 130). The locations of receive circuits and contacts of the 6 data signal LWD traces 1181A-B, 1681A-B and 1881A-B of FIG. 11B have been switched, reversed, or otherwise had their locations exchanged in zone 1194X, similar to the description for circuits 1172A-B, 1772A-B and 1872A-B exchanged with contacts 1140A-B, 1740A-B and 1840A-B of FIG. 11A.

SB pairs 1115 describe a "triple pitch" or "3-pitch" SB data signal LDW trace embodiment of chip on-die interconnect features (e.g., where length L311 is equal to 3× length PL). Pairs 1115 may include signal data LDW trace 1181A physically and electronically coupling receive circuitry 1174A (not shown but on the left end of trace 1181A and on the left of zone 1194X) to receive contact 1130A (not shown but on the right end of trace 1181A and on the right of the zone 1194X). Pairs 1115 may also include signal data LDW trace 1181B physically and electronically coupling receive circuitry 1174B (not shown but on the right end of trace 1181B and on the right of zone 1194X) to receive contact 1130B (not shown but on the left end of trace 1181B and on the left of the zone 1194X).

Pairs 1115 may include signal data LDW trace 1781A physically and electronically coupling receive circuitry 1774A (not shown but on the left end of trace 1781A and on the left of zone 1194X) to receive contact 1730A (not shown but on the right end of trace 1781A and on the right of the zone 1194X). Pair 1715 may also include signal data LDW trace 1781B physically and electronically coupling receive circuitry 1774B (not shown but on the right end of trace 1181B and on the right of zone 1194X) to receive contact 1730B (not shown but on the left end of trace 1781B and on the left of the zone 1194X).

Pairs 1115 may include signal data LDW trace 1881A physically and electronically coupling receive circuitry 1874A (not shown but on the left end of trace 1881A and on the left of zone 1194X) to receive contact 1830A (not shown but on the right end of trace 1881A and on the right of the zone 1194X). Pair 1815 may also include signal data LDW trace 1881B physically and electronically coupling receive circuitry 1874B (not shown but on the right end of trace 1181B and on the right of zone 1194X) to receive contact 1830B (not shown but on the left end of trace 1881B and on the left of the zone 1194X). In some cases, such receive contacts 1130A-B, 1730A-B and 1830A-B may be physically and electronically coupled to corresponding transmit contacts at a location of a package (e.g., package 110) using solder bumps (e.g., bumps 119), such as described for transmit contacts 130 as described for FIGS. 1-11A.

Pairs 1115 (e.g., traces 1181A-B, 1781A-B and 1881A-B) may be on levels LV2/LSML, LV3/LSML-1 and LV4/LSML-2; and each trace may have height H1 and length L311. In some cases, traces 1181A-B are on level LV4/LSML-2, traces 1781A-B are on level LV3/LSML-1 and traces 1881A-B are on level LV2/LSML (e.g., as shown). In some cases, traces 1181A-B, 1781A-B and 1881A-B may be on levels LV2/LSML, LV3/LSML-1 and LV4/LSML-2 as described for traces 1182A-B, 1782A-B and 1882A-B being on levels LV2/LSML, LV3/LSML-1 and LV4/LSML-2. In some cases, length L311 is the same length as described for embodiments of length L111.

In some cases, each of isolated signal data LDW traces 1181A-B, 1781A-B and 1881A-B physically and electronically coupling receive circuitry to a receive contact may be part of a channel 176 or 176B, such as described for receive contacts 130 as described for FIGS. 1-11A. In some cases, such channels include channels from (e.g., between) circuits 1172A-B, 1772A-B and 1872A-B of chip 108 and through zone 1196X on chip 108, bumps 118, traces 133, traces 135, traces 137, bumps 119, and to zone 1194X on chip 109 to circuits 1174A-B, 1774A-B and 1874A-B of chip 109. In some cases, such channels include channels from (e.g., between) circuits 172 of chip 108 and through zone 196 on chip 108, bumps 118, traces 133, traces 135, traces 137, bumps 119, and to 1094X on chip 109 to circuits 1174A-B, 1774A-B and 1874A-B of chip 109.

In some cases zones 1196X, 1796X and 1896X represent zone 194 of chip 109. FIG. 11B shows a case when zone 1194X represents zone 194 of chip 109 and may include (1) structure (e.g., one or more via contacts on level LM) vertically attaching one end of traces 1181A-B, 1781A-B and 1881A-B to receive circuitry 1174A-B, 1774A-B and 1874A-B (e.g., represented by 1172A-B, 1772A-B and 1872A-B in FIG. 11A, respectively); and (2) structure (e.g., one or more via contacts on level LV1) vertically attaching the opposing end of traces 1181A-B, 1781A-B and 1881A-B to receive contacts 1130A-B, 1730A-B and 1830A-B (e.g., represented by 1140A-B, 1740A-B and 1840A-B in FIG. 11A, respectively), such as described for vertically attaching trace 181 to receive circuitry 174 and to receive contact 130 as described for FIGS. 1-11A (e.g., see FIGS. 3A and 5). Although not show in FIG. 11A, (1) via contacts similar to 244 and 344 (e.g., a via contact on level LM) may physically, vertically attach (e.g., so they are touching) one end of traces 1181A-B, 1781A-B and 1881A-B to receive circuitry 1174A-B, 1774A-B and 1874A-B (e.g., represented by 1172A-B, 1772A-B and 1872A-B in FIG. 11A, respectively); and (2) via contacts similar to 254 and 354 (e.g., a via contact on level LV1) may physically, vertically attach a second end of traces 1181A-B, 1781A-B and 1881A-B to receive contacts 1130A-B, 1730A-B and 1830A-B (e.g., represented by 1140A-B, 1740A-B and 1840A-B in FIG. 11A, respectively), such as described for vertically attaching trace 181 receive circuitry 174 and to receive contact 130 as described for FIGS. 3A, 5 and 9-11A.

Each of traces 1182A-B, 1782A-B and 1882A-B may also be "isolated" data signal LDW traces that are electronically isolated or shielded from adjacent data signal LDW traces on the same level (e.g., LV2 or LSML; LV3 or LSML-1; or LV4 or LSML-2) by isolation LDW traces (represented by shading or green lines of FIG. 11A within width W3) such as described for traces 184 and 183 shielding traces 182 and 181 respectively.

Although not show in FIG. 11A-B, it can be appreciated that in some cases, zones 1196X, 1796X and 1896X may include (1) structure (e.g., one or more via contacts such as 244 and/or 344 on level LM) vertically attaching one end of the isolation LDW traces to isolation traces; and (2) structure (e.g., one or more via contacts such as 254 and/or 354 on level LV1) vertically attaching the opposing end of the isolation LDW traces to isolation contacts, such as described for vertically attaching trace 184 and/or 183 to isolation traces 272 and/or 274, and to isolation contacts 120 and/or 120, respectively as described for FIGS. 1-8 (e.g., see FIGS. 2B, 3B and 5).

Traces 1182A-B, 1782A-B and 1882A-B may each have length L111=three times length L1, width W1 and height H1 such as described for trace 181 and 182. Zones 1196X, 1796X and 1896X, or a number of zones 1196X, 1796X and 1896X may extend widthwise across a portion of width W3 of a chip (e.g., such as chip 108 or 109).

According to embodiments, zones 1196X, 1796X and 1896X may represent zone 196 or 198; and zones 1196X, 1796X and 1896X may represent zone 192 or 194 (e.g., as described for FIGS. 1-8). Here, each of trace 1182A-B, 1782A-B and 1882A-B may represent one of trace 182 or trace 181, physically and electronically attaching transmit circuitry 172 or receive circuitry 174 (on the left of zone 1196X, 1796X and 1896X) to transmit contact 140 or receive contact 130, respectively (on the right of the zone 1196X, 1796X and 1896X). In some cases, here, trace 1182A-B, 1782A-B and 1882A-B may represent one of trace 182 or trace 181, physically and electronically attaching a transmit circuit or receive circuit 174 (on the right of zone 1196X, 1796X and 1896X) to a transmit contact 140 or a receive contact 130, respectively (on the left of the zone 1196X, 1796X and 1896X).

According to embodiments, zones 1196X, 1796X and 1896X may represent zone 196 and 198; and zones 1196X, 1796X and 1896X may represent zone 192 and 194 (e.g., as described for FIGS. 1-8). Here, each of trace 1182A-B, 1782A-B and 1882A-B may represent both of trace 182 and trace 181, physically and electronically attaching transmit circuitry 172 and receive circuitry 174 (on the left of zone 1196X, 1796X and 1896X) to transmit contact 140 and receive contact 130, respectively (on the right of the zone 1196X, 1796X and 1896X). In some cases, here, each of trace 1182A-B, 1782A-B and 1882A-B may represent both of trace 182 and trace 181, physically and electronically attaching a transmit circuit and receive circuit 174 (on the right of zone 1196X, 1796X and 1896X) to a transmit contact 140 and a receive contact 130, respectively (on the left of the zone 1196X, 1796X and 1896X). According to embodiments, the two chips 108 and 109 will have corresponding X,Y lengthwise bump patters similar to pattern 1100 so that the channel length of each location (e.g., of a contact 1140A, 1140B, 1740A, 1740B, 1840A and 1840B) is the same between the chips.

In some cases, each of pair 1110, 1160 and 1165: (1) perform the same functions (e.g., for data signal LDW: traces, functions, transmission and receiving) as, (2) have the same dimensions (e.g., width and height) as, are located in the same chips (e.g., chip 108 and/or 109) as, have the same additional via contacts (e.g., see FIGS. 2-3 and 5) as those of pair 910.

In some cases, each of pair 1110, 1160 and 1165 are different than pair 910 because: (1) locations 1112-1114, 1712-1711 and 1812-1814 have relative locations three times as far apart (e.g., length L111 is 3× the length as that between location 912 and 914), (2) circuits 1172A-B, 1772A-B and 1872A-B and contacts 1140A-B, 1740A-B and 1840A-B have 3× the length between locations of data signal circuits and contacts (e.g., the length L111 of traces 1182A-B, 1782A-B and 1882A-B is thrice or 3×PL), (3) more isolation LDW traces are used to isolate traces 1182A-B, 1782A-B and 1882A-B from other data signal LDW traces (e.g., on the same level LV2 or LSML, LV3 or LSML-1, and LV4 or LSML-2), (4) more levels are used (e.g., surface contacts in level LV1; traces in levels LV2 or LSML, LV3 or LSML-1, and LV4 or LSML-2; data circuits in level LN), are part of channels similar to but have longer channel lengths by length 3×PL (e.g., see channel 176 and channel 176B but using length L111 in place of LV1; and lengths CL plus length 4×PL, and CL2 plus length 2×PL, respectively). In some cases, embodiments having pair 1110, 1160 and 1165 on chip 108 and 109 will have channel 176 with channel length increased from length CL by length 2×PL on chip 108, plus length 2×PL on chip 109. In some cases, embodiments having pair 1110, 1160 and 1165 on chip 108 or 109 will have channel 176 with channel length increased from length CL2 by length 2×PL on chip 108 or on chip 109. In some cases, for embodiments having 1110, 1160 and 1165 (and 1180, 1185 and 1187) at chip 108 and/or 109 channel 176 has length CL=(3×L1+H411+L2+H511+3×L1), and channel 176B has length CL2=(H4+L2+H511+3×L1), where height H411 is equal to H4+H1+H1 (e.g., height of the interleaved SB pairs on levels LV3 and LV4) and height H511 is equal to H5+H1+H1 (e.g., height of the interleaved SB pairs on levels LV3 and LV4) (e.g., see FIGS. 2-3, 5 and 9A-11B).

In some cases, pattern 1100 has fourth chip "on-die" interconnection feature zone 1196Y which includes a zone similar to zone 1092Y for a fourth switch buffer (SB) pair 1180. In some cases, zone 1196Y is widthwise adjacent to zone 1196X along width W3. SB pair 1180 may be or include a SB pair of data signal transmit (or receive) circuits similar to that described for zone 1196X. In some cases, SB pair 1180 also includes a switched buffer (SB) pair of surface bump contacts similar to that described for zone 1196X. SB pair 1180 may describe a "triple pitch" or "3×-pitch" SB data signal LDW trace embodiment of chip on-die interconnect features (e.g., where length L111 is equal to thrice or 3× length PL) similar to that described for zone 1196X.

Pair 1180 may include a signal data LDW trace (e.g., similar to trace 1182A) physically and electronically coupling transmit circuitry (e.g., similar to circuit 1172A) (on the left of zone 1196Y) to a transmit contact (e.g., similar to contact 1140A) (on the right of the zone 1196Y). Pair 1180 may also include signal data LDW trace (e.g., similar to trace 1182B) physically and electronically coupling transmit circuitry (e.g., similar to circuit 1172B) (on the right of zone 1196Y) to transmit contact (e.g., similar to contact 1140B) (on the left of the zone 1196Y). In some cases, such transmit contacts may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW traces of pair 1180 physically and electronically coupling transmit circuitry of pair 1180 to transmit contacts of pair 1180, may be part of a channel 176 or 176B, such as described for pair 1110 (e.g., and transmit contacts 140 or receive contacts 130 as described for FIGS. 1-8).

In some cases, pattern 1100 has fifth chip "on-die" interconnection feature zone 1796Y which includes zone 1792Y and fifth switch buffer (SB) pair 1185. In some cases, zone 1796Y is widthwise adjacent to zone 1796X along width W3. SB pair 1185 may be or include a SB pair of data signal transmit (or receive) circuits similar to that described for zone 1796X. In some cases, SB pair 1185 also includes a switched buffer (SB) pair of surface bump contacts similar to that described for zone 1796X. SB pair 1185 may describe a "triple pitch" or "3×-pitch" SB data signal LDW trace embodiment of chip on-die interconnect features (e.g., where length L111 is equal to thrice or 3× length PL) similar to that described for zone 1796X.

Pair 1185 may include a signal data LDW trace (e.g., similar to trace 1782A) physically and electronically coupling transmit circuitry (e.g., similar to circuit 1772A) (on the left of zone 1796Y) to a transmit contact (e.g., similar to contact 1740A) (on the right of the zone 1796Y). Pair 1185 may also include signal data LDW trace (e.g., similar to trace 1782B) physically and electronically coupling transmit circuitry (e.g., similar to circuit 1772B) (on the right of zone 1796Y) to transmit contact (e.g., similar to contact 1740B) (on the left of the zone 1796Y). In some cases, such transmit contacts may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW traces of pair 1185 physically and electronically coupling transmit circuitry of pair 1185 to transmit contacts of pair 1185, may be part of a channel 176 or 176B, such as described for pair 1160 (e.g., and transmit contacts 140 or receive contacts 130 as described for FIGS. 1-8).

In some cases, pattern 1100 has sixth chip "on-die" interconnection feature zone 1896Y which includes zone 1892Y and sixth switch buffer (SB) pair 1187. In some cases, zone 1896Y is widthwise adjacent to zone 1896X along width W3. SB pair 1187 may be or include a SB pair of data signal transmit (or receive) circuits similar to that described for zone 1896X. In some cases, SB pair 1187 also includes a switched buffer (SB) pair of surface bump contacts similar to that described for zone 1896X. SB pair 1187 may describe a "triple pitch" or "3×-pitch" SB data signal LDW trace embodiment of chip on-die interconnect features (e.g., where length L111 is equal to thrice or 3× length PL) similar to that described for zone 1896X.

Pair 1187 may include a signal data LDW trace (e.g., similar to trace 1882A) physically and electronically coupling transmit circuitry (e.g., similar to circuit 1872A) (on the left of zone 1896Y) to a transmit contact (e.g., similar to contact 1840A) (on the right of the zone 1896Y). Pair 1187 may also include signal data LDW trace (e.g., similar to trace 1882B) physically and electronically coupling transmit circuitry (e.g., similar to circuit 1872B) (on the right of zone 1896Y) to transmit contact (e.g., similar to contact 1840B) (on the left of the zone 1896Y). In some cases, such transmit contacts may be physically and electronically coupled to corresponding transmit contacts at a location of a package (e.g., package 110) using solder bumps (e.g., bumps 118 or 119), such as described for transmit contacts 140 or receive contacts 130 as described for FIGS. 1-8.

In some cases, isolated signal data LDW traces of pair 1187 physically and electronically coupling transmit circuitry of pair 1187 to transmit contacts of pair 1187, may be part of a channel 176 or 176B, such as described for pair 1165 (e.g., and transmit contacts 140 or receive contacts 130 as described for FIGS. 1-8).

In some cases, pair 1180, 1185 and 1187 (e.g., data signal circuits, contacts, data signal LDW traces, isolation LDW traces and locations (e.g., of surface contacts vertically below circuits/buffers)): (1) perform the same functions (e.g., for data signal LDW: traces, functions, transmission and receiving) as, have the same dimensions (e.g., width and height) as, (2) have the same relative locations (e.g., length L111 is the same length between data signal circuits and contacts, which is 3×PL) as, (3) have the same isolation (e.g., data signal LDW traces are isolated by isolation LDW traces from other data signal LDW traces on the same level LV2/LSML, level LV3/LSML-1, and level LV4/LSML-2) as, (4) are located in the same chips (e.g., chip 108 and/or 109) as, (5) are in the same levels (e.g., surface contacts in level LV1; data signal and isolation LDW traces in level LV2/LSML, level LV3/LSML-1, and level LV4/LSML-2; and data circuits in level LN) as, (6) have the same additional via contacts (e.g., see FIGS. 2-3 and 5) as, and are part of channels similar and having lengths equal to (e.g., here channel 176 has length CL=(3×L1+H4+L2+H5+3×L1); and channel 176B has length CL2=(H4+L2+H5+3×L1) as, those of pair 1110, 1160 and 1165, respectively.

In some cases, traces 1182A, 1782A and 1882A (e.g., zones 1196X, 1796X and 1896X) are each also "isolated" data signal LDW traces that are electronically isolated or shielded from data signal LDW traces of zones 1196Y, 1796Y and 1896Y (e.g., and vice versa) (represented by green lines or shading of figure within width W3) on the same level (e.g., LV2 or LSML; level LV3/LSML-1, and level LV4/LSML-2) by isolation LDW traces (e.g., such as described for traces 184 and 183 shielding traces 182 and 181 respectively).

In some cases, traces 1182A-B, 1782A-B and 1882A-B (e.g., zones 1196X, 1796X and 1896X) are each also "isolated" data signal LDW traces that are electronically isolated or shielded from all data signal LDW traces of zones 1196Y, 1796Y and 1896Y (e.g., and vice versa) (represented by green lines or shading of figure within width W3) on the levels LV2 or LSML; LV3/LSML-1, and level LV4/LSML-2 by isolation LDW traces (e.g., such as described for traces 184 and 183 shielding traces 182 and 181 respectively).

In some cases, these isolation LDW traces may be one or more traces disposed widthwise between (e.g., along width W3, such as at a midpoint of pitch width PW) and extending lengthwise along where length L111 of pairs 1110, 1160 and 1065 overlap with length L111 of pairs 1180, 1185 and 1187.

In some cases, there can be many of SB pairs 1110, 1160, 1065, 1180, 1185 and 1187 on a chip, such as on chip 108 or 109. According to embodiments, there can be many SB pairs 1110, 1160, 1065, 1180, 1185 and 1187 on chip 108 or 109, as there are pairs of 2 adjacent data signal LDW traces (e.g., pairs of 2 traces 182 or 181) on chip 108 or 109.

In some cases, the multiple SB pairs 1110+1160+1165 (e.g., the combination of pair 1110 interleaved with pairs 1160 and 1165) and 1180+1185+1187 (e.g., the combination of pair 1180 interleaved with pairs 1185 and 1187) on chip 108 or 109 can extend parallel to each other, X,Y lengthwise (e.g., pair 1110+1160+1165 parallel to pair 1180+1185+1187 along the direction of length L111) and are X,Y horizontally adjacent widthwise (e.g., pair 1110+1160+1165 horizontally adjacent to pair 1180+1185+1187 along width W3). In some cases, the multiple SB pairs 1110+1160+1165 and 1180+1185+1187 on chip 108 or 109 can extend parallel to each other, lengthwise (e.g., along L111) and have X,Y pitch width PW horizontally between adjacent widthwise ones of SB pairs 1110+1160+1165 and 1180+1185+1187 (e.g., along width W3).

In some cases, the multiple SB pairs 1110+1160+1165 and 1180+1185+1187 on chip 108 or 109 can extend parallel to each other, X,Y lengthwise (e.g., along L111); be horizontally adjacent X,Y widthwise (e.g., along width W3); and be offset X,Y lengthwise (e.g., the location of a surface contact of 1110+1160+1165 as compared to the location of a surface contact of pair 1180+1185+1187 along direction of length L111) by length L6. In some cases, L6 may be ½ pitch length PL (and in this case ⅙ length L111). Such an offset may put one horizontal X,Y location 1712 of a circuit and surface contact of a second SB pair 1160 at the X,Y lengthwise midpoint between the two horizontal X,Y locations (leftmost two) of the circuits and surface contacts of a fourth and fifth interleaved SB pair 1180+1185. In some cases, the offset length L6 may be ⅕ length PL, ¼ length PL, or ⅓ pitch length PL. In some cases there may be no offset and the two horizontal X,Y locations of the circuits and surface contacts of pair of SB pairs 1110+1160+1165 and 1180+1185+1187 are lengthwise aligned, and side by side along width W3.

In some cases, length PL may be a lengthwise pitch length of directly adjacent contacts such as the lengthwise distance between the center point of two lengthwise adjacent contacts. In some cases, length PL may be considered the pitch length for the solder bump surface contacts 120, 130 and 140; and of SB pattern 900, 905, 1000, 1005, 1100 and 1105. For example, the solder bump surface contact pitch length PL may be a lengthwise distance between each two adjacent contacts (e.g., contacts 940A-B, 1040B-1640B, and 1140B-1740B), such as shown along lengths L1 (and L3), L11 (and L31), L111 (and L311) in FIGS. 9A-11B. In some cases, PL is between 150 and 155 micrometers (×E-6 meter—"um"). In some cases PL equals between 135 and 145 mm. In some cases PL equals between 155 and 165 mm. In some cases, it is between 140 and 175 micrometers.

In some cases PL equals approximately 150 mm. Thus, in some embodiments L1 (and L3) may be approximately 1×PL or 150 mm; L11 (and L31) may be approximately 2×PL or 300 mm; and L111 (and L311) may be approximately 3×PL or 450 mm (e.g., for PW equal to approximately 150 mm). It can be appreciated that PL may depend on a design rule or targeted package and/or silicon technology being used to form chip 108, chip 109, and/or package 110. In some cases, PL depends on a design rule or targeted package technology for forming package 110, such as one that reduces or targets a minimum possible length for PL. In some cases, length PL (e.g., of level LV1) may be a standard package pitch length as known for connecting a semiconductor die or IC chip to a package device (e.g., a package, interface, PCB, or interposer) which may in turn be connected to another die or IC chip, and which may also in turn be mounted onto to a socket, a motherboard, or another next-level component.

In some embodiments, the channel length between the transmit and receive circuits excludes zone 192 (or pattern 900, pattern 1000 or pattern 1100) and/or zone 194 (or pattern 905, pattern 1005 or pattern 1105). It can be appreciated that in these embodiments, the data channel length is reduced by length L1 (e.g., L1, L11 or L111) and/or L3 (e.g., L3, L31 or L311). On the other hand, according to other embodiments, including zone 192 (or pattern 900, pattern 1000 or pattern 1100) and/or zone 194 (or pattern 905, pattern 1005 or pattern 1105) increases the data channel length of system 170 by length L1 (e.g., L1, L11 or L111) and/or L3 (e.g., L3, L31 or L311), which results in a longer channel length and cleaner, more high frequency data signal transmission.

In some cases, by using or including SB patterns 900, 905, 1000, 1005, 1100 and 1105, it can be appreciated that length L1 (and L3), L11 (and L31), L111 (and L311) can be extended to be one times, two times or three times the pitch PL between each of the adjacent solder bump surface contact. In addition, according to embodiments, by using or including SB patterns 900, 905, 1000, 1005, 1100 and 1105, it can be appreciated that each SB pair exchanges its signal TX (or RX) circuitry/buffer locations (e.g., at LN) and its package connection solder bump locations at L1 so that the bumps are electronically shielded and isolated from the circuitry/buffers (e.g., instead of directly on top of them) (see FIGS. 9A-11B).

In some cases, using zone 196 (or 996X) or pattern 900 on chip 108 as described can extend the data signal channel length by 1×PL on chip 108 (e.g., to have channel length=PL+H4+L2+H5), which can provide the eye width (EW) and eye height (EH) benefits described for FIGS. 6A-8 for use on the transmission (TX) chip (e.g., chip 108).

In some cases, using zone 198 (or 998X) or pattern 905 on chip 109 as described can extend the data signal channel length by 1×PL on chip 109 (e.g., to have channel length=H4+L2+H5+PL), which can provide the eye width (EW) and eye height (EH) benefits described for FIGS. 6A-8 for use on the receive (RX) chip (e.g., chip 109).

Also, in some cases, using zones 196 (or 996X) and 198 (or 998X); or patterns 900 and 905 on chips 108 and 109 as described can extend the data signal channel length by 1×PL on each of chip 108 and 109 (e.g., to have channel length=PL+H4+L2+H5+PL), which can provide the eye width (EW) and eye height (EH) benefits described for FIGS. 6A-8 for use on the transmission (TX) chip (e.g., chip 108) and receive (RX) chip (e.g., chip 109).

In some cases, using zone 1096X or pattern 1000 on chip 108 as described can extend the data signal channel length by 2×PL on chip 108 (e.g., to have channel length=2×PL+H4+L2+H5), which can provide the eye width (EW) and eye height (EH) benefits described for FIGS. 6A-8 for use on the transmission (TX) chip (e.g., chip 108).

In some cases, using zone 1098X or pattern 1005 on chip 109 as described can extend the data signal channel length by 2×PL on chip 109 (e.g., to have channel length=H4+L2+H5+2×PL), which can provide the eye width (EW) and eye height (EH) benefits described for FIGS. 6A-8 for use on the receive (RX) chip (e.g., chip 109).

Also, in some cases, using zones 1096X and 1098X; or patterns 1000 and 1005 on chips 108 and 109 as described can extend the data signal channel length by 2×PL on each of chip 108 and 109 (e.g., to have channel length=2×PL+H4+L2+H5+2×PL), which can provide the eye width (EW) and eye height (EH) benefits described for FIGS. 6A-8 for use on the transmission (TX) chip (e.g., chip 108) and receive (RX) chip (e.g., chip 109).

In some cases, using zone 1196X or pattern 1100 on chip 108 as described can extend the data signal channel length by 3×PL on chip 108 (e.g., to have channel length=3×PL+H4+L2+H5), which can provide the eye width (EW) and eye height (EH) benefits described for FIGS. 6A-8 for use on the transmission (TX) chip (e.g., chip 108).

In some cases, using zone 1198X or pattern 1105 on chip 109 as described can extend the data signal channel length by 3×PL on chip 109 (e.g., to have channel length=H4+L2+H5+3×PL), which can provide the eye width (EW) and eye height (EH) benefits described for FIGS. 6A-8 for use on the receive (RX) chip (e.g., chip 109).

Also, in some cases, using zones 1196X and 1198X; or patterns 1100 and 1105 on chips 108 and 109 as described can extend the data signal channel length by 3×PL on each of chip 108 and 109 (e.g., to have channel length=3×PL+H4+L2+H5+3×PL), which can provide the eye width (EW) and eye height (EH) benefits described for FIGS. 6A-8 for use on the transmission (TX) chip (e.g., chip 108) and receive (RX) chip (e.g., chip 109).

In some cases, width PW may be a widthwise pitch length of directly adjacent contacts such as the widthwise distance between the center point of two widthwise adjacent contacts. It can be appreciated that the same pitch width may apply to each row of adjacent surface contacts of FIGS. 1-11B, such as those for zones 196; 198; SB pairs in zones 996 X and Y; SB pairs in zones 1096 X and Y; and SB pairs in zones 1196 X and Y; and the like. FIGS. 9A-11B show pitch with PW between adjacent lengthwise rows of contacts. Pitch width PW may be a width between two width wise adjacent switched buffer pair, such as between SB pairs in zones 996 X and Y; SB pairs in zones 1096 X and Y; and SB pairs in zones 1196 X and Y; and the like. In some cases, width PW (e.g., of level LV1) may be a standard package pitch width as known for connecting a semiconductor die or IC chip to package device (e.g., a package, interface, PCB, or interposer) which may in turn be connected to another die or IC chip, and which may also in turn be mounted onto to a socket, a motherboard, or another next-level component.

In some cases, the use of "approximately" describes exactly that number. In some cases, the use of "approximately" describes within 10 percent above and below that number. In some cases, the use of "approximately" describes within 5 percent above and below that number. In some cases, the use of "approximately" describes within 2 percent above and below that number.

In some embodiments, surface contacts (e.g., contacts 120, 120P, 120G, 130, 140, and surface contacts of FIGS. 9-11); via contacts (e.g., contacts 242, 252, 284, 254, 352, 382, 385, 384, and via contacts of FIGS. 9-11); solder bumps 118 and 119; LDW traces (e.g., 181, 182, 182P, 182G, 183, 183P, 183G, 184, and LDW traces of FIGS. 9-11) are formed of a solid conductive (e.g., pure conductor) material. In some cases, they may each be a height (e.g., a thickness), width and length (such as shown and described herein) of solid conductor material.

In some cases, the conductive (e.g., conductor) material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper. In some cases, they all include copper and may include one or more other metals.

Layers of dielectric 103 (e.g., and material 703) may each be a height (e.g., a thickness), width and length of solid non-conductive material. The dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride.

Layers of dielectric 113 (e.g., and other descriptions of dielectric or non-conductive material herein) may each be a height (e.g., a thickness), width and length of solid non-conductive material. In some cases, the dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride. In some cases, it is a pure oxide, non-conductive material.

In some cases, zone 192 (or pattern 900, pattern 1000 or pattern 1100) or zone 194 (or pattern 905, pattern 1005 or pattern 1105) are part of a field having multiple ones of such a zone of a chip 108 or 109 that includes a number of other similar contact, LDW traces and data signal circuits.

It can be appreciated that in addition to the descriptions above, similar data signal circuits; LDW trace routing; and transmit channels as described for FIGS. 1-11 can exist initiating at transmit circuits on chip 109 and terminating at received circuits on chip 108 such as to transmit data signal from chip 109 to 108 in addition to transmitting from chip 108 to 109.

According to some embodiments, it is possible for the integrated circuit (IC) chip "on-die" interconnection features herein to improve signaling to and through a single ended bus or data signal communication channel by (e.g., zone 192 (or pattern 900, pattern 1000 or pattern 1100) and/or zone 194 (or pattern 905, pattern 1005 or pattern 1105)) being included in that bus or channel.

In some cases, a "single ended" channel or bus includes is capable of successfully sending a high speed data signal through such a channel without using "differential" bus technology or differential bus pairs of positive and negative polarity versions of the same signals (e.g., on two wires or channels).

In some cases, channel 176 or 176B (e.g., and the like having (pattern 900, pattern 1000 or pattern 1100) and/or (pattern 905, pattern 1005 or pattern 1105)) is or includes a "single ended" data signal channel or bus (e.g., for single ended connections and transmission through semiconductor device packages) originating at circuit 172 of chip 108 and extending through features of zone 192 (or pattern 900, pattern 1000 or pattern 1100) to contact 140 in chip 108; then through a solder bump on contact 140 and to a package device, through the package device; through a solder bump to contact 130 of chip 109; and through features of zone 194 (or pattern 905, pattern 1005 or pattern 1105); and to circuit 174 of chip 109.

Embodiments herein (e.g., zone 192 (or pattern 900, pattern 1000 or pattern 1100) and/or zone 194 (or pattern 905, pattern 1005 or pattern 1105)) have described integrated circuit (IC) chip "on-die" interconnection features (and methods for their manufacture) for improved signal connections and transmission through a data signal communication channel from one chip (e.g., chip 108), through semiconductor device packaging (e.g., package device 110), and to another component, such as another chip (e.g., chip 109). Such packaging may include one or more substrate packages and/or printed circuit board (PCB) substrates upon which the integrated circuit (IC) chip and other component are to be attached. Such chip interconnection features may include (1) "last silicon metal level (LSML)" data signal "leadway (LDW) routing" traces isolated between LSLM isolation (e.g., power and/or ground) traces to: (2) add a length of the isolated data signal LDW traces to increase a total length of and tune data signal communication channels extending through a package between two communicating chips and (3) create switched buffer (SB) pairs of data signal channels that use the isolated data signal LDW traces to switch the locations of the pairs data signal circuitry and surface contacts for packaging connection bumps.

More specifically, embodiments herein (e.g., zone 192 (or pattern 900, pattern 1000 or pattern 1100) and/or zone 194 (or pattern 905, pattern 1005 or pattern 1105)) have described "on-die" LSML (e.g., LV2-LV4 as needed) LDW data signal LDW traces isolated between LDW isolation (e.g., power and ground) traces to (1) create on-die LDW routing/length to increase channel lengths (e.g., see at least FIGS. 1-11B) and (2) provide SB pair switch (e.g., see at least FIGS. 9A-11B). In some cases, chips 108 and 109 may represent chips having on-die interconnection features (e.g., zone 192 (or pattern 900, pattern 1000 or pattern 1100) and/or zone 194 (or pattern 905, pattern 1005 or pattern 1105)) to enable signaling. In some cases, the on-die interconnection features of chip chips 108 and 109 include "on-die", LSML that is above the exposed bump contact— first "LV1" level) data signal "leadway" (LDW) routing traces isolated by being between one or more LDW isolation (e.g., power and/or ground) traces. In some cases, device 109 may represent a chip having on-die interconnection features to enable signaling, having on-die interconnection features as described for chip 108. In some cases, devices 108 and 109 both represent chips having on-die interconnection features to enable signaling as described for chip 108. In some cases, the isolated on-die data signal leadway (LDW) routing traces can (1) provide LDW routing by adding a (e.g., horizontal channel length) length of the isolated signal traces (along the second level of the chip) that increases a total length of signal communication channel between chip 108 and another component (e.g., chip 109) (e.g., see at least FIGS. 1-11B) and (2) to create switched buffer (SB) pair signal channels that use the isolated LDW routing to put the locations of one of the pairs signal circuitry/buffer and at the location of the other of the pairs surface contact for packaging connection bumps, and vice versa (e.g., to exchange the locations of the pair's signal circuitry/buffers and their surface contacts for bumps)(e.g., see at least FIGS. 9A-11B).

According to some embodiments, the proposed isolated data signal LDW trace (e.g., on-die interconnect feature) concepts described for FIGS. 1-11A can be extended to the same or other on-package input output (e.g., data signal channel) configurations with higher data rates (e.g., than the high frequency data signals herein) and higher routing density as well (e.g., greater than the 5 data channels shown in FIGS. 1A-B between circuits 172 of chip 108 and circuits 174 of chip 109). According to some embodiments, those concepts can also improve the terminated on-package input output (e.g., data signal channel) channel margins by up to 15 percent (e.g., eye height minimums, see at least FIGS. 6A-8).

In some cases, the on-die interconnection features (e.g., zone 192 (or pattern 900, pattern 1000 or pattern 1100) and/or zone 194 (or pattern 905, pattern 1005 or pattern 1105)) may increase in the stability and cleanliness of high frequency transmit and receive data signals transmitted between the data signal circuits of two chips communicating though a package device upon which they are mounted (e.g., as compared to a data signal transmitting and/or receiving chip without the on-die interconnection features). Such an increased frequency may include data signals having a frequency of between 7 and 25 gigatransfers per second (GT/s). In some cases, GT/s may refer to a number of operations (e.g., transmission of digital data such as the data signal herein) transferring data that occur in each second in some given data transfer channel such as a channel provided by the on-die interconnection features (e.g., zone 192 (or pattern 900, pattern 1000 or pattern 1100) and/or zone 194 (or pattern 905, pattern 1005 or pattern 1105)); or may refer to a sample rate, i.e. the number of data samples captured per second, each sample normally occurring at the clock edge. 1 GT/s is $10^9$ or one billion transfers per second. In some cases, the on-die interconnection features improves (e.g., reduce) crosstalk (e.g., as compared to a data signal transmitting and/or receiving chip without the on-die interconnection features) from very low frequency transfer such as from 50 mega hertz (MHz) to a GHz transfer level, such as greater than 40 GHz (or up to between 40 and 50 GHz).

In some cases, electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one data signal LDW trace in a level induces current in a second data signal LDW trace in the same level. The first and second signals may be flowing in data signal LDW trace extending or running parallel to each other, as in a transformer.

In some cases, the on-die interconnection features (e.g., zone 192 (or pattern 900, pattern 1000 or pattern 1100) and/or zone 194 (or pattern 905, pattern 1005 or pattern 1105)) are formed using processes or processing as know in the industry for forming traces, interconnects, via contact and surface contacts of an IC chip or die. In some cases, forming them includes using masking and etching of a silicon wafer. In some cases, the masking includes masking with a solder resist and etching dielectric and/or conductor material.

In some cases, forming them includes using chemical vapor deposition (CVD); atomic layer deposition (ALD); growing dielectric material such as from or on a surface having a pattern of dielectric material and conductor material. In some cases, forming them includes patterning a mask using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form openings where the features will exists. Depending on the mask type, the exposed or unexposed areas are removed. In some cases, the mask goes through a thermal cure of some type after the openings (e.g., pattern) are defined. In some cases, the mask may be formed by a process known to form such a mask of a chip, or device formed using IC chip processing.

In some cases, embodiments of processes for forming chips having on-die interconnection features (e.g., zone 192 (or pattern 900, pattern 1000 or pattern 1100) and/or zone 194 (or pattern 905, pattern 1005 or pattern 1105)) provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIG. 1). In some cases, embodiments of such processes and devices provide the demanded lower cost high frequency data transfer interconnects solution that is needed across the above segments. These benefits may be due to the addition of on-die interconnection features which increase performance and speed of the data transfer.

Some embodiments include chip 108 and 109 mounted onto package 110 such as using solder balls 118 and 119. Some embodiments only include chip 108 and not chip 109 mounted onto package 110 such as using solder balls 118. Some embodiments include only chip 109 and 108 mounted onto package 110 such as using solder balls 119. Some embodiments only include chip 108, not chip 109, not package 110 and no solder balls 118. Some embodiments only include chip 109, not chip 108, not package 110 and no solder balls 119.

Figure 12:
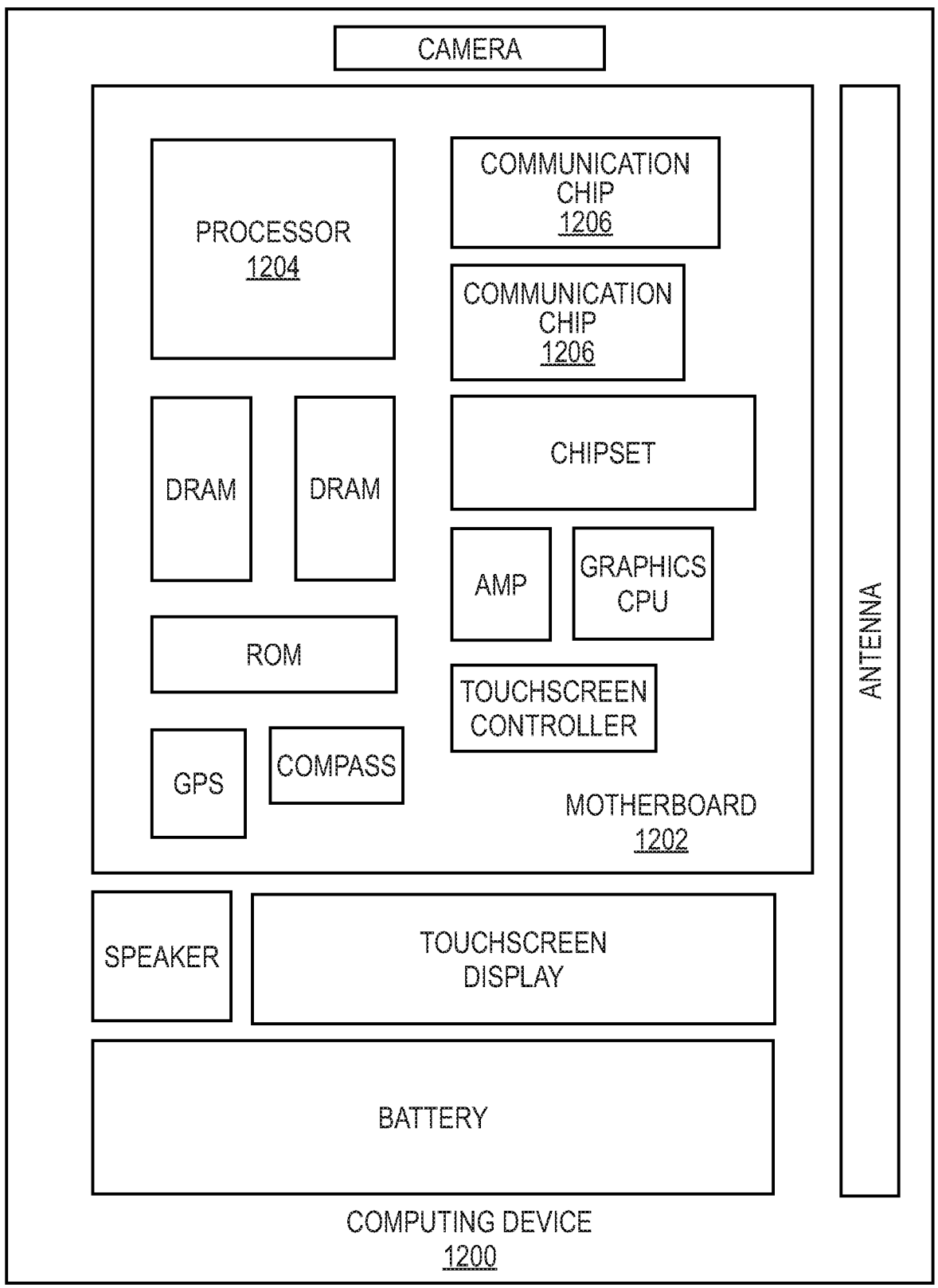
FIG. 12 illustrates a computing device in accordance with one implementation.

FIG. 12 illustrates a computing device in accordance with one implementation. FIG. 12 illustrates computing device 1200 in accordance with one implementation. Computing device 1200 houses board 1202. Board 1202 may include a number of components, including but not limited to processor 1204 and at least one communication chip 1206. Processor 1204 is physically and electrically coupled to board 1202. In some implementations at least one communication chip 1206 is also physically and electrically coupled to board 1202. In further implementations, communication chip 1206 is part of processor 1204.

Depending on its applications, computing device 1200 may include other components that may or may not be physically and electrically coupled to board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1206 enables wireless communications for the transfer of data to and from computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1200 may include a plurality of communication chips 1206. For instance, first communication chip 1206 may be dedicated to shorter range wireless communications such as Wi-Fi and Bluetooth and second communication chip 1206 may be dedicated to longer range wireless communications such as GPS, EDGE, GPRS, CDMA, WiMAX, LTE, Ev-DO, and others.

Processor 1204 of computing device 1200 includes an integrated circuit die packaged within processor 1204. In some implementations, the integrated circuit die of the processor includes one or more devices, such as transistors or metal interconnects. In some embodiments, the package of the integrated circuit die or processor 1204 includes embodiments of processes for forming a "on-die interconnection features (e.g., zone 192 (or pattern 900, pattern 1000 or pattern 1100) and/or zone 194 (or pattern 905, pattern 1005 or pattern 1105))" or embodiments of a "on-die interconnection features (e.g., zone 192 (or pattern 900, pattern 1000 or pattern 1100) and/or zone 194 (or pattern 905, pattern 1005 or pattern 1105))" as described herein. The term "processor" may refer to any device or portion of a device that processes electronic data from registers and/or memory to transform that electronic data into other electronic data that may be stored in registers and/or memory.

Communication chip 1206 also includes an integrated circuit die packaged within communication chip 1206. In accordance with another implementation, the integrated circuit die of the communication chip includes one or more devices, such as transistors or metal interconnects. In some embodiments, the package of the integrated circuit die or chip 1206 includes embodiments of processes for forming a "on-die interconnection features (e.g., zone 192 (or pattern 900, pattern 1000 or pattern 1100) and/or zone 194 (or pattern 905, pattern 1005 or pattern 1105))" or embodiments of a "on-die interconnection features (e.g., zone 192 (or pattern 900, pattern 1000 or pattern 1100) and/or zone 194 (or pattern 905, pattern 1005 or pattern 1105))" as described herein.

In further implementations, another component housed within computing device 1200 may contain an integrated circuit die that includes one or more devices, such as transistors or metal interconnects. In some embodiments, the package of the other integrated circuit die or chip includes embodiments of processes for forming a "on-die interconnection features (e.g., zone 192 (or pattern 900, pattern 1000 or pattern 1100) and/or zone 194 (or pattern 905, pattern 1005 or pattern 1105))" or embodiments of a "on-die interconnection features (e.g., zone 192 (or pattern 900, pattern 1000 or pattern 1100) and/or zone 194 (or pattern 905, pattern 1005 or pattern 1105))" as described herein.

In various implementations, computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1200 may be any other electronic device that processes data.

EXAMPLES

The following examples pertain to embodiments.

Example 1 is an integrated circuit chip including a data signal circuit disposed on a horizontal inner level within the chip; a data signal surface contact disposed on an exposed horizontal surface of the chip; a data signal leadway (LDW) trace vertically disposed on a LDW trace horizontal level of the chip between the horizontal inner level and the exposed horizontal surface; the data signal LDW trace having a first end, a second end opposite the first end, and a horizontal length between the first end and the second end; the first end coupled to the circuit and the second end coupled to the surface contact, wherein the length is between 50 µm and 500 µm.

In Example 2, the subject matter of Example 1 can optionally include wherein the data signal LDW trace is disposed within a horizontal last silicon metal level (LSML) of the chip.

In Example 3, the subject matter of Example 1 can optionally include wherein a first via contact vertically attaching the data signal circuit to the first end of the data signal LDW trace; and a second via contact vertically attaching the data signal surface contact to the data signal LDW trace.

In Example 4, the subject matter of Example 1 can optionally include wherein the data signal LDW trace has a width between 2 µm and 4 µm; and a height of between 2 µm and 4 µm.

In Example 5, the subject matter of Example 1 can optionally include wherein the data signal LDW trace is a first data signal LDW trace having a horizontal first length between its first end and second end, and further including a second data signal LDW trace vertically disposed on the LDW trace horizontal level of the chip; the second data signal LDW trace having a first end, a second end opposite the first end, and a second horizontal length between the first end and the second end; wherein the second length is between 50 µm and 500 µm; an isolation signal LDW trace vertically disposed on the LDW trace horizontal level of the chip; the isolation signal LDW trace having a first end, a second end opposite the first end, and a third horizontal length between the first end and the second end; the isolation signal LDW trace horizontally disposed on the LDW trace level between the first data signal LDW trace and the second data signal LDW trace.

In Example 6, the subject matter of Example 5 can optionally include the first data signal LDW trace, the second data signal LDW trace, and the isolation signal LDW trace all extending parallel to each other on the LDW trace horizontal level of the chip.

In Example 7, the subject matter of Example 5 can optionally include, the first data signal LDW trace, the second data signal LDW trace, and the isolation signal LDW trace all having the same length and are all disposed within a horizontal last silicon metal level LSML of the chip.

In Example 8, the subject matter of Example 5 can optionally include the isolation signal LDW trace is disposed within the chip at a location to electronically shield data signals on the first data signal LDW trace from data signals on the second data signal LDW trace.

In Example 9, the subject matter of Example 4 can optionally include an isolation signal trace disposed on a horizontal level within the chip; an isolation signal surface contact disposed on the exposed horizontal surface of the chip; the first end of the isolation LDW trace coupled to the isolation trace and the second end of the isolation LDW trace coupled to the isolation surface contact, wherein the third length is between 50 µm and 500 µm.

In Example 10, the subject matter of Example 4 can optionally include wherein the data signal circuit is a first data signal circuit, and wherein the data signal surface contact is a first data signal surface contact, and further including: a second data signal circuit disposed on the horizontal inner level within the chip; a second data signal surface contact disposed on the exposed surface of the chip; the first end of the second data LDW trace coupled to the second data isolation circuit and the second end of the second data LDW trace coupled to the second data surface contact.

In Example 11, the subject matter of Example 10 can optionally include wherein the first data signal circuit is horizontally disposed at a first X,Y location of the chip and is vertically on the inner level within the chip; wherein the second data signal circuit is horizontally disposed at a second X,Y location of the chip and is vertically on the inner level within the chip; wherein the first data signal surface contact is horizontally disposed at the second X,Y location of the chip and is vertically on the surface of the chip; and wherein the second data signal surface contact is horizontally disposed at the first X,Y location of the chip and is vertically on the surface of the chip.

In Example 12, the subject matter of Example 11 can optionally include wherein the LDW trace horizontal level is a first LDW trace horizontal level, and further including: a third and fourth data signal circuit disposed on the inner level; a third and fourth data signal surface contact disposed on the exposed surface; a third and fourth data signal LDW trace vertically disposed on a second LDW trace horizontal level; the third and fourth data signal LDW trace having a first end, a second end opposite the first end, and a length between the first end and the second end; the first end coupled to the third and fourth circuit and the second end coupled to the third and fourth surface contact; wherein the third data signal circuit is horizontally disposed at a third X,Y location of the chip and is vertically on the inner level within the chip; wherein the fourth data signal circuit is horizontally disposed at a fourth X,Y location of the chip and is vertically on the inner level within the chip; wherein the third data signal surface contact is horizontally disposed at the fourth X,Y location of the chip and is vertically on the surface of the chip; and wherein the fourth data signal surface contact is horizontally disposed at the third X,Y location of the chip and is vertically on the surface of the chip.

In Example 13, the subject matter of Example 1 can optionally include wherein the first and second locations are horizontally widthwise offset from the third and fourth locations by a pitch width of the surface contacts; and wherein the first and second locations are horizontally lengthwise offset from the third and fourth locations by half a pitch length of the surface contacts.

In Example 14, the subject matter of Example 1 can optionally include wherein the data signal circuit is a data signal transmitter circuit, wherein the data signal surface contact is a data signal transmit surface contact, and wherein the transmit data signal LDW trace is a transmit data signal LDW trace.

In Example 15, the subject matter of Example 1 can optionally include wherein the data signal circuit is a data signal receiver circuit, wherein the data signal surface contact is a data signal receive surface contact, and wherein the transmit data signal LDW trace is a receive data signal LDW trace.

In Example 16, the subject matter of Example 1 can optionally include wherein the integrated circuit chip is a first integrated circuit chip, wherein the data signal circuit is a data signal transmitter circuit, wherein the data signal surface contact is a data signal transmit surface contact, and wherein the transmit data signal LDW trace is a transmit data signal LDW trace having a horizontal first length between its first end and second end, and further including a second integrated circuit chip having: a data signal receiver circuit disposed on a horizontal inner level within the second chip; a data signal receive surface contact disposed on an exposed horizontal surface of the second chip; a receive data signal LDW trace vertically disposed on an LDW trace horizontal level of the second chip; the receive data signal LDW trace having a first end, a second end opposite the first end, and a horizontal second length between its first end and second end; its first end coupled to the receive circuit and its second end coupled to the receive surface contact of the second chip; and a chip package electrically coupling the data signal transmit surface contact of the first chip to the data signal receive surface contact of the second chip.

Example 17 is an electronic system including a first integrated circuit chip having a data signal transmitter circuit disposed on an inner level within the first chip; a data signal transmit surface contact disposed on an exposed surface of the first chip; a transmit data signal leadway (LDW) trace having a first end, a second end opposite the first end, and a first length between its first end and its second end; the first end coupled to the transmitter circuit and the second end coupled to the transmit surface contact of the first chip; a second integrated circuit chip having a data signal receive circuit disposed on an inner level within the second chip; a data signal receive surface contact disposed on an exposed surface of the second chip; a receive data signal LDW trace having a first end, a second end opposite the first end, and a second length between its first end and its second end; the first end coupled to the receive circuit and the second end coupled to the receive surface contact of the second chip; and a chip package electrically coupling the data signal transmit surface contact of the first chip to the data signal receive surface contact of the second chip.

In Example 18, the subject matter of Example 17 can optionally include the chip package further including a data signal transmit surface contact disposed on an exposed surface of the package at a first horizontal location of the package, the data signal transmit surface contact of the package attached to the data signal transmit surface contact of the first chip; a data signal receive surface contact disposed on an exposed surface of the package at a second horizontal location of the package, the data signal receive surface contact of the package attached to the data signal receive surface contact of the second chip; a data signal package trace attaching the data signal transmit surface contact of the package to the data signal receive surface contact of the package, the data signal package trace having a third length.

In Example 19, the subject matter of Example 18 can optionally include wherein a data signal channel includes at least the transmit data signal LDW trace, the data signal package trace and the receive data signal LDW trace; and a channel length includes at least the first length, plus the second length, plus the third length; and wherein the channel length is tuned to increase eye height for high speed data signals transmitted on the channel from the transmit circuit to the receive circuit.

In Example 20, the subject matter of Example 19 can optionally include wherein the first and second length are each between 50 μm and 500 μm; and the third length is between 3 and 6 mm.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although some embodiments described above show only on-die interconnection features (e.g., zone 192 (or pattern 900, pattern 1000 or pattern 1100) and/or zone 194 (or pattern 905, pattern 1005 or pattern 1105)) at levels L2-LM, those descriptions can apply to forming or having those same on-die interconnection features at levels L3-LM-1 (e.g., one level above where the features are shown). In another example, although some embodiments described above show only data signal LDW traces and isolation LDW traces at levels L2-L4, those descriptions can apply to forming or having those same LDW traces on more levels (e.g., more SB pairs) such as on levels L2-L5; or on levels L2-L6. The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:
1. An integrated circuit chip comprising:
a data signal circuit disposed on a horizontal inner level within the chip;
a data signal surface contact disposed on an exposed horizontal surface of the chip;
a data signal leadway (LDW) trace vertically disposed on a LDW trace horizontal level of the chip between the horizontal inner level and the exposed horizontal surface;

the data signal LDW trace having a first end, a second end opposite the first end, and a horizontal length between the first end and the second end;

the first end coupled to the circuit and the second end coupled to the surface contact, wherein the length is between 50 um and 500 um; and a via contact vertically attaching the data signal surface contact to the data signal LDW trace.

2. The chip of claim 1, wherein the data signal LDW trace is disposed within a horizontal last silicon metal level (LSML) of the chip.

3. The chip of claim 1, further comprising:
a second via contact vertically attaching the data signal circuit to the first end of the data signal LDW trace.

4. The chip of claim 1, wherein the data signal LDW trace has a width between 2 um and 4 um; and a height of between 2 um and 4 um.

5. The chip of claim 1, wherein the data signal LDW trace is a first data signal LDW trace having a horizontal first length between its first end and second end, and further comprising:

a second data signal LDW trace vertically disposed on the LDW trace horizontal level of the chip;

the second data signal LDW trace having a first end, a second end opposite the first end, and a second horizontal length between the first end and the second end;

wherein the second length is between 50 um and 500 um;

an isolation signal LDW trace vertically disposed on the LDW trace horizontal level of the chip;

the isolation signal LDW trace having a first end, a second end opposite the first end, and a third horizontal length between the first end and the second end;

the isolation signal LDW trace horizontally disposed on the LDW trace level between the first data signal LDW trace and the second data signal LDW trace.

6. The chip of claim 5, the first data signal LDW trace, the second data signal LDW trace, and the isolation signal LDW trace all extending parallel to each other on the LDW trace horizontal level of the chip.

7. The chip of claim 5, the first data signal LDW trace, the second data signal LDW trace, and the isolation signal LDW trace all having the same length and are all disposed within a horizontal last silicon metal level LSML of the chip.

8. The chip of claim 5, the isolation signal LDW trace is disposed within the chip at a location to electronically shield data signals on the first data signal LDW trace from data signals on the second data signal LDW trace.

9. The chip of claim 4, further comprising:
an isolation signal trace disposed on a horizontal level within the chip;
an isolation signal surface contact disposed on the exposed horizontal surface of the chip;
the first end of the isolation LDW trace coupled to the isolation trace and the second end of the isolation LDW trace coupled to the isolation surface contact, wherein the third length is between 50 um and 500 um.

10. The chip of claim 5, wherein the data signal circuit is a first data signal circuit, and wherein the data signal surface contact is a first data signal surface contact, and further comprising:
a second data signal circuit disposed on the horizontal inner level within the chip;
a second data signal surface contact disposed on the exposed surface of the chip;
the first end of the second data LDW trace coupled to the second data isolation trace and the second end of the second data LDW trace coupled to the second data surface contact.

11. The chip of claim 10, further comprising:
wherein the first data signal circuit is horizontally disposed at a first X,Y location of the chip and is vertically on the inner level within the chip;
wherein the second data signal circuit is horizontally disposed at a second X,Y location of the chip and is vertically on the inner level within the chip; wherein the first data signal surface contact is horizontally disposed at the second X,Y location of the chip and is vertically on the surface of the chip; and
wherein the second data signal surface contact is horizontally disposed at the first X,Y location of the chip and is vertically on the surface of the chip.

12. The chip of claim 11, wherein the LDW trace horizontal level is a first LDW trace horizontal level, and further comprising:
a third and fourth data signal circuit disposed on the inner level;
a third and fourth data signal surface contact disposed on the exposed surface;
a third and fourth data signal LDW trace vertically disposed on a second LDW trace horizontal level;
the third and fourth data signal LDW trace having a first end, a second end opposite the first end, and a length between the first end and the second end;
the first end coupled to the third and fourth circuit and the second end coupled to the third and fourth surface contact;
wherein the third data signal circuit is horizontally disposed at a third X,Y location of the chip and is vertically on the inner level within the chip;
wherein the fourth data signal circuit is horizontally disposed at a fourth X,Y location of the chip and is vertically on the inner level within the chip;
wherein the third data signal surface contact is horizontally disposed at the fourth X,Y location of the chip and is vertically on the surface of the chip; and
wherein the fourth data signal surface contact is horizontally disposed at the third X,Y location of the chip and is vertically on the surface of the chip.

13. The chip of claim 12, wherein the first and second locations are horizontally widthwise offset from the third and fourth locations by a pitch width of the surface contacts; and
wherein the first and second locations are horizontally lengthwise offset from the third and fourth locations by half a pitch length of the surface contacts.

14. The chip of claim 1, wherein the data signal circuit is a data signal transmitter circuit, wherein the data signal surface contact is a data signal transmit surface contact, and wherein the transmit data signal LDW trace is a transmit data signal LDW trace.

15. The chip of claim 1, wherein the data signal circuit is a data signal receiver circuit, wherein the data signal surface contact is a data signal receive surface contact, and wherein the transmit data signal LDW trace is a receive data signal LDW trace.

16. The chip of claim 1, wherein the integrated circuit chip is a first integrated circuit chip, wherein the data signal circuit is a data signal transmitter circuit, wherein the data signal surface contact is a data signal transmit surface contact, and wherein the transmit data signal LDW trace is a transmit data signal LDW trace having a horizontal first length between its first end and second end, and further comprising:
- a second integrated circuit chip having:
  - a data signal receiver circuit disposed on a horizontal inner level within the second chip;
  - a data signal receive surface contact disposed on an exposed horizontal surface of the second chip;
  - a receive data signal LDW trace vertically disposed on an LDW trace horizontal level of the second chip;
  - the receive data signal LDW trace having a first end, a second end opposite the first end, and a horizontal second length between its first end and second end;
  - its first end coupled to the receive circuit and its second end coupled to the receive surface contact of the second chip; and
- a chip package electrically coupling the data signal transmit surface contact of the first chip to the data signal receive surface contact of the second chip.

17. An integrated circuit chip comprising:
- a first data signal circuit disposed on a horizontal inner level within the chip;
- a first data signal surface contact disposed on an exposed horizontal surface of the chip;
- a first data signal leadway (LDW) trace vertically disposed on a LDW trace horizontal level of the chip between the horizontal inner level and the exposed horizontal surface;
- the first data signal LDW trace having a first end, a second end opposite the first end, and a horizontal length between the first end and the second end;
- the first end coupled to the first circuit and the second end coupled to the first surface contact;
- a second data signal LDW trace vertically disposed on the LDW trace horizontal level of the chip;
- the second data signal LDW trace having a first end, a second end opposite the first end, and the horizontal length between the first end and the second end; and
- an isolation signal LDW trace vertically disposed on the LDW trace horizontal level of the chip;
- the isolation signal LDW trace having a first end, a second end opposite the first end, and the horizontal length between the first end and the second end; the isolation signal LDW trace horizontally disposed on the LDW trace level between the first data signal LDW trace and the second data signal LDW trace, wherein the length is between 50 um and 500 um.

18. The chip of claim 17, the first data signal LDW trace, the second data signal LDW trace, and the isolation signal LDW trace all extending parallel to each other on the LDW trace horizontal level of the chip.

19. The chip of claim 18, wherein the first data signal LDW trace, the second data signal LDW trace and the isolation signal LDW trace all extending parallel to each other within a horizontal last silicon metal level (LSML) of the chip.

20. An electronic system comprising:
- a first integrated circuit chip having:
  - a data signal transmitter circuit disposed on an inner level within the first chip;
  - a data signal transmit surface contact disposed on an exposed surface of the first chip;
  - a transmit data signal LDW trace having a first end, a second end opposite the first end, and a first length between its first end and its second end;
  - the first end coupled to the transmitter circuit and the second end coupled to the transmit surface contact of the first chip; and
  - a via contact vertically attaching the data signal transmit surface contact to the transmit data signal LDW trace;
- a second integrated circuit chip having:
  - a data signal receive circuit disposed on an inner level within the second chip;
  - a data signal receive surface contact disposed on an exposed surface of the second chip;
  - a receive data leadway (LDW) trace having a first end, a second end opposite the first end, and a second length between its first end and its second end;
  - the first end coupled to the receive circuit and the second end coupled to the receive surface contact of the second chip; and
- a chip package electrically coupling the data signal transmit surface contact of the first chip to the data signal receive surface contact of the second chip.

21. The system of claim 20, the chip package further comprising:
- a data signal transmit surface contact disposed on an exposed surface of the package at a first horizontal location of the package, the data signal transmit surface contact of the package attached to the data signal transmit surface contact of the first chip;
- a data signal receive surface contact disposed on an exposed surface of the package at a second horizontal location of the package, the data signal receive surface contact of the package attached to the data signal receive surface contact of the second chip;
- a data signal package trace attaching the data signal transmit surface contact of the package to the data signal receive surface contact of the package, the data signal package trace having a third length.

22. The chip of claim 21, wherein a data signal channel comprises at least the transmit data signal LDW trace, the data signal package trace and the receive data signal LDW trace; and a channel length comprises at least the first length, plus the second length, plus the third length; and
wherein the channel length is tuned to increase eye height for high speed data signals transmitted on the channel from the transmit circuit to the receive circuit.

23. The chip of claim 22, wherein the first and second length are each between 50 um and 500 um; and
the third length is between 3 and 6 mm.

* * * * *